(12) United States Patent
Kang et al.

(10) Patent No.: US 8,164,941 B2
(45) Date of Patent: Apr. 24, 2012

(54) SEMICONDUCTOR MEMORY DEVICE WITH FERROELECTRIC DEVICE AND REFRESH METHOD THEREOF

(75) Inventors: Hee Bok Kang, Cheongju-si (KR); Suk Kyoung Hong, Gwacheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 810 days.

(21) Appl. No.: 11/964,472

(22) Filed: Dec. 26, 2007

(65) Prior Publication Data

US 2008/0158934 A1    Jul. 3, 2008

(30) Foreign Application Priority Data

Dec. 27, 2006 (KR) .................. 10-2006-0135179
Dec. 27, 2006 (KR) .................. 10-2006-0135181
Dec. 27, 2006 (KR) .................. 10-2006-0135182
Jun. 29, 2007 (KR) .................. 10-2007-0065008
Jun. 29, 2007 (KR) .................. 10-2007-0065033
Jun. 29, 2007 (KR) .................. 10-2007-0065034

(51) Int. Cl.
*G11C 11/22* (2006.01)
(52) U.S. Cl. ........................................ 365/145
(58) Field of Classification Search .................... 365/145
See application file for complete search history.

(56) References Cited

U.S. PATENT DOCUMENTS

| | | | |
|---|---|---|---|
| 5,835,400 A | 11/1998 | Jeon et al. | |
| 6,714,435 B1 | 3/2004 | Dimmler et al. | |
| 6,804,136 B2 | 10/2004 | Forbes | |
| 6,888,736 B2 | 5/2005 | Dimmler et al. | |
| 2001/0017386 A1 | 8/2001 | Bachhofer et al. | |
| 2003/0112650 A1* | 6/2003 | Kang | 365/145 |
| 2004/0027857 A1* | 2/2004 | Ooishi | 365/185.11 |
| 2004/0233744 A1* | 11/2004 | Rodriguez et al. | 365/200 |
| 2006/0138520 A1* | 6/2006 | Kang et al. | 257/314 |
| 2006/0139987 A1* | 6/2006 | Kang et al. | 365/145 |
| 2006/0268615 A1* | 11/2006 | Kang et al. | 365/185.18 |

FOREIGN PATENT DOCUMENTS

| | | |
|---|---|---|
| KR | 10-1999-016845 | 3/1999 |
| KR | 10-2006-0117793 A | 11/2006 |

OTHER PUBLICATIONS

Notice of Preliminary Rejection issued from the Chinese Patent Office on Dec. 18, 2009.

(Continued)

*Primary Examiner* — Hoai V Ho
*Assistant Examiner* — Anthan Tran
(74) *Attorney, Agent, or Firm* — IP & T Group LLP

(57) ABSTRACT

A semiconductor memory device with a ferroelectric device comprises a channel region, a drain region and a source region formed in a substrate, a ferroelectric layer formed over the channel region, and a word line formed over the ferroelectric layer. A different channel resistance is induced to the channel region depending on a polarity state of the ferroelectric layer, a data read operation is performed by a cell sensing current value differentiated depending on the polarity state of the ferroelectric layer while a read voltage is applied to the word line and a sensing bias voltage is applied to one of the drain region and the source region, and a data write operation is performed by a polarity of the ferroelectric layer changed depending on a voltage applied to the word line, the drain region and the source region.

8 Claims, 49 Drawing Sheets

OTHER PUBLICATIONS

Notice of Rejection from Korean Intellectual Property Office dated Apr. 24, 2008.
English Languge Abstract of KR 10-2006-0117793A.
English Language Abstract of KR 10-1999-016845.

Notice of Rejection for Korean Patent Application No. 10-2007-0065008, dated Jun. 16, 2008.
Notice of Rejection for Korean Patent Application No. 10-2007-0065034, dated Jun. 16, 2008.

* cited by examiner

SEMICONDUCTOR MEMORY DEVICE WITH FERROELECTRIC DEVICE AND REFRESH METHOD THEREOF

RELATED APPLICATIONS

This application is based upon and claims the benefit of priority to Korean Patent Application Nos. 10-2006-00135179, 00135181, 00135182, 10-2007-0065033, 0065034, 0065008, filed on Dec. 27, 2006 and Jun. 29, 2007. The entire contents of these applications are incorporated herein by reference.

TECHNICAL FIELD

Embodiments consistent with the present invention generally relate to a semiconductor memory device with a ferroelectric device and a refresh method thereof, and more specifically, to a technology of applying a one transistor-field effect transistor (1T-FET) type ferroelectric memory cell having a nonvolatile characteristic to a Dynamic Random Access Memory (DRAM).

BACKGROUND

Generally, electric power should be continuously supplied in order to store data as volatile memory in a DRAM. When electric power is instantly disconnected, data of a RAM may be destroyed because a memory cell of a DRAM is designed based on small charged electrons for storing charged electric power. If these charged electrons are not continuously recharged, the previously charged power can be destroyed.

A refresh operation refers to a recharging process of a cell of a memory chip. In every refresh cycle, memory cells of a row can be charged. Although the refresh operation is performed by memory control of the system, several chips are designed to perform a self-refresh operation.

For example, a DRAM has a self-refresh control circuit so as to perform a self-refresh operation without a Central Processing Unit (CPU) or an external refresh circuit. The self-refresh method to reduce power consumption has been used in a portable computer.

A conventional DRAM performs a refresh operation frequently because DRAM is volatile and has a short refresh cycle. As a result, frequent refresh operation increases power consumption and degrades performance.

Generally, a ferroelectric random access memory (FeRAM) has attracted considerable attention as a next generation memory device because it has a data processing speed as fast as a DRAM and conserves data even after the power is turned off.

FeRAM having structures similar to the DRAM may include capacitors made of a ferroelectric substance, so that it utilizes the characteristic of a high residual polarization of ferroelectric substance in which data is not deleted even after an electric field is eliminated.

A one-transistor 1-capacitor (1T1C) type unit cell of conventional FeRAM comprises a switching element configured to perform a switching operation depending on a state of a word line and connect a bit line to a nonvolatile ferroelectric capacitor, and a nonvolatile ferroelectric capacitor connected between a plate line and one end of switching element. Switching element is a NMOS transistor whose switching operation is controlled by a gate control signal.

SUMMARY

Consistent with the present invention, there is provided a semiconductor memory device with a ferroelectric device, the memory device comprising, a 1-T FET type memory cell, a plurality of even bit lines arranged perpendicularly to a plurality of word lines, and a plurality of odd bit lines arranged perpendicularly to the plurality of word lines and alternate with the plurality of even bit lines, wherein the memory cell is connected between a pair of adjacent even/odd bit lines of the plurality of even bit lines and the plurality of odd bit lines, and configured to sense data current of the memory cell by a polarity of the ferroelectric layer changed depending on voltages of the word line and the paired even/odd bit lines and store 2n-bit data (n is a natural number) by changing the polarity of the ferroelectric layer depending on a plurality of write voltages applied to the word line and the paired even/odd bit lines.

Consistent with the present invention, there is also provided a refresh method of a semiconductor memory device with a ferroelectric device, the memory device comprising a plurality of word lines arranged in a row direction, a plurality of bit lines arranged perpendicularly to the plurality of word lines, and a One-Transistor (1-T) Field Effect Transistor (FET) type memory cell including a channel region, a drain region and a source region formed in a substrate, a ferroelectric layer formed over the channel region, and a word line formed over the ferroelectric layer, where a polarity state of the ferroelectric layer is changed a depending on a voltage applied to the word line and a pair of bit lines connected to the memory cell, the method comprising, inducing a different channel resistance to the channel region of the 1T-FET type memory cell to read/write data, and refreshing data of the memory cell with a specific refresh cycle in order to improve a retaining characteristic of data stored in the memory cell.

Consistent with the present invention, there is also provided a semiconductor memory device with a ferroelectric device, the memory device comprising, a One-Transistor (1-T) Field Effect Transistor (FET) type memory cell including a channel region, a drain region and a source region formed in a substrate; a ferroelectric layer formed over the channel region; and a word line formed over the ferroelectric layer, where a different channel resistance is induced to the channel region depending on a polarity state of the ferroelectric layer, a plurality of word lines arranged in a row direction, a plurality of bit lines arranged perpendicularly to the plurality of word lines, and a refresh control unit configured to perform a refresh operation with a specific refresh cycle in order to improve a retaining characteristic of data stored in the memory cell, wherein the memory cell is connected between a pair of adjacent bit lines of the plurality of bit lines and configured to read/write data by changing a polarity of the ferroelectric layer depending on voltages applied to the word line and paired bit lines.

Consistent with the present invention, there is also provided a semiconductor memory device with a ferroelectric device, wherein the semiconductor memory device comprises a One-Transistor (1-T) Field Effect Transistor (FET) type memory cell including a channel region, a drain region and a source region formed in a substrate; a ferroelectric layer formed over the channel region; and a word line formed over the ferroelectric layer, where a different channel resistance is induced to the channel region depending on a polarity state of the ferroelectric layer, and wherein the ferroelectric device comprises, a plurality of word lines arranged in a row direction, and a plurality of bit lines arranged perpendicularly to the plurality of word lines, and wherein the memory cell is connected between a pair of adjacent bit lines of the plurality of bit lines and configured to read/write data by changing a polarity of the ferroelectric layer depending on voltages applied to the word line and paired bit lines.

Consistent with the present invention, there is also provided a semiconductor memory device with a ferroelectric device, the memory device comprising, a channel region, a drain region and a source region formed in a substrate, a ferroelectric layer formed over the channel region, and a word line formed over the ferroelectric layer, wherein a data read operation is performed by a cell sensing current value differentiated depending on the polarity state of the ferroelectric layer while a different channel resistance is induced to the channel region depending on a polarity state of the ferroelectric layer, a read voltage is applied to the word line and a sensing bias voltage is applied to one of the drain region and the source region, and a data write operation is performed by applying voltages to the word line, the drain region and the source region to change a polarity of the ferroelectric layer.

DETAILED DESCRIPTION

Figure 1:
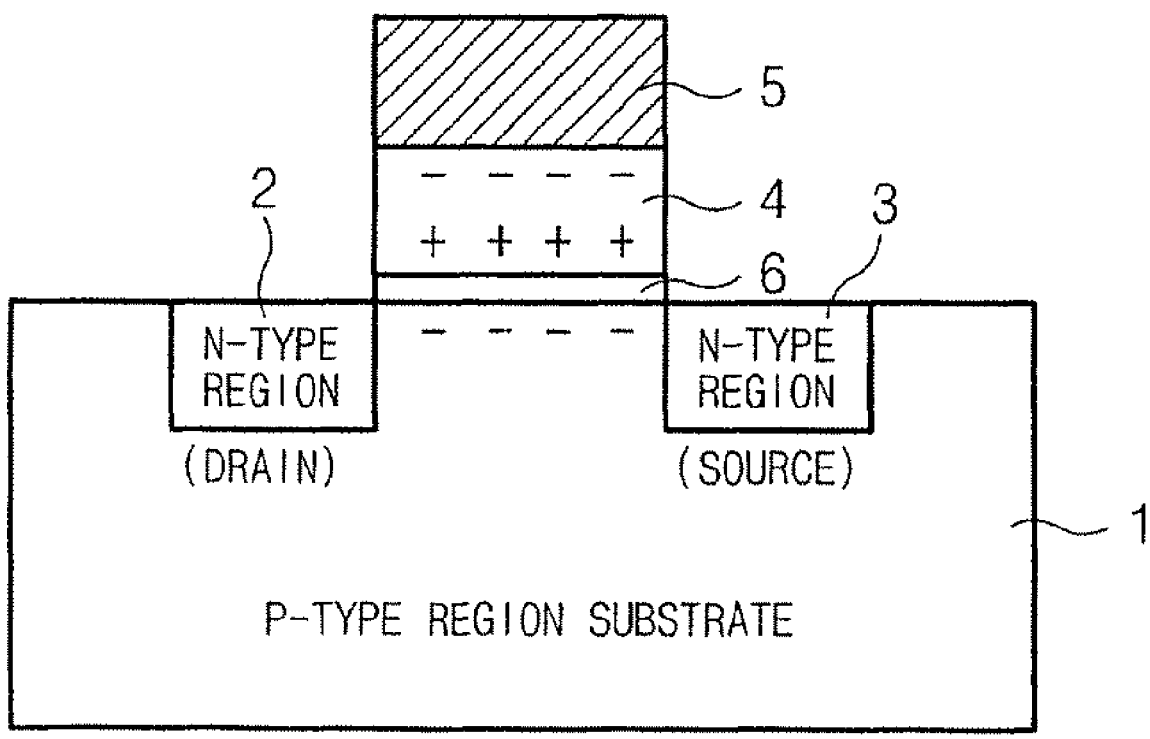
FIG. 1 is a cross-sectional diagram illustrating a semiconductor memory device.

FIG. 1 is a cross-sectional diagram illustrating a semiconductor memory device.

A One-Transistor (1-T) Field Effect Transistor (FET) type ferroelectric memory cell comprises a P-type channel region, a N-type drain region 2 and a N-type source region 3 which are formed in a P-type region substrate 1. A ferroelectric layer 4 is formed over channel region, and a word line 5 is formed over ferroelectric layer 4.

A buffer insulating layer 6 may be formed between channel region and ferroelectric layer 4 for stabilization of the process. That is, buffer insulating layer 6 is formed to eliminate process and material differences between channel region and ferroelectric layer 4.

Semiconductor memory device reads and writes data in response to a channel resistance of memory cell which is differentiated depending on a polarization state of ferroelectric layer 4.

When a polarity of ferroelectric layer 4 induces a positive charge to a channel, memory cell may become at a high resistance channel state to be off. On the other hand, when polarity of ferroelectric layer 4 induces a negative charge to channel, memory cell may become at a low resistance state to be on. Ferroelectric memory cell may select polarity of ferroelectric layer 4 to write data in the cell so that memory cell may become nonvolatile.

Figure 2A:
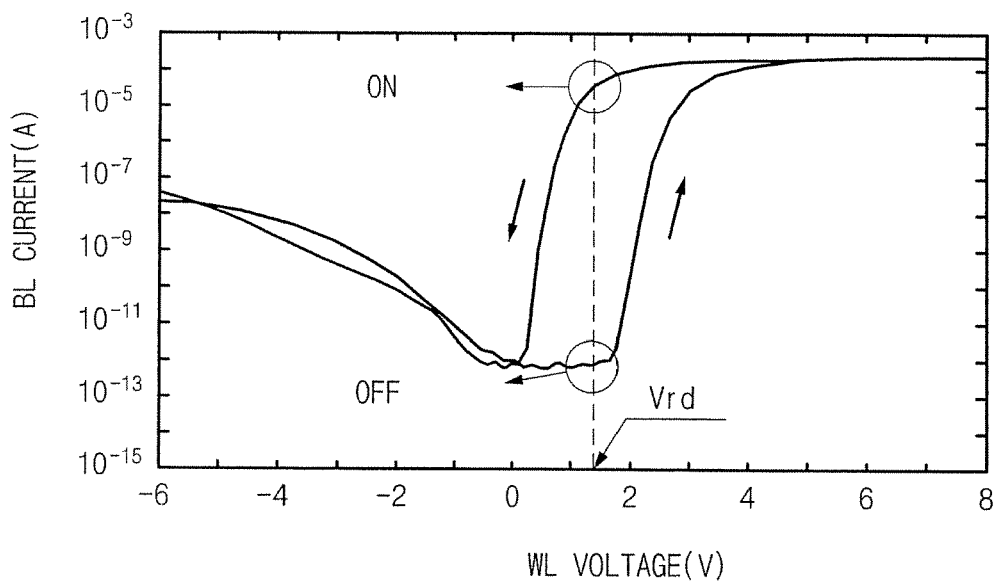
FIGS. 2a and 2b are graphs illustrating a bit line current of a read mode of a semiconductor memory device.
Figure 2B:
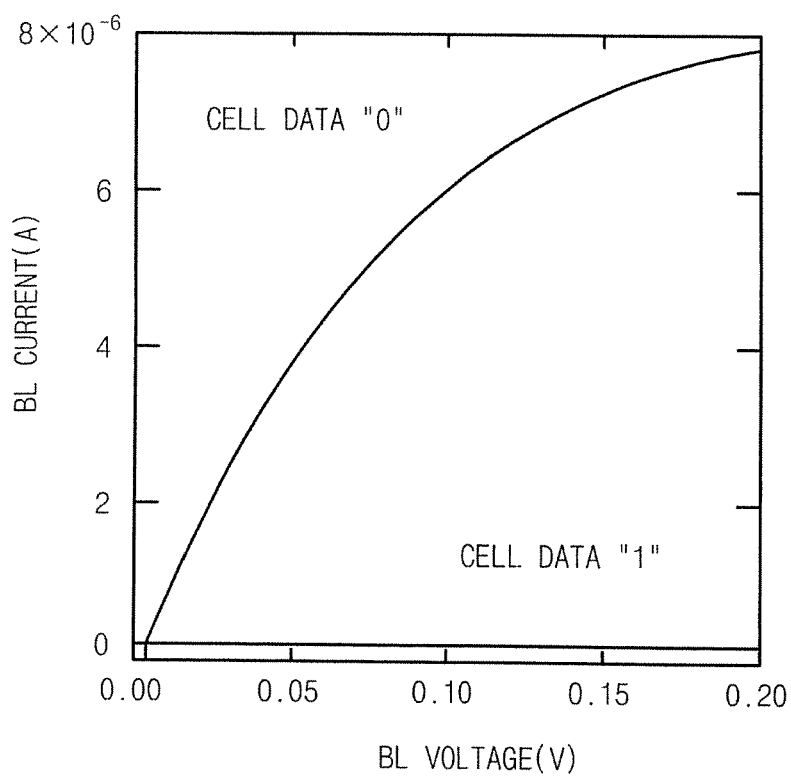

FIGS. 2a and 2b are graphs illustrating a bit line current of a read mode of a semiconductor memory device consistent with the present invention.

As shown in FIG. 2a, a voltage value when the P-type channel region is on/off is set to be a word line read voltage Vrd. With the word line read voltage Vrd, the largest amount of bit line BL current flows when channel region is turned on, and the smallest amount of bit line BL current flows when channel region is turned off.

As shown in FIG. 2b, when a voltage of bit line BL is changed while the same word line read voltage Vrd is applied, memory cell has a different current value of bit line BL depending on values of cell data stored in memory cell. That is, when data "0" is stored in memory cell, a large amount of bit line BL current flows with the increase of bit line BL voltage. When data "1" is stored in memory cell, bit line BL current is not changed and can flow with a small amount despite the increase of bit line BL voltage.

Figure 3:
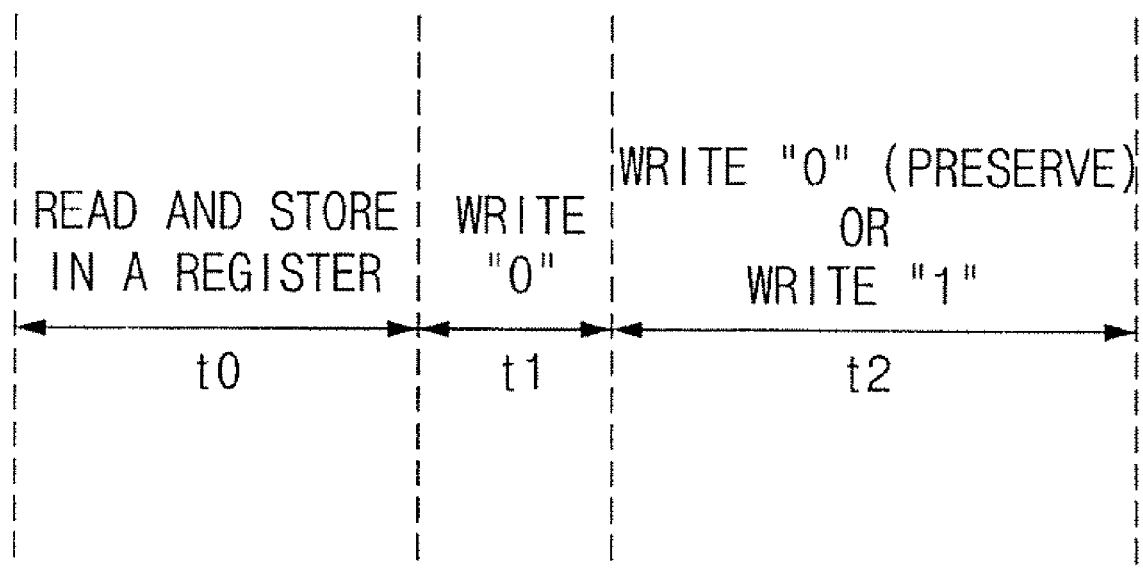
FIG. 3 is a timing diagram illustrating a write cycle operation of a semiconductor memory device.

FIG. 3 is a timing diagram illustrating a write cycle operation of a semiconductor memory device according to an embodiment of the present invention.

In a period t0, cell data are read and amplified in all cells of a selected row address, and stored in a register. In a period t1, since data "0" is written in all memory cells, it is not clear which data is stored in existing memory cell. As a result, in order to know which data is stored in existing memory cell, the data "0" is stored in the register before the data "0" is written in memory cell.

In period t1, data "0" may be written in all cells of the selected row address. In a period t2, data stored in register may be re-written and restored in memory cell, and new external data may be written in cells. In period t2, data "0" is preserved because data "0" is previously written in period t1, or new data "1" is written in cell.

Figure 4:
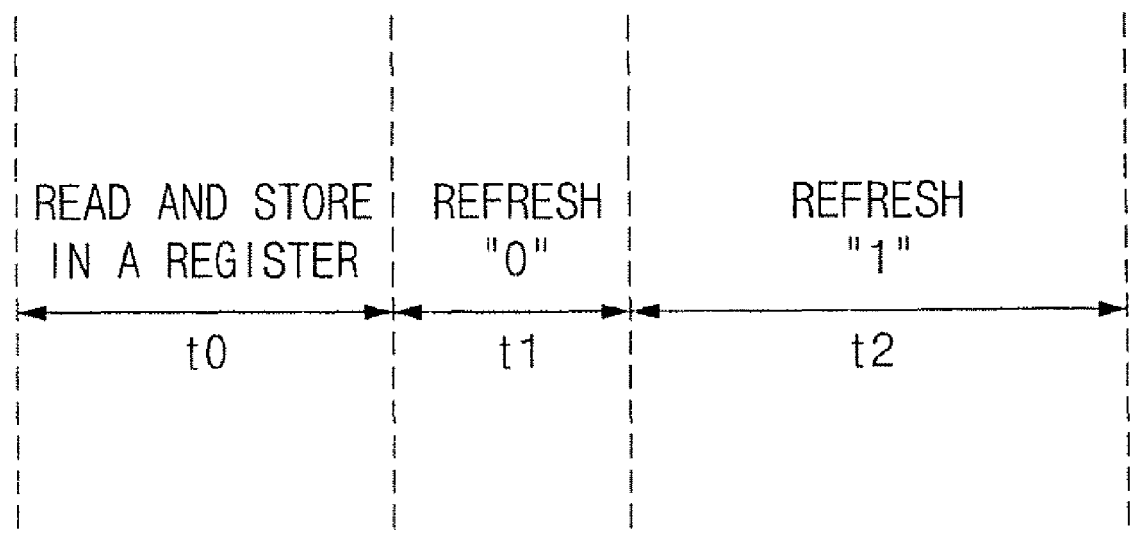
FIG. 4 is a timing diagram illustrating a refresh cycle operation of a semiconductor memory device.

FIG. 4 is a timing diagram illustrating a refresh cycle operation of a semiconductor memory device consistent with the present invention.

In period t0, cell data may be read and amplified in all cells of a selected row address, and stored in a register. In period t1, a refresh "0" operation is performed to restore data "0" in corresponding cells of selected row address. In period t2, a refresh "1" operation is performed to restore data "1" in corresponding cells of selected row address.

Figure 5:
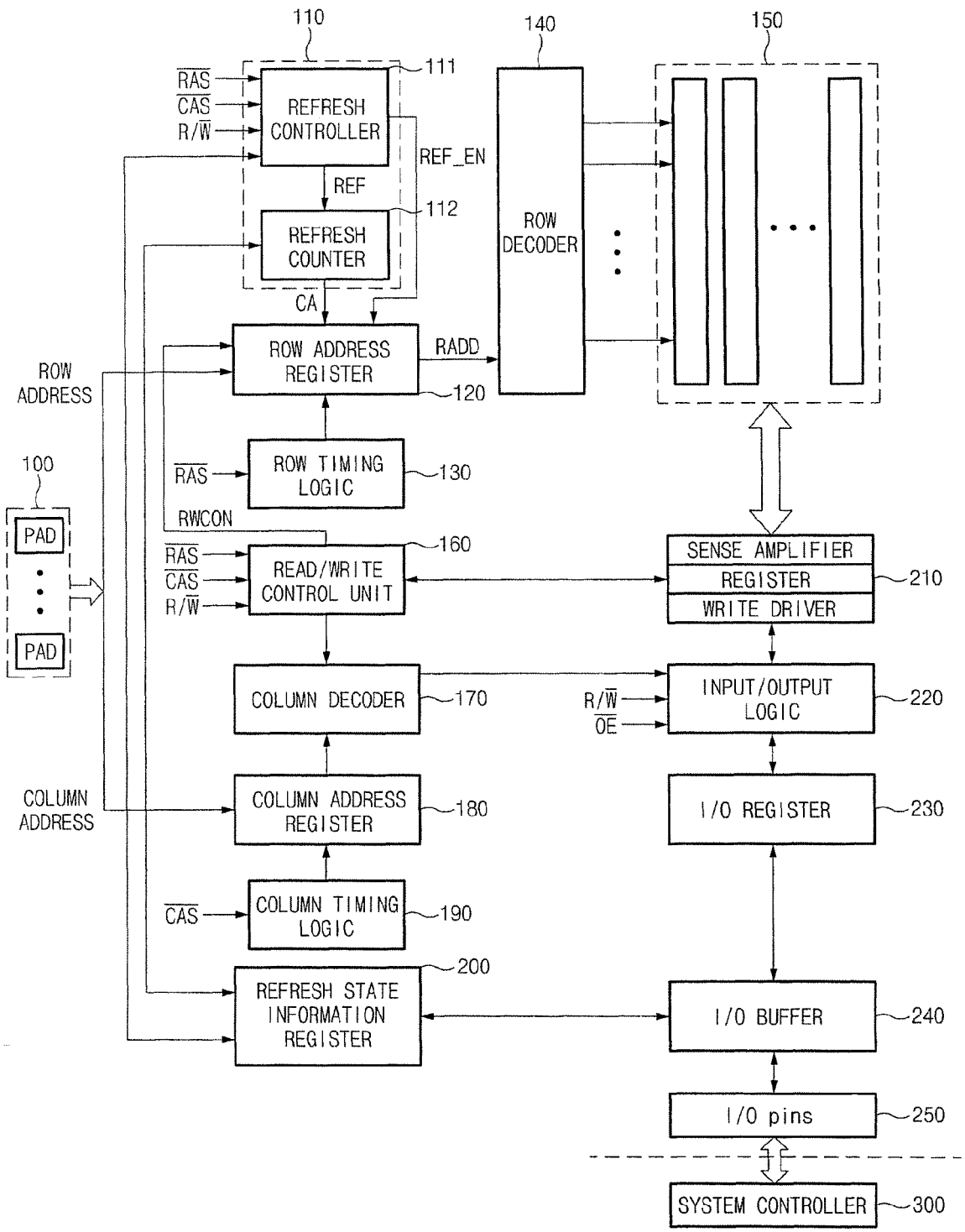
FIG. 5 is a diagram illustrating a semiconductor memory device consistent with the present invention.

FIG. 5 is a diagram illustrating a semiconductor memory device consistent with the present invention.

Semiconductor memory device comprises a pad array 100, a refresh control unit 110, a row address register 120, a row timing logic 130, a row decoder 140, a cell array 150, a read/write control unit 160, a column decoder 170, a column address register 180, a column timing logic 190, a refresh state information register 200, a sense amplifier, a register, a write driver 210, an input/output logic 220, an I/O register 230, a I/O buffer 240 and I/O pins 250.

Refresh control unit 110 includes a refresh controller 111 and a refresh counter 112. Cell array 150 may include a plurality of 1T-FET type unit cells of FIG. 1.

Pad array 100 may include a plurality of pads PAD each configured to receive a row address and a column address so as to output the addresses with a time variance. Refresh controller 111 outputs a refresh signal REF and a refresh enable signal REF_EN for controlling a refresh operation in response to a ras signal /RAS, a cas signal /CAS, a read/write command R,/W and a refresh control signal.

Refresh counter 112 counts a refresh cycle in response to refresh signal REF applied from refresh controller 111 and the refresh control signal applied from the refresh state information register 200 to output a count address CA. Refresh controller 111 and refresh counter 112 output refresh operation information and refresh count information into refresh state information register 200.

Row address register 120 receives row address received from pad array unit 100 and stores address temporarily. Row address register 120 outputs a row address RADD to row decoder 140 in response to an output signal of row timing logic 130 and a read/write control signal RWCON applied from read/write control unit 160.

Row timing logic 130 controls storage operation and address output timing of row address register 120 in response to ras signal /RAS. Row decoder 140 decodes row address RADD applied from row address register 120 to output the address to cell array 150.

Read/write control unit 160 outputs read/write control signal RWCON for controlling read/write operations into row address register 120 in response to ras signal /RAS, cas signal /CAS and read/write command R,/W so as to control column decoder 170 and sense amplifier, register and write driver 210.

Column decoder 170 decodes a column address applied from column address register 180 depending on control of read/write control unit 160 to output the address to input/output logic 220. Column address register 180 temporarily stores column address received from pad array 100 so as to output the address into column decoder 170 depending on control of column timing logic 190.

Column timing logic 190 controls storage operation and address output timing of column address register 180 in response to cas signal /CAS. Register 210 outputs refresh data to memory cell depending on control of column timing logic 190 when refresh signal REF is activated.

Refresh information register 200 is a nonvolatile register configured to store parameters related to refresh operations. Refresh information register 200 stores refresh count information, power-off timing information of the system or internal memories and other parameter information.

Refresh state information register 200 outputs a refresh control signal based on the parameter information in the refresh operations. In the power-off timing, information of refresh control unit 111 and refresh counter 112 is transmitted into refresh state information register 200, and information related to external commands received from I/O buffer 240 is stored. The information stored in refresh state information register 200 through I/O buffer 240 and I/O pins 250 may be outputted into a system controller 300.

Sense amplifier S/A senses and amplifies cell data to distinguish data "1" from data "0". Write driver W/D generates a driving voltage in response to write data when data are written in the memory cell to supply the driving voltage to the bit line. Register REG temporarily stores data sensed in the sense amplifier S/A, and re-stores data in memory cell in write operation.

Input/output logic 220 reads data stored in cell array 150 depending on an output signal from column decoder 170 and read/write commands R, /W, and stores data in cell array 150. Input/output logic 220 includes a column selecting signal C/S, and outputs data stored in cell array 150 to data I/O register 230 in response to an output enable signal /OE.

I/O buffer 240 buffers read data stored in I/O register 230 to output buffered data into I/O pins 250. I/O buffer 240 buffers write data received through I/O pins 250 to output buffered data into I/O register 230. I/O buffer 240 outputs information stored in refresh state information register 200 into system controller 300 through I/O pins 250.

I/O pins 250 outputs data received from I/O buffer 240 into system controller 300 through data buses, or outputs data from system controller 300 through data buses into I/O buffer 240.

Read/write operations of the semiconductor memory device are explained as follows.

Pad array 100 receives a row address and a column address through a plurality of pads PAD, and outputs address to row address register 120 and column address register 180.

Row address register 120 and column address register 180 output row address and column address with a given time difference depending on control of row timing logic 130 and column timing logic 190 by timing multiplexing method.

Row address register 120 can store row addresses temporarily in synchronization with ras signal /RAS, and can output row address RADD to row decoder 140. When row address is outputted, column address register 180 stores column address temporarily.

Row address register 120 selects a row address received from pad array 100 in a normal operation to output address into row decoder 140. When a refresh enable signal REF_EN is activated in a refresh mode, row address register 120 selects a count address CA received from refresh counter 112 to output address into row decoder 140.

Column address register 180 stores column address temporarily in synchronization with cas signal /CAS, and outputs column address to column decoder 170. When column address is outputted, row address register 120 stores row address temporarily.

In read mode, when an output enable signal /OE is activated while read command R is activated, data stored in cell array 150 are outputted to I/O register 230 depending on input/output logic 220. On the other hand, in write mode, when output enable signal /OE is inactivated while write command /W is activated, data are stored in cell array 150 depending on input/output logic 220.

Hereinafter, a refresh method of a semiconductor memory device can be explained as follows.

Refresh controller 111 outputs refresh signal REF for performing a refresh operation into refresh counter 112, and outputs refresh enable signal REF_EN into row address register 120 in response to ras signal /RAs, cas signal /CAS, read/write commands R,/W and refresh control signal when a refresh operation command is applied.

Refresh counter 112 counts a refresh cycle in response to refresh signal REF applied from refresh controller 111 and refresh control signal to output a count address CA to row address register 120.

Count address CA outputted from refresh counter 112 is stored in row address register 120. Column timing logic 190 outputs data stored in column address register 180 into column decoder 170 in response to cas signal /CAS. When sense amplifier S/A is activated, refresh data stored in register REG through input/output logic 220 are written in cell array 150.

Refresh signal REF may be a control signal using ras signal /RAS and cas signal /CAS. That is, when refresh signal REF is a control signal using ras signal /RAS and cas signal /CAS, refresh operation is performed with a /CAS before /RAS method (/CBR).

In the normal mode for performing read and write operations, ras signal /RAS is activated faster than cas signal /CAS so that a normal operation is performed depending on row timing logic 130 and column timing logic 190. When ras signal /RAs is activated earlier, an external row address is activated so that sense amplifier S/A is activated. When cas signal /CAS is activated, an external column address is activated.

In the refresh mode, refresh control unit 111 senses cas signal /CAS transited earlier than ras signal /RAS to activate refresh signal REF. That is, when refresh control unit 111 senses cas signal /CAS transited earlier than ras signal /RAS, refresh control unit 111 decides the refresh mode to activate refresh enable signal REF_EN.

Row address register 120 performs a refresh operation in response to count address CA generated depending on refresh counter 112 while a path of the normal mode is disconnected when refresh enable signal REF_EN is activated. Row address register 120 may sense simultaneous transition of cas signal /CAS and ras signal /RAS to activate refresh signal REF.

Although refresh method using /CBR method is exemplified in the embodiment of the present invention, the refresh operation may be performed by various methods with self-refresh, auto-refresh or clock.

In refresh mode, a word line WL of cell array 150 can be selected depending on count address CA which is an output signal of refresh counter 112. As a result, data of the corresponding cell having a 1T-FET structure in cell array 150 are sensed and amplified, and stored in sense amplifier register REG. New data are written in cell array 150, or data stored in register REG are re-stored in cell array 150.

Hereinafter, a refresh method of a semiconductor memory device depending on on/off of the power source is explained as follows.

When power is turned on while a system power of the DRAM which is a volatile memory is turned off, data of the memory are uploaded so that a new refresh operation starts. That is, when system power is turned on, data of memory are required to be uploaded.

However, in a nonvolatile ferroelectric memory device according to an embodiment of the present invention, when power is turned on while system power is turned off, refresh state information register 200 can decide whether refresh time is exceeded.

When refresh time is exceeded, data of memory are uploaded so that a new refresh operation starts. On the other hand, when refresh time is not exceeded, refresh time is effective so that previous refresh operation continues.

Refresh state information register 200 stores a parameter related to refresh operation in a nonvolatile register. Refresh state information register 200 stores refresh count information, power-off timing information of system or internal memory and other parameter information to be nonvolatile. In refresh state information register 200, an additional power sensing unit (not shown) senses on/off states of system or internal memory.

When power is off, data stored in refresh state information register 200 are read to calculate refresh lapse time. Refresh lapse time can be stored in a mode register set MRS or controlled in a system level.

Refresh lapse time calculated in response to refresh control signal is transmitted into refresh control unit 111 and refresh operation is controlled. As a result, in the embodiment, it is unnecessary to upload refresh related information even when power is on.

Refresh method includes a distributed refresh method and a burst refresh method.

In the distributed refresh method, refresh operation is performed with the same time distribution so that all cells may be refreshed within refresh time in response to count address CA counted in refresh counter 112.

That is, when 8 k rows are refreshed, each distributed refresh operation period is represented by (total refresh time)/8 k. As a result, cell may become initialized only when data are written in all word lines WL.

In the burst refresh method, 8 k refresh cycles are continuously performed within a burst refresh cycle time. Each pulse means each refresh cycle, and a normal operation is performed in read/write operation cycle periods where pulse is inactivated.

In the refresh method of a nonvolatile ferroelectric memory device, a timer control operation is explained as follows.

Refresh state information register 200 identifies whether system power is off, and stores result. When power is off, a system timer in system is used while an internal memory timer is off so that refresh operation is controlled. System timer stores a date and a time with a battery while power source is required to be on continuously.

On the other hand, when power is not off, internal memory timer operated individually is used so that internal refresh operation is controlled.

One of external system timer or internal memory timer is selected depending on on/off states of power through input/output data pins 250. That is, refresh state information register 200 of memory device including internal memory timer exchanges data with data buses through I/O buffer 240 and I/O pins 250. System CPU including system timers exchanges data with memory device through data buses.

When power is off through data exchange between memory device and system controller 300, refresh operation is performed with external system timer whose power is continuously on. When power is on, refresh operation is performed with internal memory timer.

As a result, refresh period and memory data are effectively maintained regardless of on/off state of the power of memory chip. Between refresh periods, memory chip power is turned off to reduce power consumption, and a chip power is supplied only in refresh period.

Figure 6:
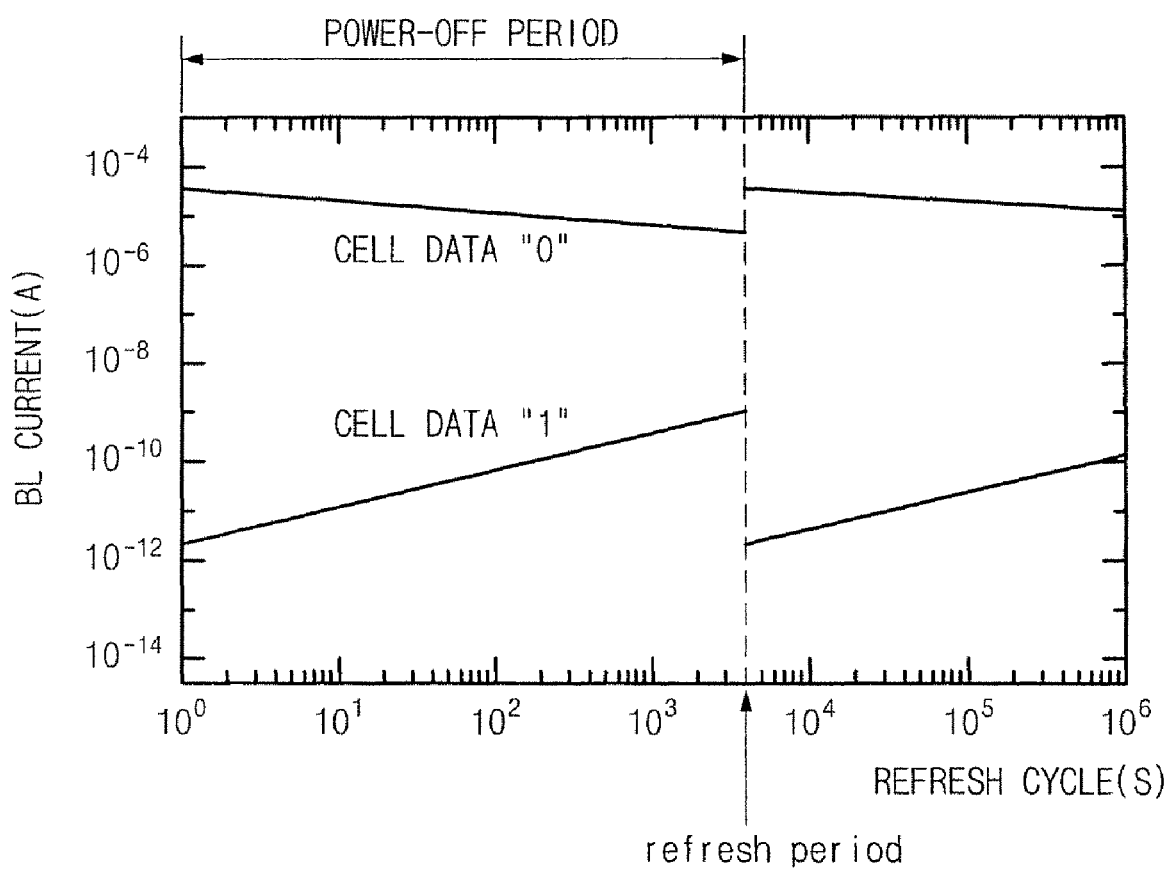
FIG. 6 is a graph illustrating a data retaining characteristic of a semiconductor memory device consistent with the present invention.

FIG. 6 is a graph illustrating a data retaining characteristic of a semiconductor memory device according to an embodiment consistent with the present invention.

As time passes, cell data of a conventional semiconductor memory device are degraded to cause limits of data retention life. As a result, bit line BL current corresponding to cell data "1" and "0" is reduced as time passes by.

However, when power is off, the refresh operation is performed with a given cycle at a given timing when bit line BL current is reduced, thereby restoring degraded cell data to improve data retention characteristics.

When data retention characteristics of memory cell are reduced to over a pre-set target value, a refresh circuit is driven to restore cell data at initial state. Degradation limit target time of cell becomes a refresh time so that all cells are operated within refresh time.

Semiconductor memory device consistent with the present invention is a DRAM having nonvolatile characteristic. O/off time of power source is added and set as whole data retention time so that refresh operation is not frequently performed, thereby reducing power consumption and improving performance.

Figure 7:
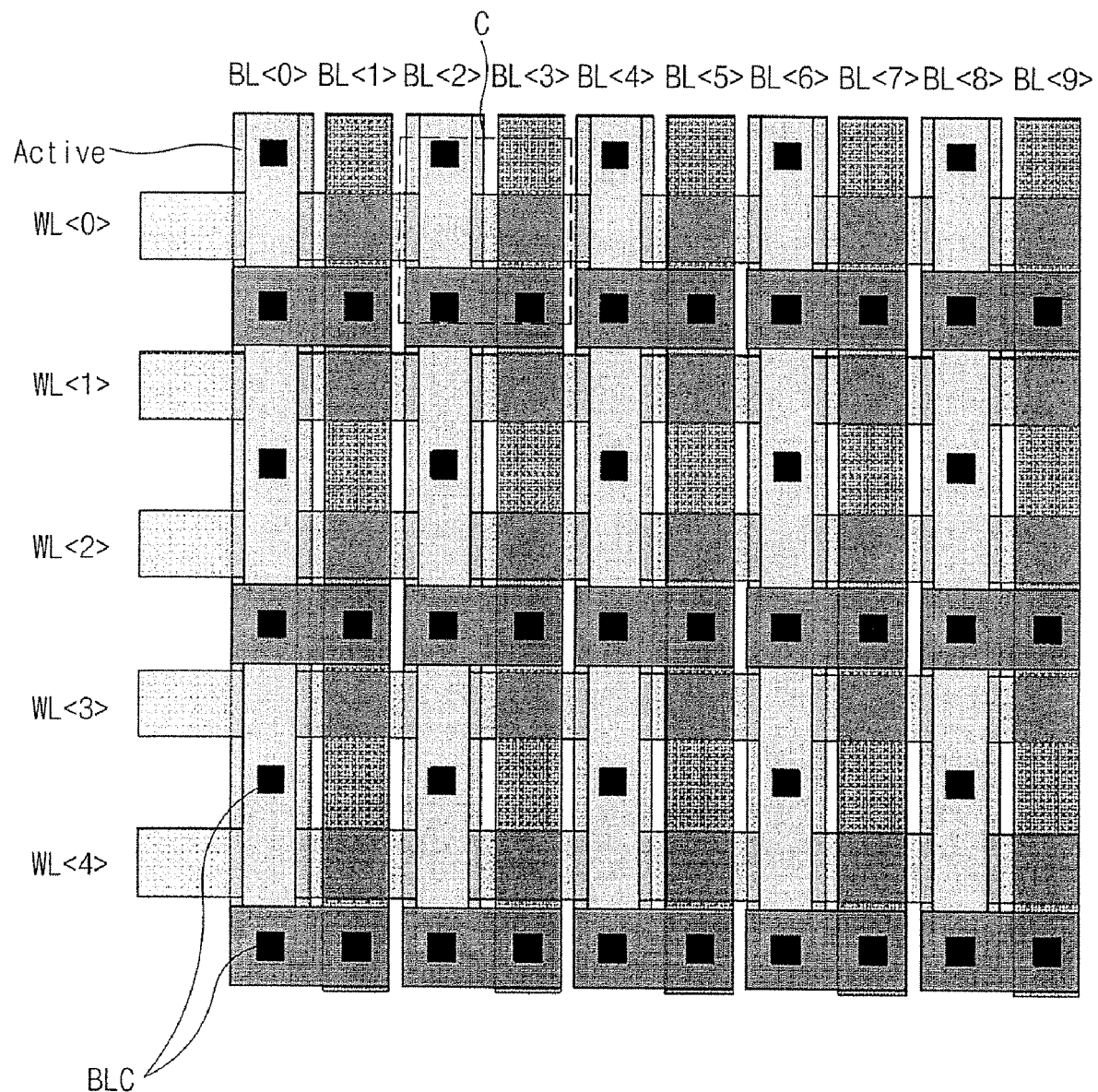
FIG. 7 is a plane diagram illustrating a cell array of a semiconductor memory device consistent with the present invention.

FIG. 7 is a plane diagram illustrating a cell array of a semiconductor memory device according to an embodiment consistent with the present invention.

Cell array comprises a plurality of word lines WL arranged in a row direction. A plurality of bit lines BL can be arranged perpendicularly to plurality of word lines WL (in a column direction). A plurality of unit cells C can be disposed in a region where plurality of word lines WL are crossed with plurality of bit lines BL.

Odd bit lines BL<1>, BL<3>, BL<5>, BL<7>, BL<9> are alternately arranged even with bit lines BL<0>, BL<2>, BL<4>, BL<6>, BL<8> each in a different layer. When one unit cell C is connected to two bit lines BL, the area of bit line BL is prevented from being increased.

That is, even bit lines BL<0>, BL<2>, BL<4>, BL<6>, BL<8> are formed in an upper or lower layer of odd bit lines BL<1>, BL<3>, BL<5>, BL<7>, BL<9>. Odd bit lines BL<1>, BL<3>, BL<5>, BL<7>, BL<9> are formed in an upper or lower layer of even bit lines BL<0>, BL<2>, BL<4>, BL<6>, BL<8>.

Unit cell C comprises a word line WL and two bit lines BL arranged in a different layer. For example, unit cell C comprises a word line WL<0>, an even bit line BL<2> and an odd bit line BL<3> which are connected through a bit line contact BLC.

Figure 8:
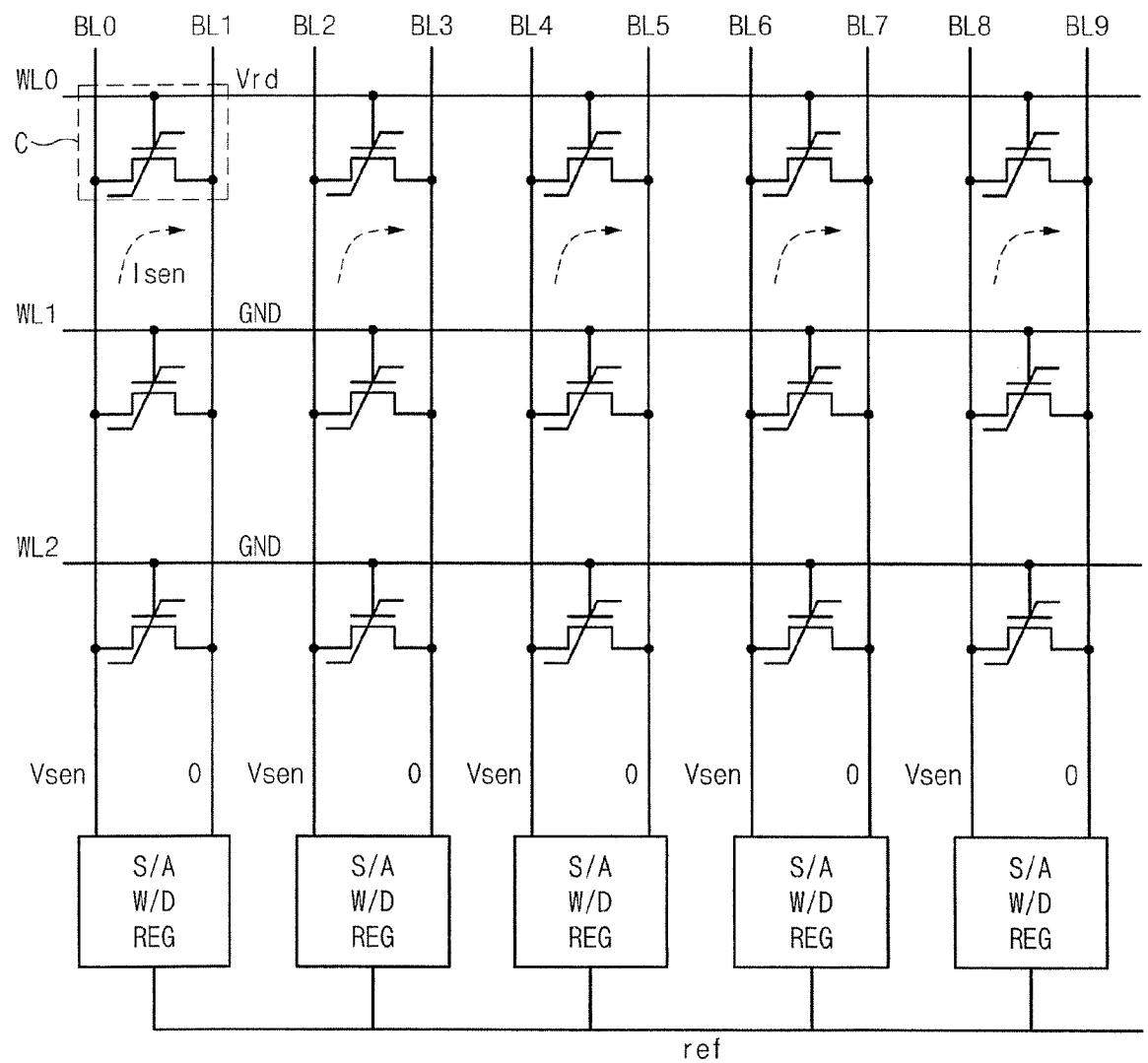
FIG. 8 is a diagram illustrating a cell array structure and a read operation of a semiconductor memory device consistent with the present invention.

FIG. 8 is a diagram illustrating a cell array structure and a read operation of a semiconductor memory device according to an embodiment consistent with the present invention.

A plurality of word lines WL are arranged in a row direction with a given interval. A plurality of bit lines BL are arranged perpendicularly to plurality of word lines WL, that is, in a column direction. A plurality of unit cells C are located in a region where plurality of word lines WL are crossed with plurality of bit lines BL.

Unit cell C having a 1-T FET structure is connected to word line WL<0> and bit lines BL<0>, BL<1> formed in a different layer. Although word line WL<0> and bit lines BL<0>, BL<1> are exemplified in the embodiment consistent with the present invention, the present invention can be applied to rest word lines WL<1>, WL<2>, . . . and rest bit line pairs BL<2>, BL<3>, . . . .

Unit cell C has a drain and a source connected between paired bit lines BL<0>, BL<1>, and a gate connected to word line WL<0>. Paired bit lines BL<0>, BL<1> arranged in a different layer are connected to a sense amplifier S/A, a write driver W/D and a register REG.

Sense amplifier S/A senses and amplifies cell data to distinguish data "1" from data "0" so that sense amplifier S/A is connected to paired bit lines BL<0>, BL<1>. Sense amplifier S/A transmits a reference voltage through a reference voltage terminal ref in order to generate a reference current.

When data are written in memory cell, write driver W/D is configured to generate a driving voltage depending on write data so as to supply driving voltage to bit line BL. Write driver W/D is connected to paired bit lines BL<0>, BL<1>. Register REG as a temporary memory element for storing data of sense amplifier S/A temporarily is connected to paired bit lines BL<0>, BL<1>.

In a read mode of cell array, a read voltage Vrd is applied to selected word line WL<0>, and a ground voltage GND is applied to unselected word lines WL<1>, WL<2>.

A sensing bias voltage Vsen for sensing a sensing current of unit cell C is applied to bit line BL<0> of paired bit lines BL<0>, BL<1> connected to unit cell C. Ground voltage is applied to bit line BL<1>.

A cell sensing current Isen flows depending on a storage state of cell data. As a result, current flowing in paired bit lines BL<0>, BL<1> becomes different depending on the polarity of ferroelectric layer 4 so as to read cell data stored in unit cell C.

That is, sense amplifier S/A senses a value of cell sensing current Isen flowing in bit line BL<0> when read voltage Vrd is applied to word line WL<0>, sensing bias voltage Vsen is applied to bit line BL<0>, and ground voltage is applied to bit line BL<1>.

When a channel region of memory cell is turned off, the value of cell sensing current Isen is sensed so that data "1" stored in memory cell can be read. On the other hand, when channel region is turned on, the value of cell sensing current Isen is sensed so that data "0" stored in memory cell can be read.

Figure 9:
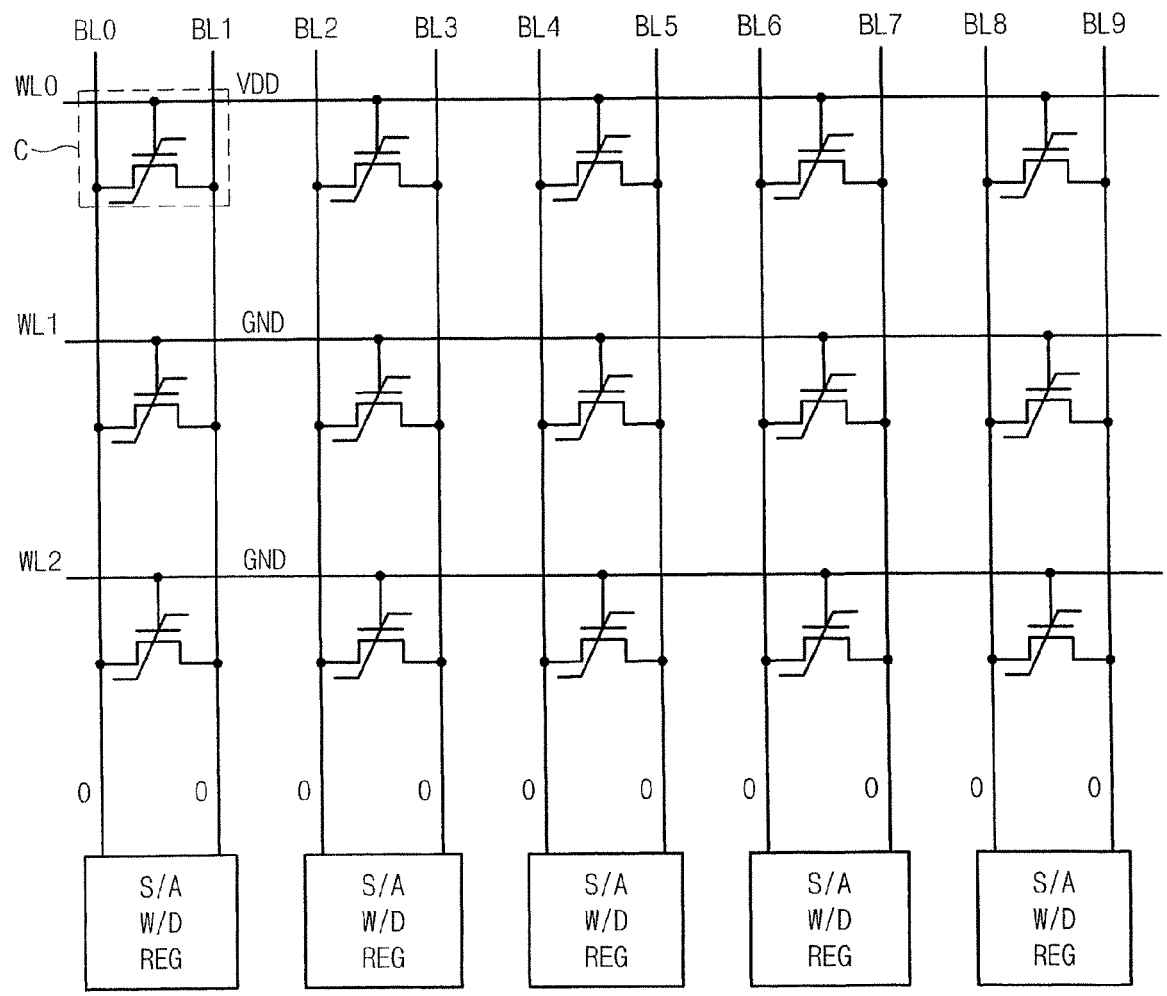
FIG. 9 is a diagram illustrating a cell array structure and a data '0' write operation of a semiconductor memory device consistent with the present invention.

FIG. 9 is a diagram illustrating a cell array structure and a data '0' write operation of a semiconductor memory device according to an embodiment consistent with the present invention.

When data "0" is written, a power voltage VDD over a threshold voltage Vc where a ferroelectric polarity characteristic is changed is applied to selected word line WL<0>, and ground voltage GND is applied to unselected word lines WL<1>, WL<2>. Ground voltage is applied to paired bit lines BL<0>, BL<1> connected to unit cell C.

Read voltage Vrd is smaller than threshold voltage Vc, and power voltage VDD is larger than threshold voltage Vc. Sensing bias voltage Vsen is smaller than read voltage Vrd.

A ferroelectric material is polarized while channel region of memory cell is turned on. As a result, data '0' is written in memory cell. That is, while power voltage VDD is applied to word line WL<0> and ground voltage is applied to paired bit lines BL<0>, BL<1>, channel region is turned on depending on polarization of ferroelectric layer 4 so that data '0' can be written in memory cell.

Figure 10:
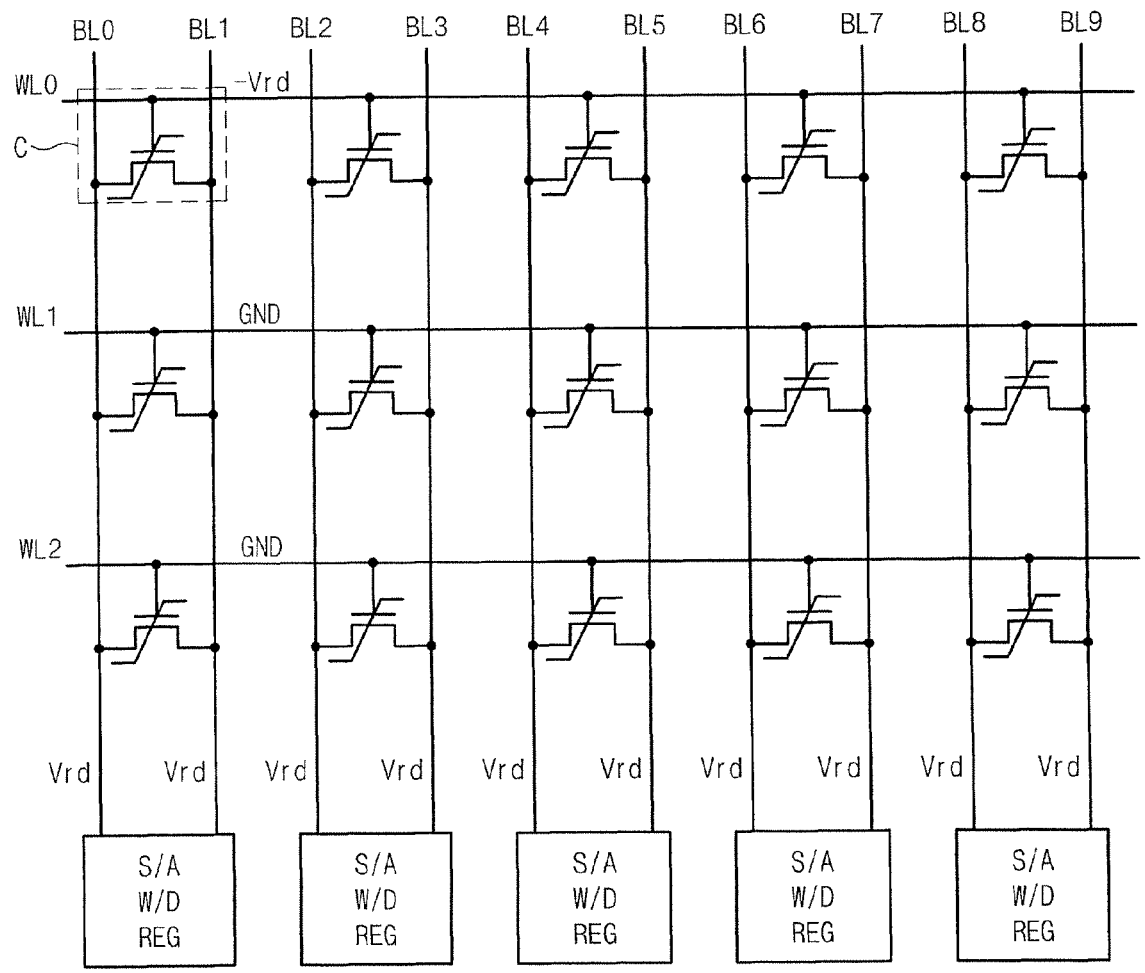
FIG. 10 is a diagram illustrating a cell array structure and a data '1' write operation of a semiconductor memory device consistent with the present invention.

FIG. 10 is a diagram illustrating a cell array structure and a data '1' write operation of a semiconductor memory device according to an embodiment consistent with the present invention.

When data "1" is written, a negative read voltage −Vrd is applied to selected word line WL<0>, and ground voltage GND is applied to unselected word lines WL<1>, WL<2>.

Read voltage Vrd is applied to paired bit lines BL<0>, BL<1> connected to unit cell C.

Positive read voltage Vrd is applied to a drain and a source of unit cell C, negative read voltage −Vrd is applied to a gate of unit cell C. As a result, channel region of memory cell is turned off by a voltage higher than threshold voltage Vc where the polarization of ferroelectric layer 4 is changed, so that data '1' can be written in memory cell.

While negative read voltage −Vrd is applied to word line WL<0> and read voltage Vrd is applied to paired bit lines BL<0>, BL<1>, channel region is turned off depending on polarization of ferroelectric layer 4 so that data '1' can be written in memory cell. A voltage lower than threshold voltage Vc is applied to cells of data '0' corresponding to the selected row so that data '0' is maintained.

Figure 11:
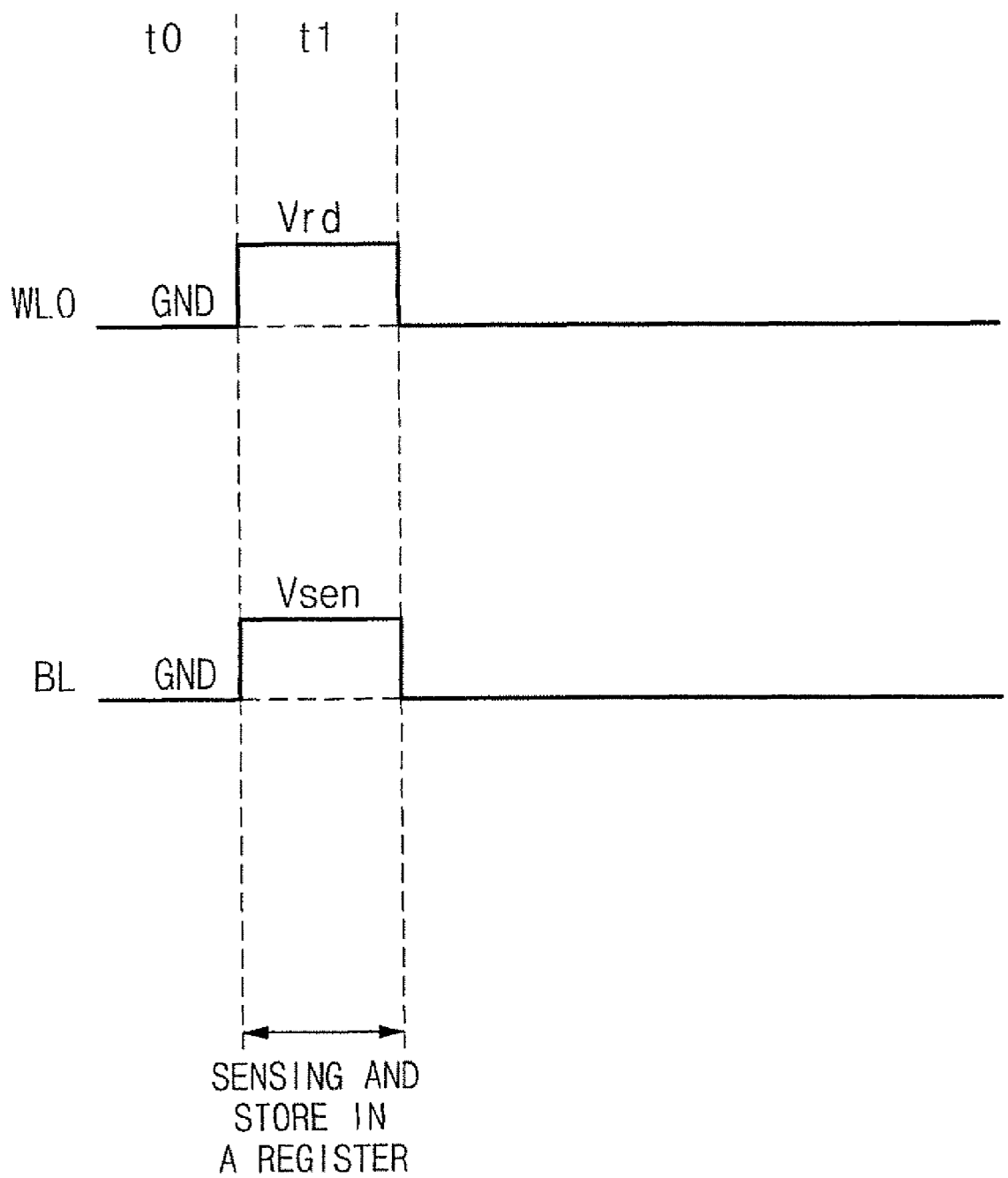
FIG. 11 is a timing diagram illustrating a read operation of a semiconductor memory device consistent with the present invention.

FIG. 11 is a timing diagram illustrating a read operation of a semiconductor memory device according to an embodiment consistent with the present invention.

in period t1 selected word line WL<0> transits from ground GND level into read voltage Vrd level, and bit line BL transits from ground GND level into sensing bias voltage Vsen level. Sense amplifier S/A senses and amplifies a value of cell sensing voltage Isen flowing through bit line BL, and stores the value in register REG.

Figure 12:
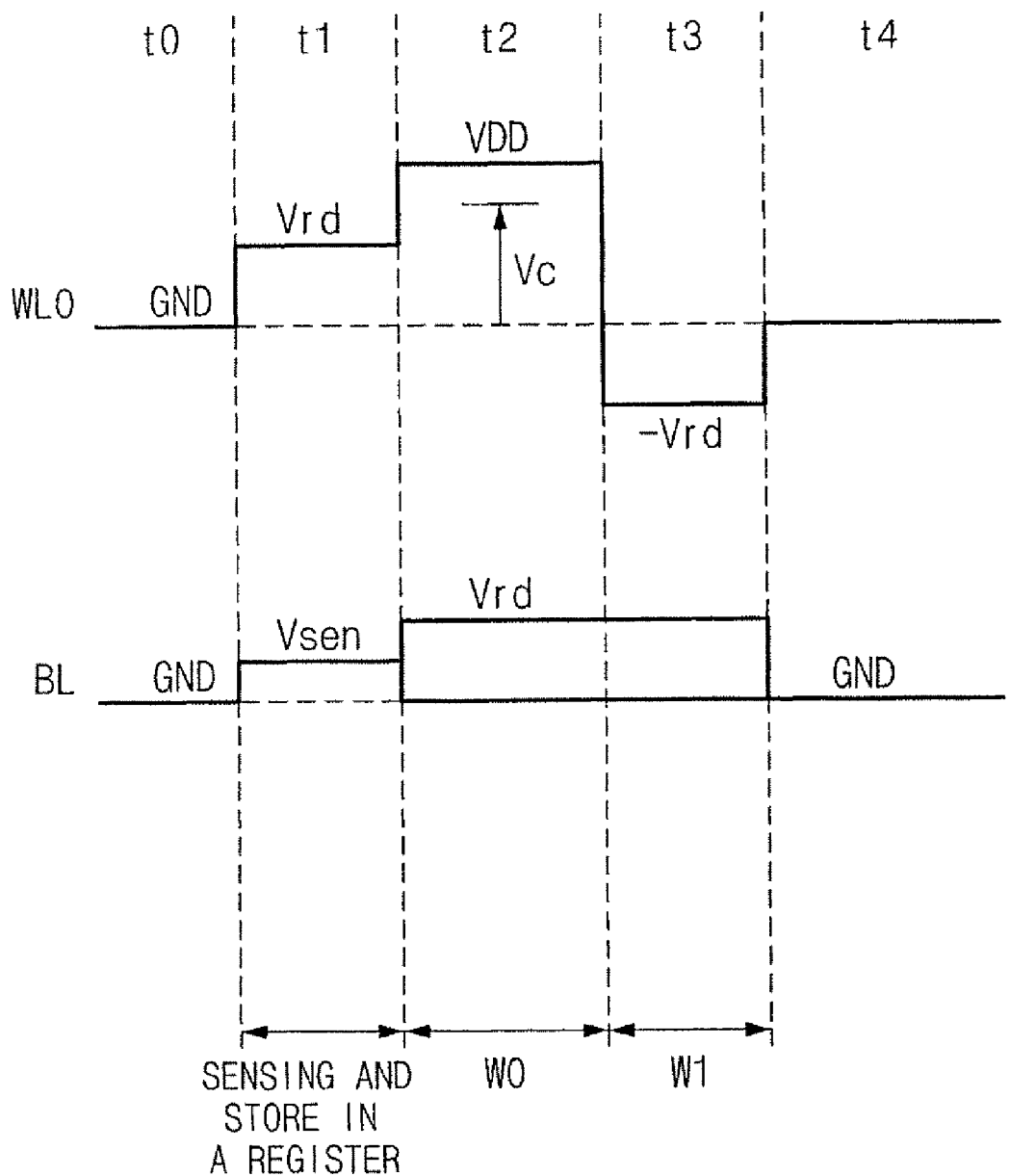
FIG. 12 is a timing diagram illustrating a write operation of a semiconductor memory device consistent with the present invention.

FIG. 12 is a timing diagram illustrating a write operation of a semiconductor memory device according to an embodiment consistent with the present invention.

In period t1, selected word line WL<0> transits from ground GND level into read voltage Vrd level, and bit line BL transits from ground GND level into sensing bias voltage Vsen level. Sense amplifier S/A senses and amplifies a value of cell sensing current Isen flowing through bit line BL in all cells of the selected row, and stores the value in register REG.

In period t2, selected word line WL<0> transits from read voltage Vrd level into power voltage VDD level, and bit line transits from sensing bias voltage Vsen level into read voltage Vrd or ground voltage GND level. As a result, data '0' can be written in all cells of the selected row.

In period t3, selected word line WL<0> transits from power voltage VDD level into negative read voltage −Vrd level, and bit line BL is maintained at read voltage Vrd or ground voltage GND level. Data stored in register REG is re-written and restored in memory cell or new externally applied data can be written.

Since data '0' is previously written in period t1, data '0' is maintained or data '1' is written in period t3.

Figure 13:
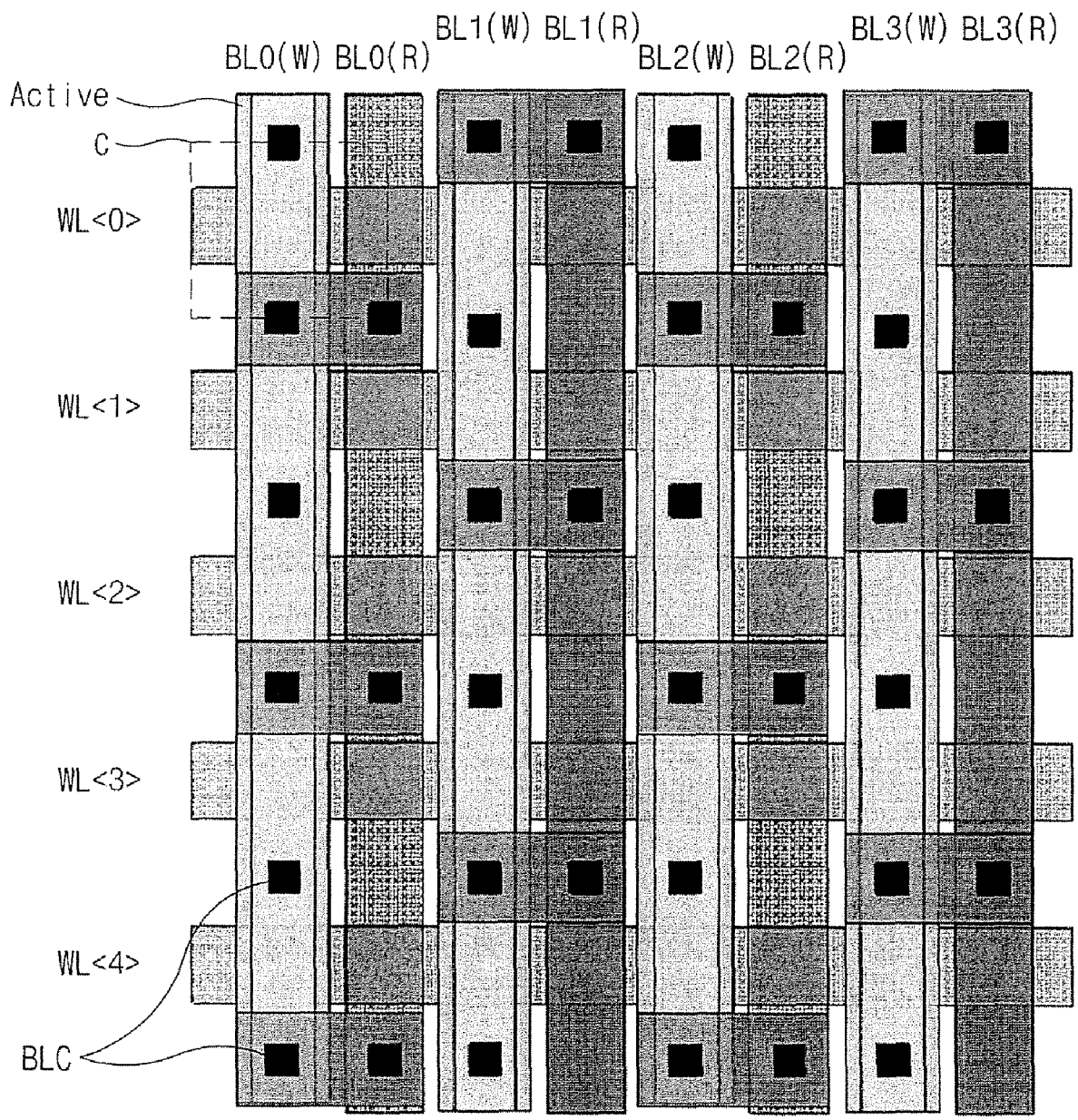
FIG. 13 is a diagram illustrating a cell array of a semiconductor memory device consistent with the present invention.

FIG. 13 is a diagram illustrating a cell array of a semiconductor memory device according to an embodiment consistent with the present invention.

Cell array comprises a plurality of word lines WL arranged in a row direction. A plurality of bit lines BL are arranged perpendicularly to plurality of word lines WL (in a column direction). A plurality of unit cells C are disposed each in a region where plurality of word lines WL are crossed with plurality of bit lines BL.

Bit lines BL0(W), BL1(W), BL2(W), BL3(W) for write operation are alternately arranged with bit lines BL0(R), BL1(R), BL2(R), BL3(R) for read operation each in a different layer. When one unit cell C is connected to two bit lines BL, the area of bit line BL is prevented from being increased.

That is, bit lines BL0(R), BL1(R), BL2(R), BL3(R) are formed in an upper or lower layer of bit lines BL0(W), BL1(W), BL2(W), BL3(W). Bit lines BL0(W), BL1(W), BL2(W), BL3(W) of the odd column direction are formed in an upper or lower layer of bit lines BL0(R), BL1(R), BL2(R), BL3(R) of the even column direction.

Unit cell C comprises a word line WL and two bit lines BL arranged in a different layer. For example, unit cell C comprises a word line WL<0> and bit lines BL0(W), BL0(R) which are connected through a bit line contact BLC.

Figure 14:
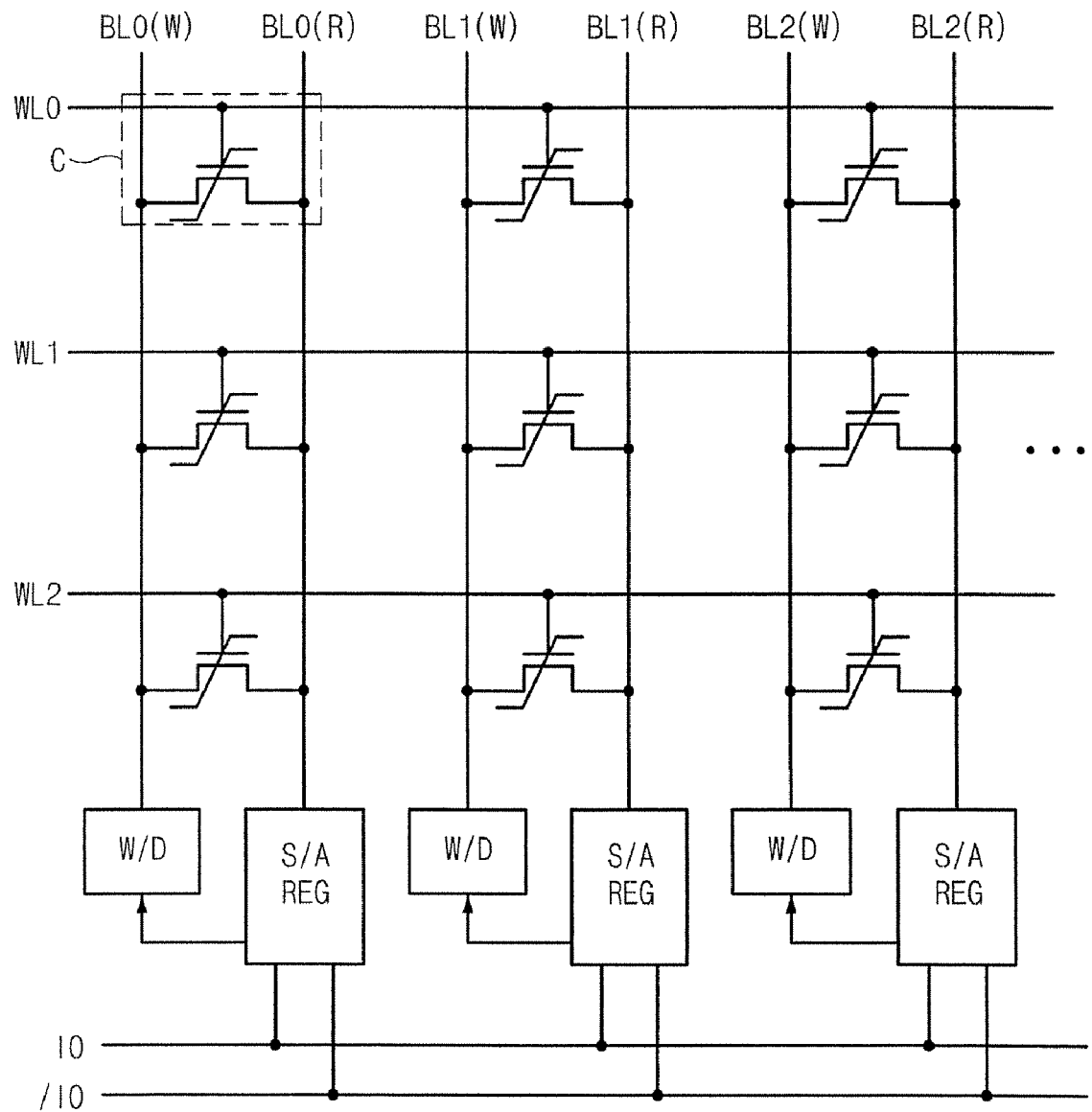
FIG. 14 is a diagram illustrating a cell array structure, a write driving unit, a sense amplifier, and register of a semiconductor memory device consistent with the present invention.

FIG. 14 is a diagram illustrating a cell array structure, a write driving unit W/D, a sense amplifier S/A, and register REG of a semiconductor memory device according to an embodiment consistent with the present invention.

Sense amplifier S/A senses and amplifies cell data to distinguish data "1" from data "0" so that sense amplifier S/A is connected to each read bit lines BL(R). Register REG temporarily stores data of sense amplifier S/A, and is connected to read bit line BL(R). Sense amplifier S/A and register REG is connected to input/output lines IO, /IO which are data buses.

When data are written in memory cell, the write driver W/D is configured to generate a driving voltage depending on write data so as to supply the driving voltage to write bit line BL(W). Write driver W/D is connected to write bit line BL(W).

Figure 15:
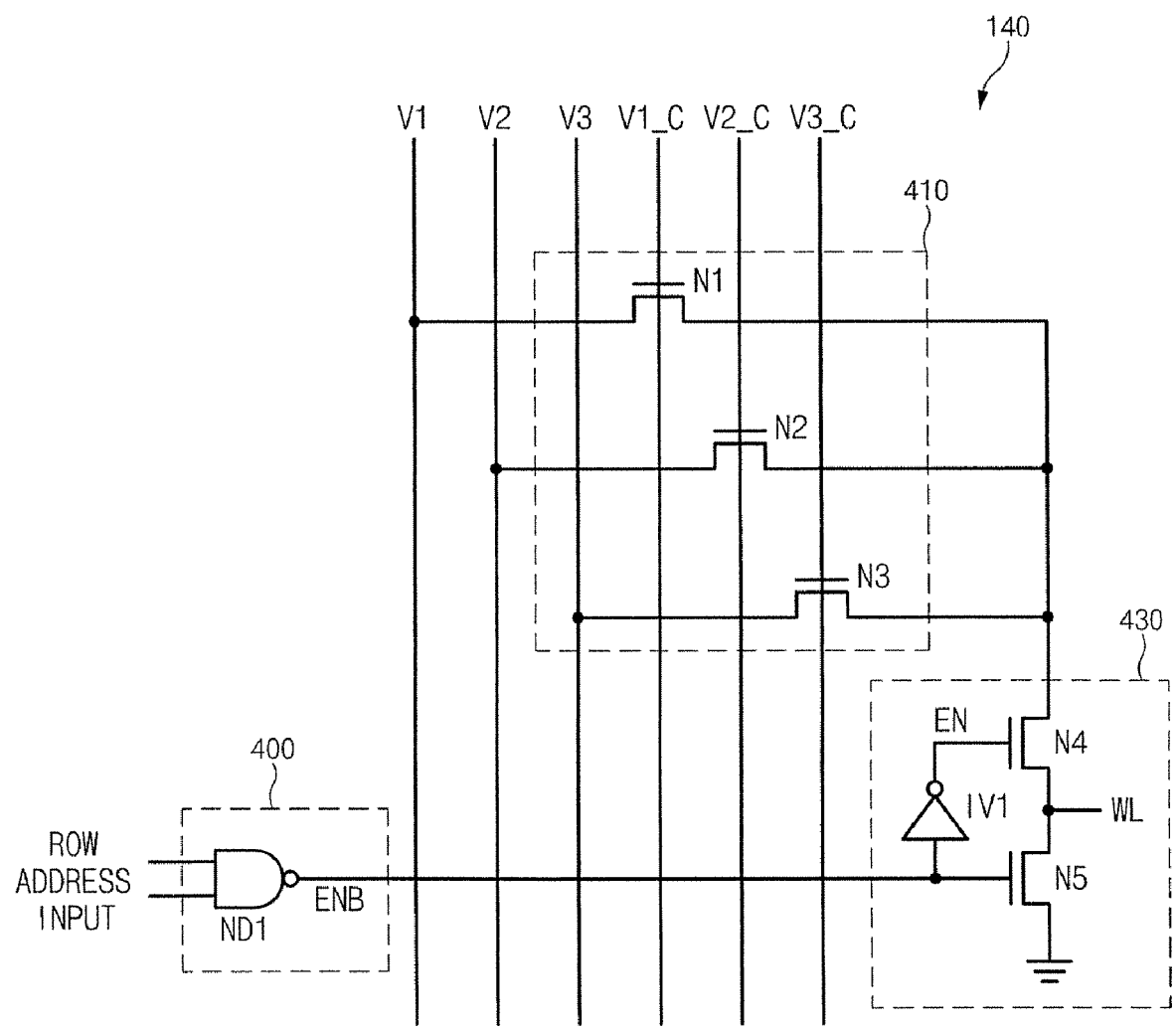
FIG. 15 is a circuit diagram illustrating a row decoder of a semiconductor memory device consistent with the present invention.

FIG. 15 is a circuit diagram illustrating row decoder 140 of a semiconductor memory device according to an embodiment consistent with the present invention.

Row decoder 140 controls a voltage level supplied in word line WL depending on input of the row address. Row decoder 140 comprises a row address decoder unit 400, a voltage supply unit 410 and a word line driving unit 430.

Row address decoder unit 400 includes a NAND gate ND1 configured to perform a NAND operation on the input of the row address so as to output an enable signal ENB.

Voltage supply unit 410 includes a plurality of NMOS transistors N1~N3 which are switching elements. NMOS transistor N1, connected between a first voltage V1 terminal and word line driving unit 430, has a gate to receive a voltage control signal V1_C.

NMOS transistor N2, connected between a second voltage V2 terminal and word line driving unit 430, has a gate to receive a voltage control signal V2_C. NMOS transistor N3, connected between a third voltage V3 terminal and word line driving unit 430, has a gate to receive a voltage control signal V3_C.

A first voltage V1, a second voltage V2 and a third voltage V3 supplied to word line WL are read voltage Vrd, power voltage VDD and negative read voltage −Vrd.

As shown in FIG. 8, read voltage Vrd as first voltage V1 can be supplied to selected word line WL<0> in read mode. As shown in FIG. 9, power voltage VDD as second voltage V2 can be supplied to selected word line WL<0> when data '0' is written. As shown in FIG. 10, negative read voltage −Vrd as third voltage V3 is supplied to selected word line WL<0> when data '1' is written.

Word line driving unit 430 includes a word line driving element which are connected between voltage supplying unit 410 and word line WL, a pull-down element and an inverter IV1. Word line WL is connected to a NMOS transistor N4, which is a word line driving element, and a NMOS transistor N5, which is a pull-down element.

NMOS transistor N5 has a gate to receive enable signal ENB outputted from row address decoder unit 400. Inverter IV1 inverts enable signal ENB to output an enable signal EN. NMOS transistor N4 has a gate to receive enable signal EN.

Figure 16:
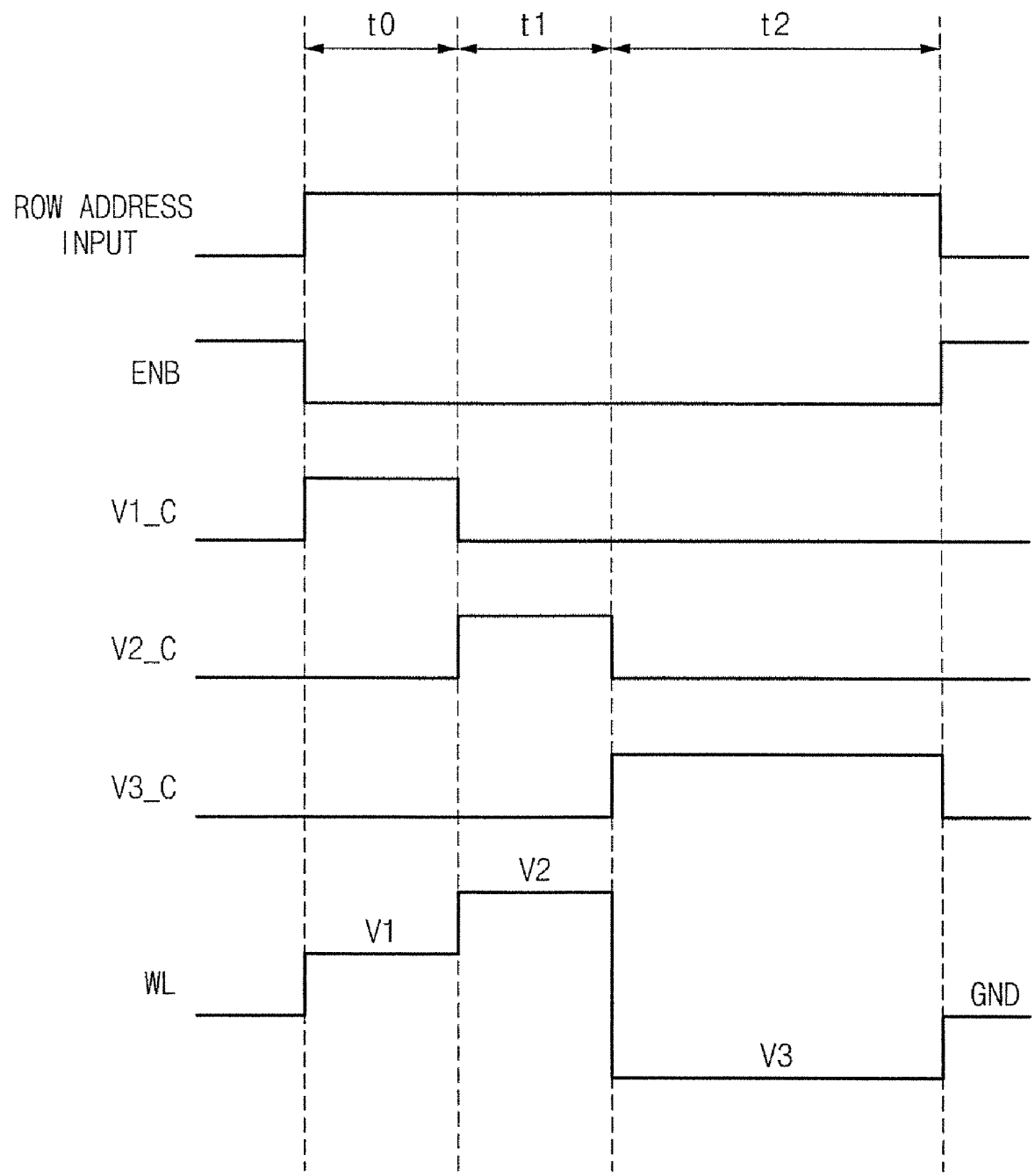
FIG. 16 is a waveform diagram illustrating an operation of the row decoder of FIG. 15 consistent with the present invention.

FIG. 16 is a waveform diagram illustrating an operation of row decoder 140 of FIG. 15.

In period to, enable signal ENB is activated to a low level when row address is inputted. As a result, NMOS transistor N5 is kept off, and NMOS transistor N4 is turned on. When voltage control signal V1_C is activated, NMOS transistor N1 is turned on to supply first voltage V1 to word line WL.

In period t1, enable signal ENB is maintained at the low level. As a result, NMOS transistor N5 is kept off, and NMOS transistor N4 is turned on. When voltage control signal V2_C is activated, NMOS transistor N2 is turned on to supply second voltage V2 to word line WL.

In period t2, enable signal ENB is maintained at the low level. As a result, NMOS transistor N5 is kept off, and NMOS transistor N4 is turned on. When voltage control signal V3_C is activated, NMOS transistor N3 is turned on to supply third voltage V3 to word line WL.

After period t2, enable signal ENB is inactivated at a high level when the row address is not inputted. As a result, NMOS transistor N5 is turned on to supply a ground voltage to word line WL.

Figure 17:
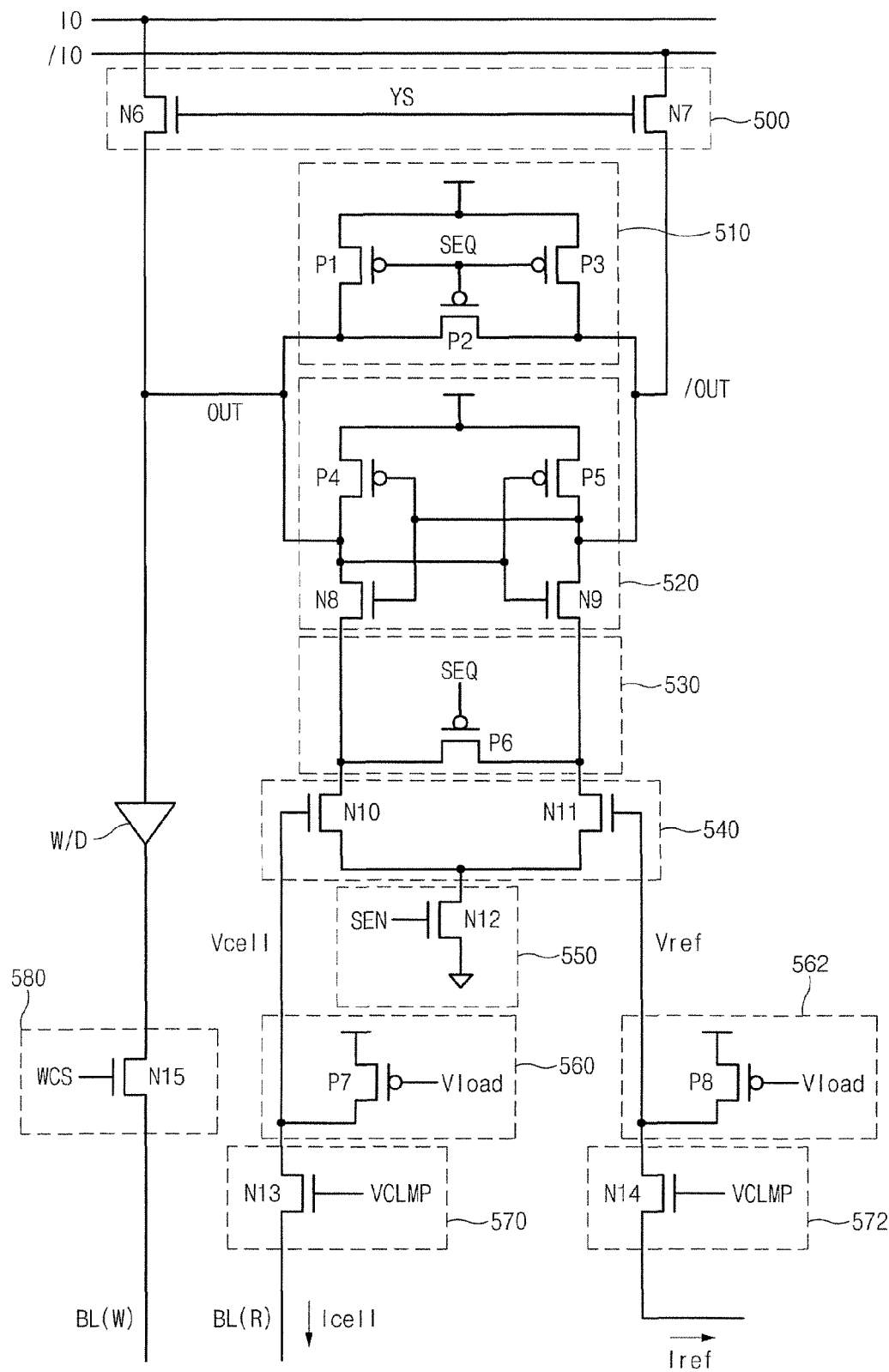
FIG. 17 is a circuit diagram illustrating a write driving unit and a sense amplifier of FIG. 14 consistent with the present invention.

FIG. 17 is a circuit diagram illustrating write driving unit W/D and sense amplifier S/A of FIG. 14.

Sense amplifier S/A comprises a column selecting unit 500, an equalizing unit 510, a register unit 520, a pull-up unit 530, an amplifying unit 540, an amplifying activation control unit 550, load units 560, 562, and bias control units 570, 572.

Column selecting unit 500 includes NMOS transistors N6, N7. NMOS transistors N6, N7, connected between input/output lines IO, /IO and output terminals OUT, /OUT, have a common gate to receive a column selecting signal YS.

Equalizing unit 510 includes PMOS transistors P1~P3. PMOS transistor P1 is connected between power voltage VDD terminal and output terminal OUT. PMOS transistor P3 is connected between power voltage VDD terminal and output terminal /OUT. PMOS transistor P2 is connected between output terminals OUT, /OUT. PMOS transistors P1~P3 have a common gate to receive a sense amplifier equalizing signal SEQ.

Register unit 520 includes PMOS transistors P4, P5 and NMOS transistors N8, N9 with a pair inverter latch structure. PMOS transistors P4, P5 are cross-coupled with NMOS transistors N8, N9. In this embodiment, register REG is exemplified as register unit 520.

Pull-up unit 530 includes a PMOS transistor P6. PMOS transistor P6, connected between both nodes of sense amplifier, has a gate to receive sense amplifier equalizing signal SEQ.

Amplifying unit 540 includes NMOS transistors N10, N11. NMOS transistor N10, connected between NMOS transistors N8, N12, has a gate to receive a cell voltage Vcell. NMOS transistor N11, connected between NMOS transistors N6, N9, has a gate to receive a reference voltage Vref.

Amplifying activation control unit 550, connected between amplifying unit 540 and ground voltage terminal, has gate to receive sense amplifier enable signal SEN.

Load unit 560 includes a PMOS transistor P7. PMOS transistor P7, connected between power voltage terminal and bit line BL(R), has a gate to receive a load voltage Vload.

Load unit 562 includes a PMOS transistor P8. PMOS transistor P8, connected between power voltage terminal and a reference voltage Vref terminal, has a gate to receive a load voltage Vload.

Bias control unit 570 includes a NMOS transistor N13. NMOS transistor N13, connected between a cell voltage Vcell terminal and bit line BL(R), has a gate to receive a clamp voltage VCLMP.

Bias control unit 572 includes a NMOS transistor N14. NMOS transistor N14, connected between reference voltage Vref terminal and a reference current Iref terminal, has a gate to receive clamp voltage VCLMP.

Word line driving unit W/D is connected between output terminal OUT and write control unit 580. Write control unit 580 includes a NMOS transistor N15. NMOS transistor N15, connected between write driving unit W/D and bit line BL(W), has a gate to receive a write control signal WCS.

Figure 18:
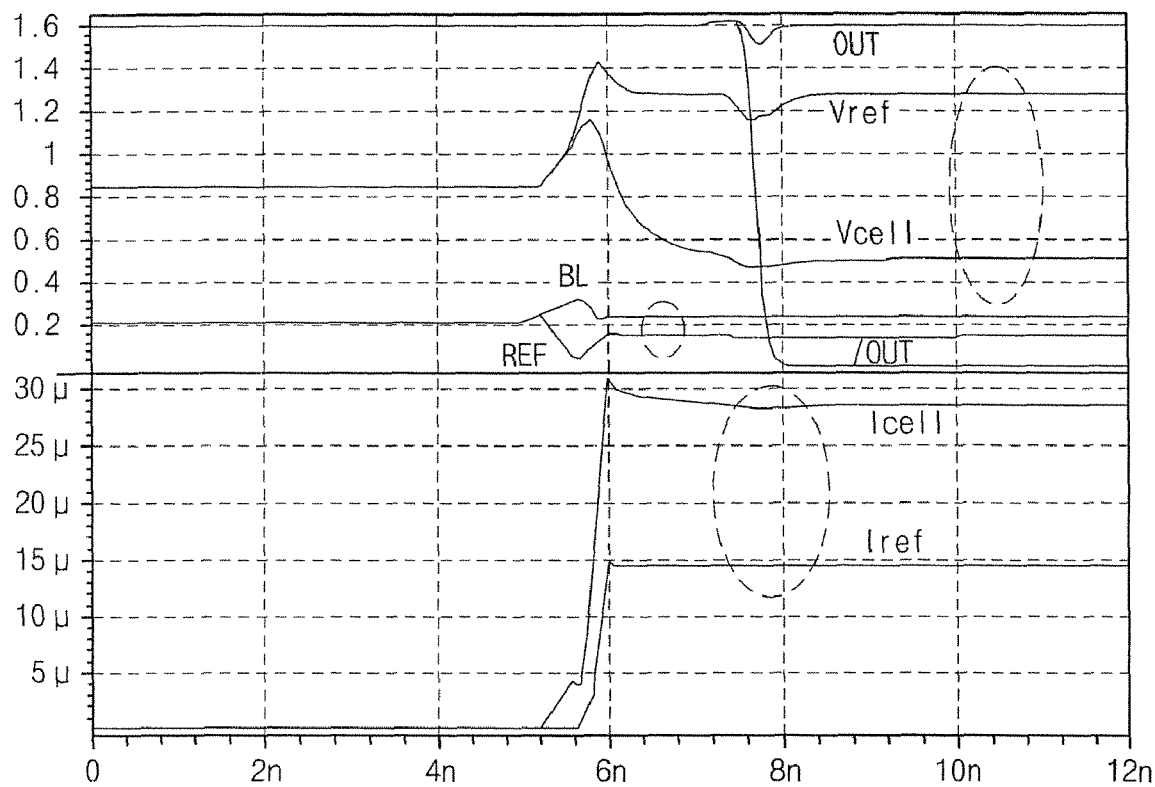
FIG. 18 is a waveform diagram illustrating the write driving unit and the sense amplifier of FIG. 17 consistent with the present invention.

FIG. 18 is a waveform diagram illustrating write driving unit and sense amplifier S/A of FIG. 17.

If clamp voltage VCLMP is increased, NMOS transistor N13 is turned on to transmit bit line current Icell of main cell. If clamp voltage VCLMP is increased, NMOS transistor N14 is turned on to transmit reference current Iref.

Load units 560, 562 include PMOS transistors P7, P8 controlled by load voltage Vload. Load values of PMOS transistors P7, P8 convert current Icell of bit line BL and reference current Iref into cell voltage Vcell and reference voltage Vref.

Amplifying activation control unit 550 is controlled by sense amplifier enable signal SEN. Amplifying unit 540 is activated depending on a state of amplifying activation control unit 550. Amplifying unit 540 amplifies cell voltage Vcell and reference voltage Vref with gains of NMOS transistors N10, N11.

Both node of sense amplifier is precharged to a high level during a precharge period depending on the operation of pull-up unit 530, thereby improving a first amplifying characteristic of sense amplifier S/A. Voltage amplified in amplifying unit 540 is transmitted and stored into register unit 520. Register unit 520 stores write data of sense amplifier while sense amplifier enable signal SEN is activated.

Register unit 520 exchanges data with input/output lines IO, /IO in response to column selecting signal YS. Register unit 520 amplifies the gain of amplifying unit 540 to improve an off-set characteristic of sense amplifier S/A. Equalizing unit 510 precharges an output signal of register unit 520 to a high level during precharge period.

NMOS transistors N6, N7 of column selecting unit 500 are turned on when column selecting signal YS is activated so as to connect input/output lines IO, /IO to output terminals OUT, /OUT selectively. Write driving unit W/D transmits data of input/output lines IO, /IO into bit line BL(W) when write control signal WCS is activated or data stored in register unit 520 into bit line BL(W).

Figure 19:
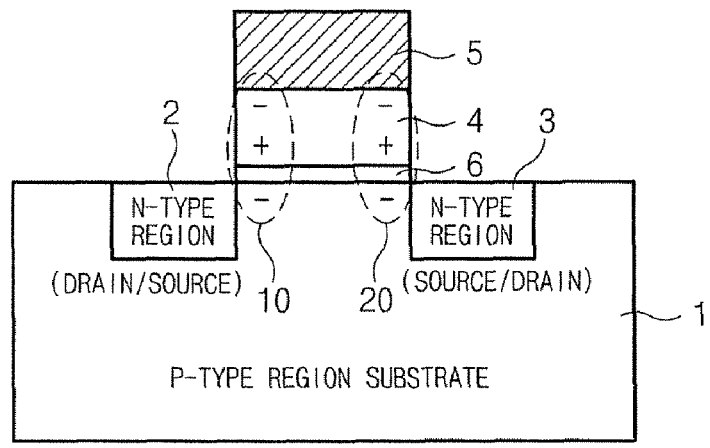
FIG. 19 is a diagram illustrating a semiconductor memory device consistent with the present invention.

FIG. 19 is a diagram illustrating a semiconductor memory device according to an embodiment consistent with the present invention.

In an embodiment, a 1-T FET type ferroelectric memory cell includes a left bit storage unit 10 for storing 1 bit and a right bit storage unit 20 for storing 1 bit, so as to store a dual bit in a unit cell. Hereinafter, left bit is referred to as a 'L-bit' and the right bit is referred to as a 'R-bit'.

L-bit storage unit 10 includes channel region and ferroelectric layer 4 disposed in a left part based on channel region of unit cell, so as to store data '1' or '0'. R-bit storage unit 20 includes channel region and ferroelectric layer 4 disposed in a right part based on channel region of the unit cell, so as to store the data '1' or '0'.

When data stored in L-bit storage unit 10 is read, N-type region 2 serves as a source region, and N-type region 3 serves as a drain region. When data stored in R-bit storage unit 20 is read, N-type region 3 serves as a source region, and N-type region 2 serves as a drain region. One of N-type regions 2, 3 may be a drain region or a source region.

In write mode of memory cell, data can be written simultaneously in L-bit storage unit 10 and R-bit storage unit 20. In read mode, data stored in L-bit storage unit 10 and R-bit storage unit 20 cannot be read simultaneously.

L-bit storage unit 10 sets a region where the polarity of ferroelectric layer 4 is changed to be an effective data storage region by a voltage applied between gate region (channel region) and N-type region 2 that serves as a source region. R-bit storage unit 20 sets a region where the polarity of ferroelectric layer 4 to be an effective data storage region by a voltage applied between gate region (channel region) and N-type region 3 that serves as a source region.

The intended data is not read or written but ineffective data that do not affect read/write operations of data is stored because a weak channel bias voltage is applied to a region between L-bit storage unit 10 and R-bit storage unit 20. The width of storage region corresponding to L-bit storage unit 10 and R-bit storage unit 20 can be changed depending on bias voltage applied to drain/source regions.

Figure 20:
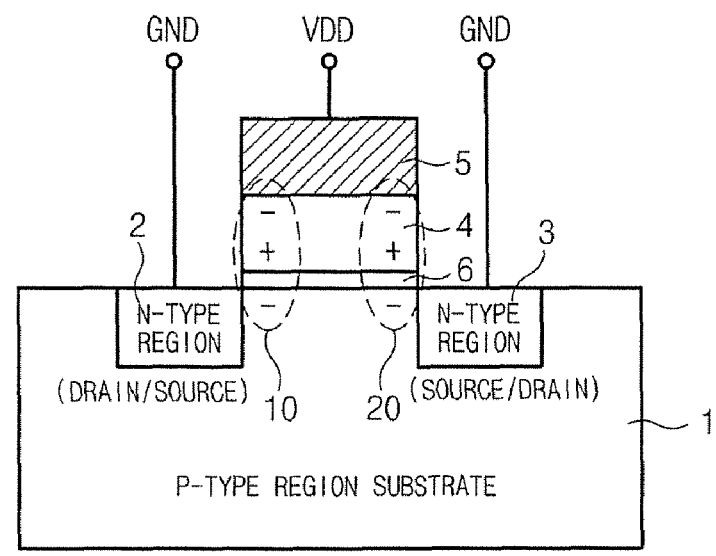
FIG. 20 is a diagram illustrating a data '00' write operation of a semiconductor memory device consistent with the present invention.

FIG. 20 is a diagram illustrating a data '00' write operation of a semiconductor memory device according to an embodiment consistent with the present invention.

Power voltage VDD is applied to word line 5 in order to store the data '0' in L-bit storage unit 10 and R-bit storage unit 20. Ground voltage GND is applied to N-type drain/source regions 2, 3. A negative charge is induced into channel region depending on polarity of ferroelectric layer 4 so as to write data '00'.

Figure 21:
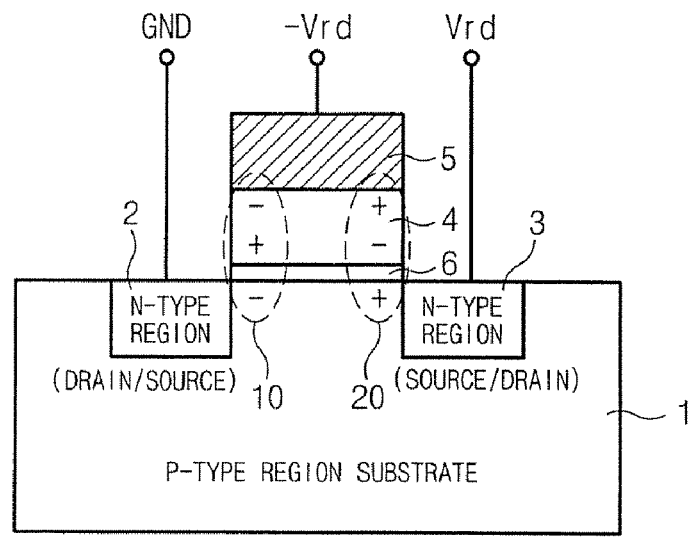
FIG. 21 is a diagram illustrating a data '01' write operation of a semiconductor memory device consistent with the present invention.

FIG. 21 is a diagram illustrating a data '01' write operation of a semiconductor memory device according to an embodiment consistent with the present invention.

Negative read voltage −Vrd is applied to word line 5 in order to store data '0' in L-bit storage unit 10 and data '1' in R-bit storage unit 20. Ground voltage GND is applied to N-type drain/source region 2, and positive read voltage Vrd is applied to N-type drain/source region 3.

A negative charge is induced into channel region of L-bit storage unit 10 depending on the polarity of ferroelectric layer 4, so as to write data '0'. A positive charge is induced into channel region of R-bit storage unit 20 depending on the polarity of ferroelectric layer 4, so as to write data '1'.

Figure 22:
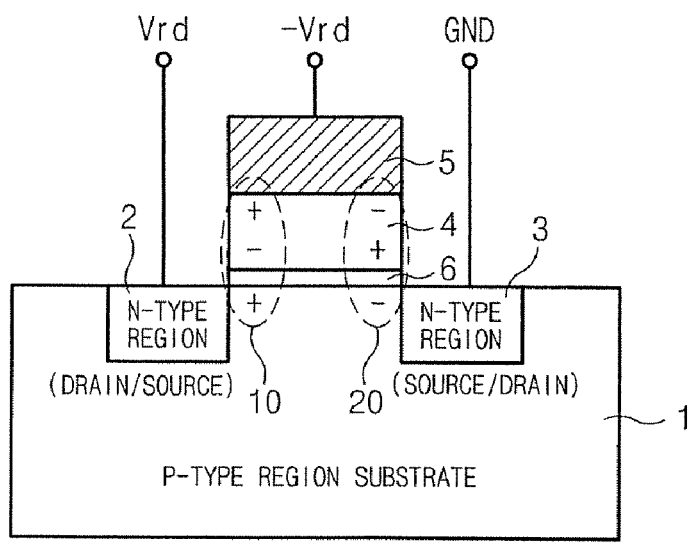
FIG. 22 is a diagram illustrating a data '10' write operation of a semiconductor memory device consistent with the present invention.

FIG. 22 is a diagram illustrating a data '10' write operation of a semiconductor memory device according to an embodiment consistent with the present invention.

Negative read voltage −Vrd is applied to word line 5 in order to store data '1' in L-bit storage unit 10 and data '0' in R-bit storage unit 20. Positive read voltage Vrd is applied to N-type drain/source region 2, and ground voltage GND is applied to N-type drain/source region 3.

A positive charge is induced into channel region of L-bit storage unit 10 depending on the polarity of ferroelectric layer 4, so as to write data '1'. A negative charge is induced into channel region of R-bit storage unit 20 depending on the polarity of ferroelectric layer 4, so as to write data '0'.

Figure 23:
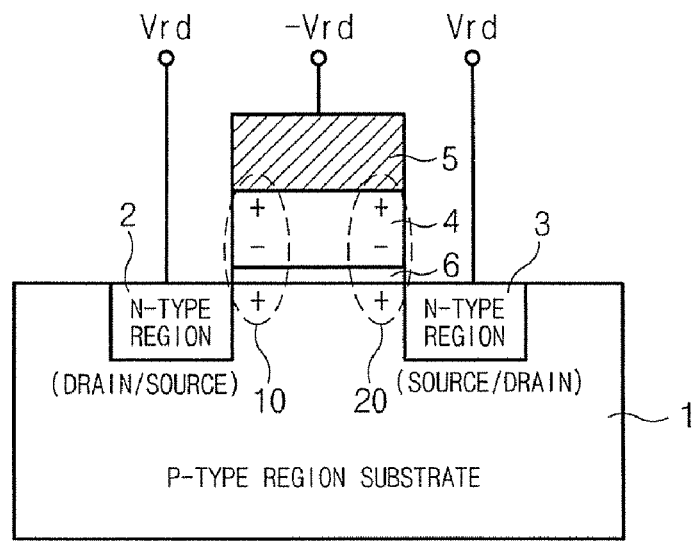
FIG. 23 is a diagram illustrating a data '11' write operation of a semiconductor memory device consistent with the present invention.

FIG. 23 is a diagram illustrating a data '11' write operation of a semiconductor memory device according to an embodiment consistent with the present invention.

Negative read voltage −Vrd is applied to word line 5 in order to store data '1' in L-bit storage unit 10 and data '1' in R-bit storage unit 20. Positive read voltage Vrd is applied to N-type drain/source regions 2, 3. A positive charge is induced into channel region depending on the polarity of ferroelectric layer 4, so as to write data '11'.

Figure 24:
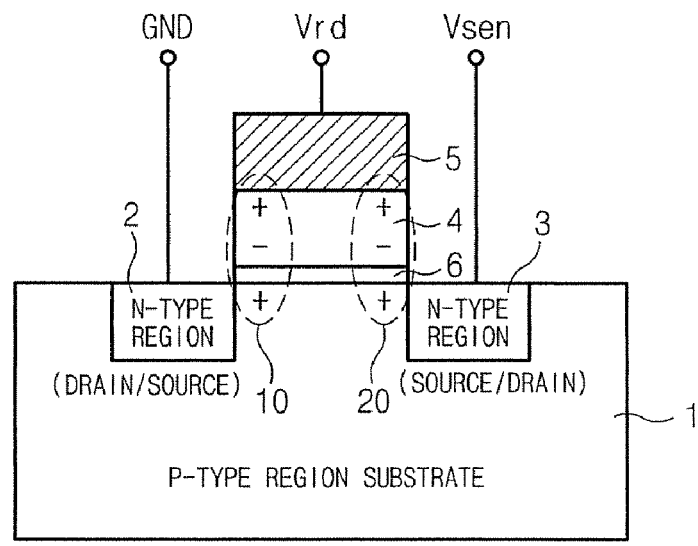
FIG. 24 is a diagram illustrating a read operation of left bit data of a semiconductor memory device consistent with the present invention.

FIG. 24 is a diagram illustrating a read operation of L-bit data of a semiconductor memory device according to an embodiment consistent with the present invention.

Read voltage Vrd is applied to word line 5 in order to read data stored in L-bit storage unit 10. Ground voltage GND is applied to N-type drain/source region 2, and sensing bias voltage Vsen is applied to N-type drain/source region 3. A cell sensing current flowing in channel region is sensed to read data stored in L-bit storage unit 10.

Figure 25:
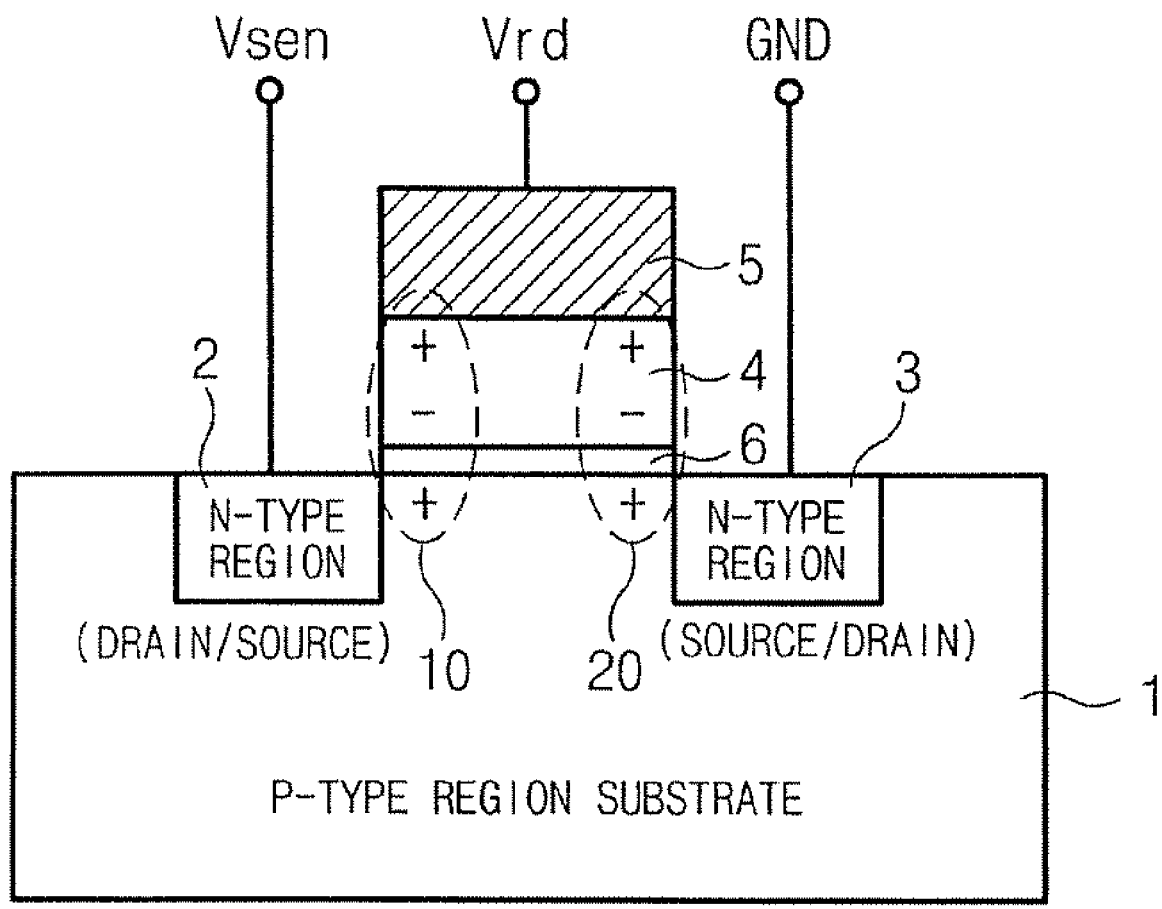
FIG. 25 is a diagram illustrating a read operation of right bit data of a semiconductor memory device consistent with the present invention.

FIG. 25 is a diagram illustrating a read operation of R-bit data of a semiconductor memory device according to an embodiment consistent with the present invention.

Read voltage Vrd is applied to word line 5 in order to read data stored in R-bit storage unit 20. Sensing bias voltage Vsen is applied to N-type drain/source region 2, and ground voltage GND is applied to N-type drain/source region 3. A cell sensing current flowing in channel region is sensed to read data stored in R-bit storage unit 20.

Figure 26:
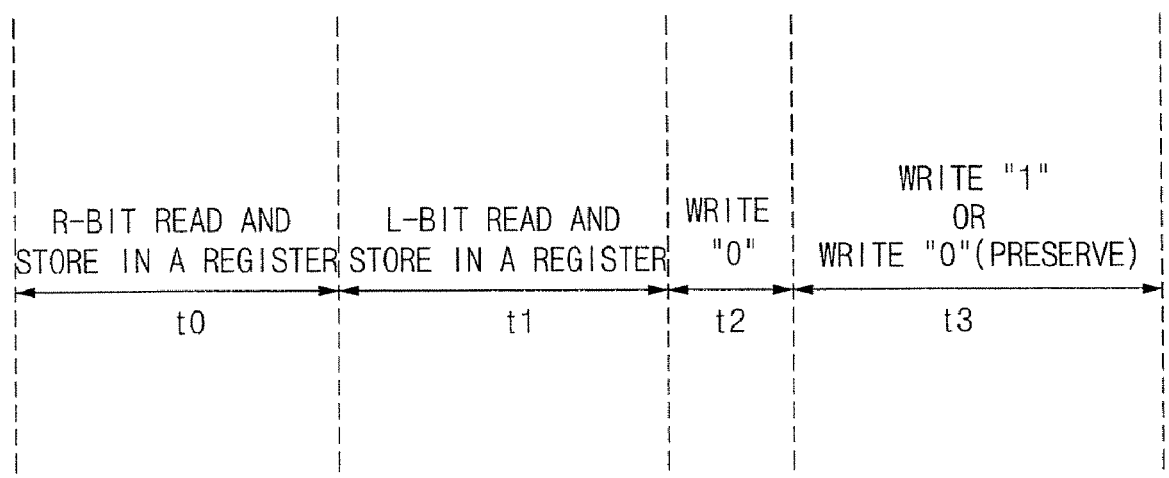
FIG. 26 is a timing diagram illustrating a write cycle of a semiconductor memory device consistent with the present invention.

FIG. 26 is a timing diagram illustrating a write cycle of a semiconductor memory device according to an embodiment consistent with the present invention.

In a period t0, R-bit data is read and amplified in all cells of selected row address, and stored in register. In a period t1, L-bit data is read and amplified in all cells of selected row address, and stored in the register.

In a period t2, since data "0" is written in all memories, it is not clear which data is stored in existing memory cell. As a result, in order to know which data is stored in existing memory cell, data "0" is stored in register before data "0" is written in memory cell.

In period t2, data "0" is written in all cells of selected row address. In a period t3, data stored in register in a refresh mode is re-written and restored in memory cell, or new external data are written in cells. In period t2, data "0" is preserved because data "0" is previously written in period t1, or data "1" is written.

Figure 27:
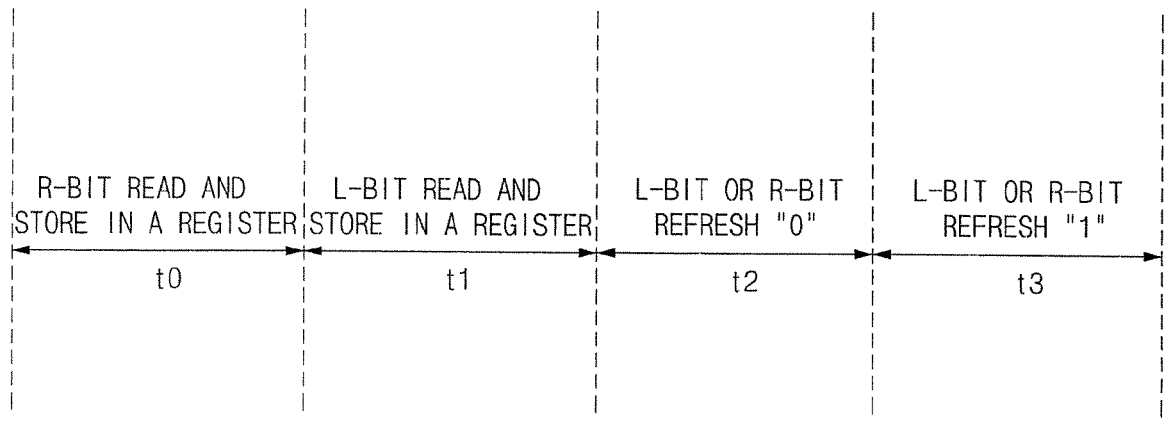
FIG. 27 is a timing diagram illustrating a refresh cycle of a semiconductor memory device consistent with the present invention.

FIG. 27 is a timing diagram illustrating a refresh cycle of a semiconductor memory device according to an embodiment consistent with the present invention.

In period t0, R-bit data is read and amplified in all cells of the selected row address, and stored in the register. In period t1, L-bit data is read and amplified in all cells of selected row address, and stored in the register.

In a period t2, a refresh "0" operation is performed to restore L-bit or R-bit data "0" in all cells of selected row address. In a period t3, a refresh "1" operation is performed to restore L-bit or R-bit data "1" in all cells of selected row address.

Figure 28:
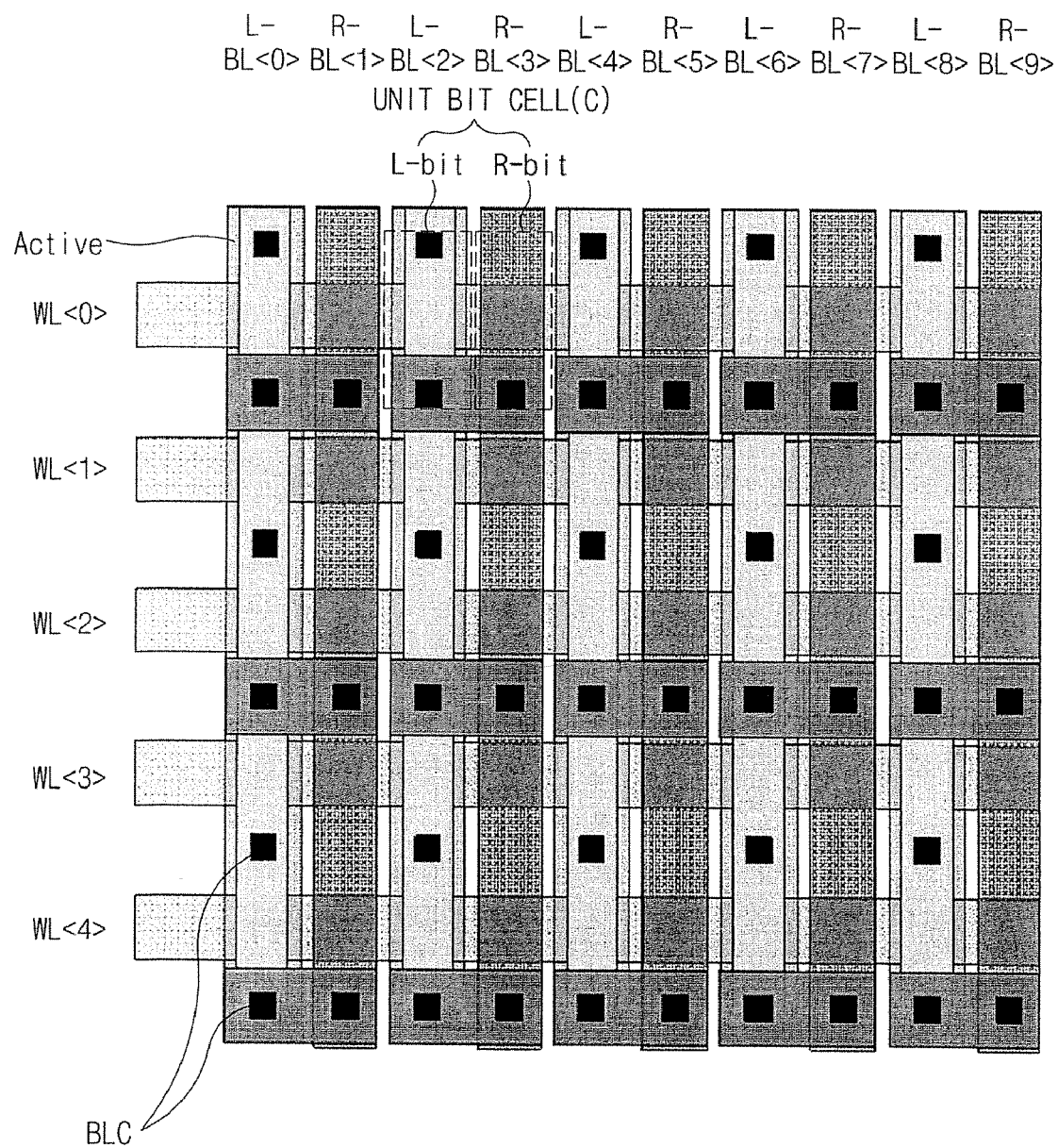
FIG. 28 is a plane diagram illustrating a cell array of a semiconductor memory device consistent with the present invention.

FIG. 28 is a plane diagram illustrating a cell array of a semiconductor memory device according to an embodiment consistent with the present invention.

Cell array comprises a plurality of word lines WL arranged in a row direction. A plurality of bit lines BL are arranged perpendicularly to plurality of word lines WL (in a column direction). A plurality of unit cells C are disposed each in a region where plurality of word lines WL are crossed with plurality of bit lines BL.

Odd bit lines BL<1>, BL<3>, BL<5>, BL<7>, BL<9> are configured to store R-bit. Even bit lines BL<0>, BL<2>, BL<4>, BL<6>, BL<8> are configured to store L-bit. Odd bit lines BL<1>, BL<3>, BL<5>, BL<7>, BL<9> are alternately arranged with even bit lines BL<0>, BL<2>, BL<4>, BL<6>, BL<8> each in a different layer. When one unit cell C is connected to two bit lines BL, the area of bit line BL is prevented from being increased.

That is, even bit lines BL<0>, BL<2>, BL<4>, BL<6>, BL<8> are formed in an upper or lower layer of odd bit lines BL<1>, BL<3>, BL<5>, BL<7>, BL<9>. Odd bit lines BL<1>, BL<3>, BL<5>, BL<7>, BL<9> are formed in an upper or lower layer of even bit lines BL<0>, BL<2>, BL<4>, BL<6>, BL<8>.

Unit cell C comprises a word line WL and two bit lines BL arranged in a different layer. For example, unit cell C comprises a word line WL<0>, an even bit line L-BL<2> and an odd bit line R-BL<3> which are connected through a bit line contact BLC.

Figure 29:
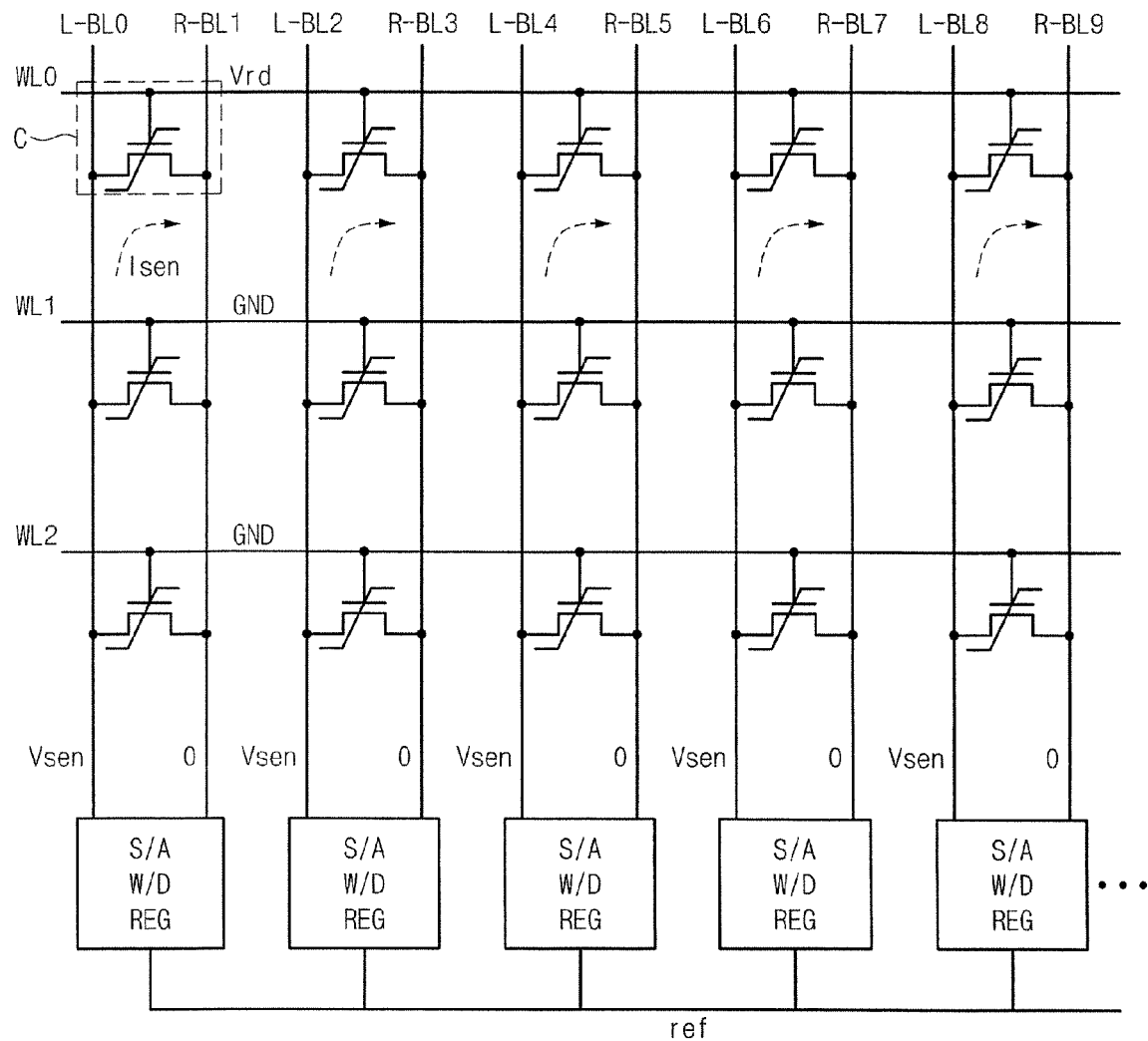
FIG. 29 is a diagram illustrating a cell array structure and a R-bit data read operation of a semiconductor memory device consistent with the present invention.

FIG. 29 is a diagram illustrating a cell array structure and a R-bit data read operation of a semiconductor memory device according to an embodiment consistent with the present invention.

A plurality of word lines WL are arranged in a row direction with a given interval. A plurality of even/odd bit lines L-BL, R-BL are arranged perpendicularly to the plurality of word lines WL, that is, in a column direction. A plurality of unit cells C are located each in a region where the plurality of word lines WL are crossed with the plurality of even/odd bit lines L-BL, R-BL.

Unit cell C having a 1-T FET structure is connected to word line WL<0> and even/odd bit lines L-BL<0>, R-BL<1> formed in a different layer. Although word line WL<0> and even/odd bit lines L-BL<0>, R-BL<1> are exemplified in the embodiment consistent with the present invention, the present invention can be applied to rest word lines WL<1>, WL<2>, . . . and rest bit line pairs L-BL<2>, R-BL<3>, . . . .

Unit cell C has a drain and a source connected between paired bit lines L-BL<0>, R-BL<1>, and a gate connected to word line WL<0>. Paired bit lines L-BL<0>, R-BL<1> arranged in a different layer are connected to a sense amplifier S/A, a write driver W/D and a register REG. That is, each bit line BL is connected one-by-one to sense amplifier S/A, the write driver W/D and register REG.

Sense amplifier S/A senses and amplifies cell data to distinguish data "1" from data "0" so that sense amplifier S/A is connected to paired bit lines L-BL<0>, R-BL<1>. Sense amplifier S/A transmits a reference voltage through a reference voltage terminal ref in order to generate a reference current.

When data are written in memory cell, write driver W/D is configured to generate a driving voltage depending on write data so as to supply driving voltage to bit line BL. Write driver W/D is connected to paired bit lines L-BL<0>, R-BL<1>. Register REG as a temporary memory element for storing data of sense amplifier S/A temporarily is connected to paired bit lines L-BL<0>, R-BL<1>.

In a read mode of R-bit data of cell array, a read voltage Vrd is applied to selected word line WL<0>, and a ground voltage GND is applied to unselected word lines WL<1>, WL<2>. A sensing bias voltage Vsen for sensing a sensing current of unit cell C is applied to bit line L-BL<0> connected to unit cell C. Ground voltage GND is applied to bit line R-BL<1> connected to unit cell C.

A cell sensing current Isen flows depending on a storage state of cell data. As a result, current flowing in paired bit lines L-BL<0>, R-BL<1> becomes different depending on the polarity of ferroelectric layer 4 so as to read cell data stored in unit cell C.

That is, sense amplifier S/A senses a value of cell sensing current Isen flowing in bit line R-BL<1> to read R-bit data when read voltage Vrd is applied to word line WL<0>, sensing bias voltage Vsen is applied to bit line L-BL<0>, and ground voltage is applied to bit line R-BL<1>.

When a channel region of memory cell is turned off, the value of cell sensing current Isen is sensed so that data "1" stored in R-bit storage unit 20 can be read. On the other hand, when channel region is turned on, the value of the cell sensing current Isen is sensed so that data "0" stored in R-bit storage unit 20 can be read.

Figure 30:
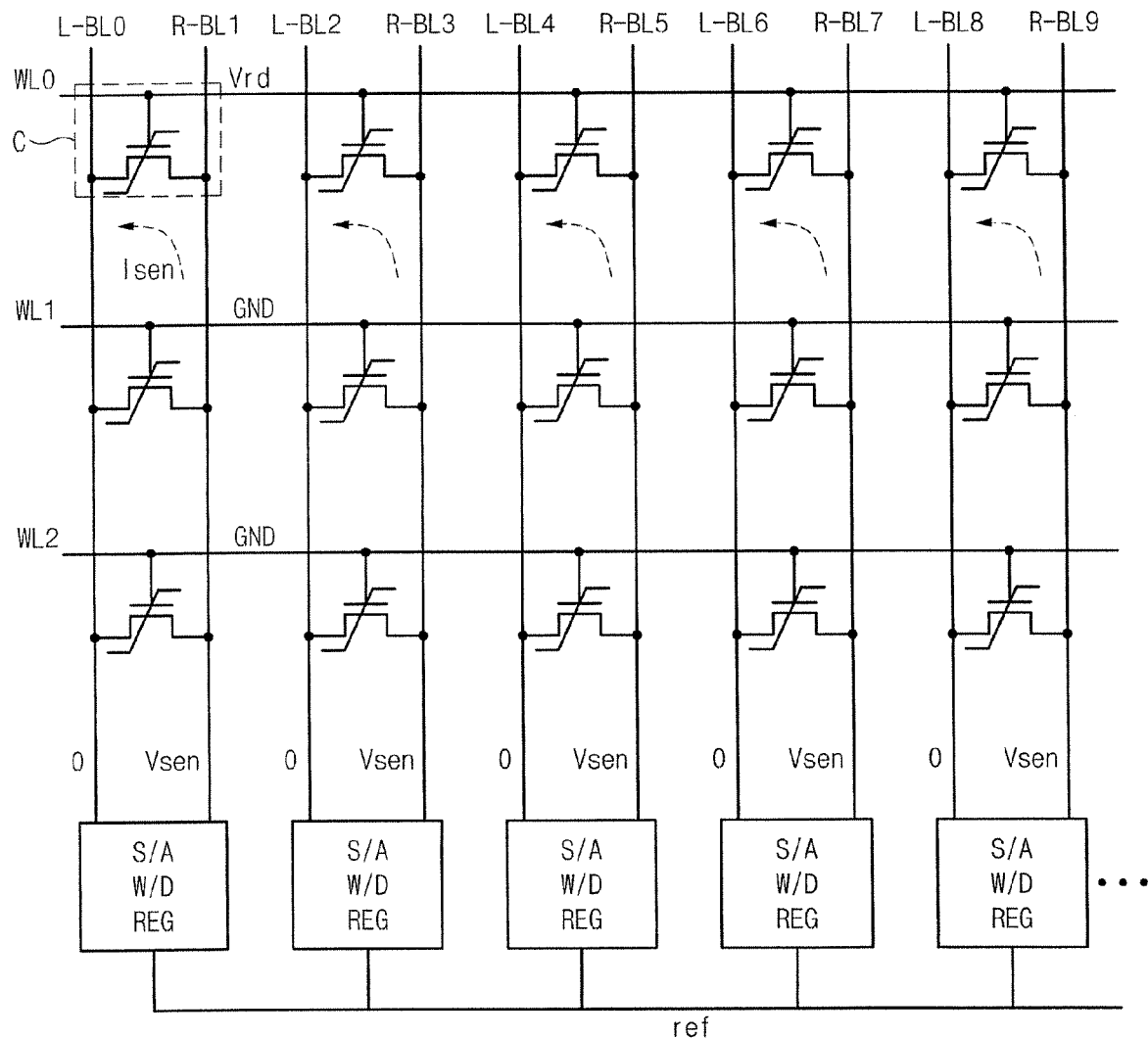
FIG. 30 is a diagram illustrating a left bit data read operation of a semiconductor memory device consistent with the present invention.

FIG. 30 is a diagram illustrating a left bit data read operation of a semiconductor memory device according to an embodiment consistent with the present invention.

In a read mode of L-bit data, read voltage Vrd is applied to selected word line WL<0>, and ground voltage GND is applied to unselected word lines WL<1>, WL<2>. Ground voltage GND is applied to bit line L-BL<0> connected to unit cell C. Sensing bias voltage Vsen for sensing a sensing current of unit cell C is applied to bit line R-BL<1> connected to unit cell C.

A cell sensing current Isen flows depending on a storage state of cell data. As a result, current flowing in paired bit lines L-BL<0>, R-BL<1> becomes different depending on the polarity of ferroelectric layer 4 so as to read cell data stored in unit cell C.

That is, sense amplifier S/A senses a value of cell sensing current Isen flowing in bit line L-BL<0> to read L-bit data when read voltage Vrd is applied to word line WL<0>, ground voltage GND is applied to bit line L-BL<0>, and sensing bias voltage Vsen is applied to bit line R-BL<1>.

When a channel region of memory cell is turned off, the value of cell sensing current Isen is sensed so that data "1" stored in L-bit storage unit 10 can be read. On the other hand, when channel region is turned on, the value of cell sensing current Isen is sensed so that data "0" stored in L-bit storage unit 10 can be read.

Figure 31:
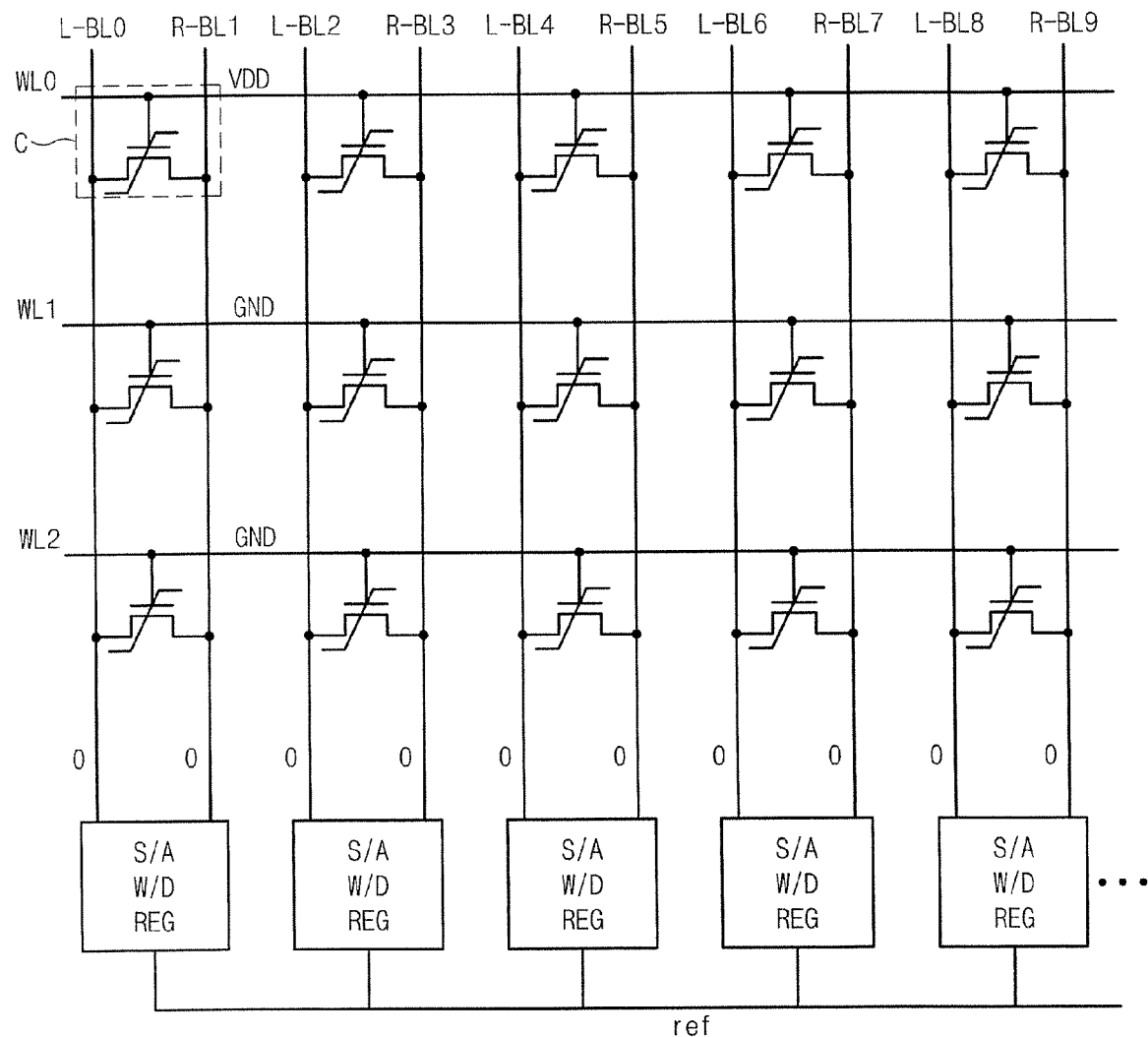
FIG. 31 is a diagram illustrating a data '0000 . . . ' write operation of a semiconductor memory device consistent with the present invention.

FIG. 31 is a diagram illustrating a data '0000 . . . ' write operation of a semiconductor memory device according to an embodiment consistent with the present invention.

When data '0000' is written, power voltage VDD over a threshold voltage Vc where a ferroelectric polarity characteristic is changed is applied to selected word line WL<0>, and ground voltage GND is applied to unselected word lines WL<1>, WL<2>. Ground voltage is applied to all paired bit lines L-BL, R-BL connected to unit cell C.

Read voltage Vrd is smaller than threshold voltage Vc, and power voltage VDD is larger than threshold voltage Vc. Sensing bias voltage Vsen is smaller than read voltage Vrd.

A ferroelectric material is polarized while channel region of memory cell is turned on. As a result, data '0000 . . . ' is written in memory cell. That is, while power voltage VDD is applied to word line WL<0> and ground voltage is applied to paired bit lines L-BL, R-BL, channel region is turned on depending on polarization of ferroelectric layer 4 so that data '0000 . . . ' can be written in memory cell.

Figure 32:
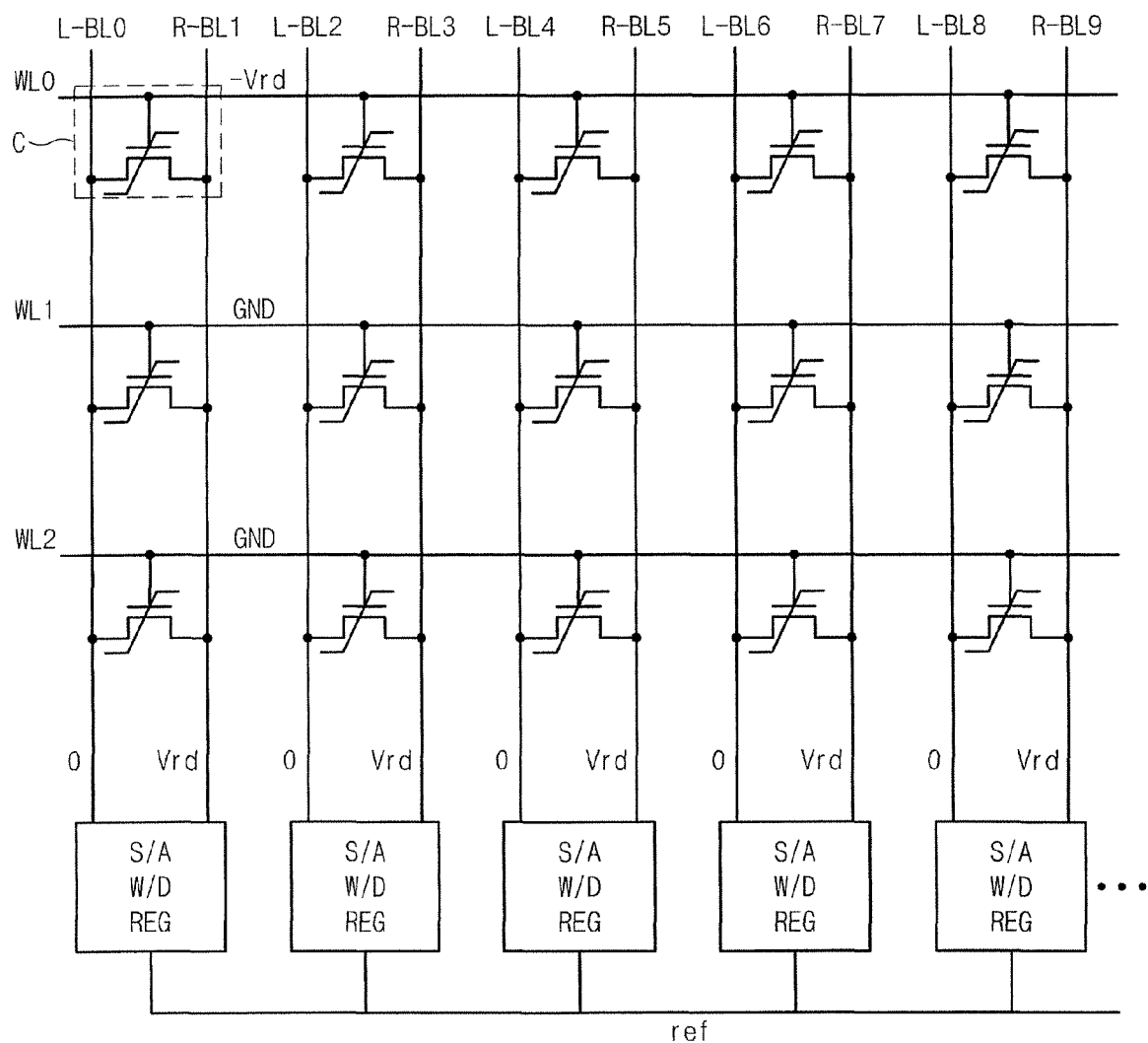
FIG. 32 is a diagram illustrating a data '0101 . . . ' write operation of a semiconductor memory device consistent with the present invention.

FIG. 32 is a diagram illustrating a data '0101 . . . ' write operation of a semiconductor memory device according to an embodiment consistent with the present invention.

When data '0101' is written, negative read voltage −Vrd is applied to selected word line WL<0>, and ground voltage GND is applied to unselected word lines WL<1>, WL<2>. Ground voltage is applied to bit line L-BL connected to unit cell C. Positive read voltage Vrd is applied to bit line R-BL connected to unit cell.

Positive read voltage Vrd is applied to N-type drain/source region 3 of bit line R-BL, and negative read voltage −Vrd is applied to a gate over threshold voltage Vc where the polarity of ferroelectric layer 4 is changed. As a result, the ferroelectric material is polarized when channel region of memory cell is turned off.

A voltage below threshold voltage Vc is applied to bit line L-BL of selected row so that data '0' is preserved in L-bit storage unit 10 and data '1' is written in R-bit storage unit 20. Negative read voltage −Vrd is applied to word line WL<0>, and ground voltage and positive read voltage Vrd are applied to paired L-BL, R-BL. Channel region is turned off depending on polarization of the ferroelectric layer 4 so that data '0101 . . . ' can be written in memory cell.

Figure 33:
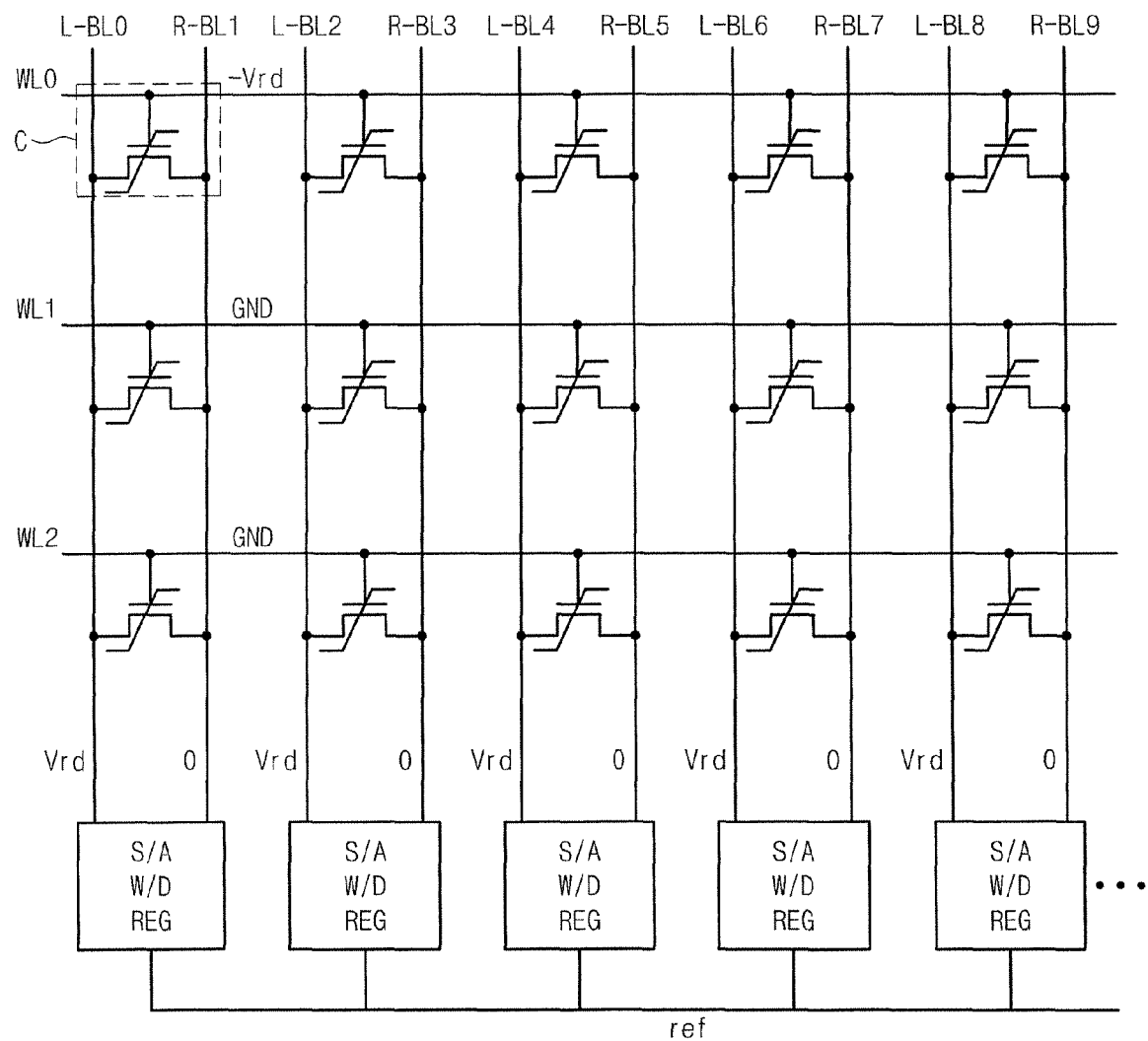
FIG. 33 is a diagram illustrating a data '1010 . . . ' write operation of a semiconductor memory device consistent with the present invention.

FIG. 33 is a diagram illustrating a data '1010 . . . ' write operation of a semiconductor memory device according to an embodiment consistent with the present invention.

When data '1010' is written, negative read voltage −Vrd is applied to selected word line WL<0>, and ground voltage GND is applied to unselected word lines WL<1>, WL<2>. Positive read voltage Vrd is applied to bit line L-BL connected to unit cell C, and ground voltage is applied to bit line R-BL connected to unit cell C.

Positive read voltage Vrd is applied to N-type drain/source region 2 of bit line L-BL, and negative read voltage −Vrd is applied to a gate over threshold voltage Vc where the polarity of ferroelectric layer 4 is changed. As a result, the ferroelectric material is polarized when channel region of memory cell is turned off.

A voltage below threshold voltage Vc is applied to bit line R-BL of selected row so that data '0' is preserved in R-bit storage unit 20 and data '1' is written in L-bit storage unit 10. Negative read voltage −Vrd is applied to word line WL<0>, and positive read voltage Vrd and ground voltage are applied to paired L-BL, R-BL. Channel region is turned off depending on the polarization of ferroelectric layer 4 so that data '1010 . . . ' can be written in memory cell.

Figure 34:
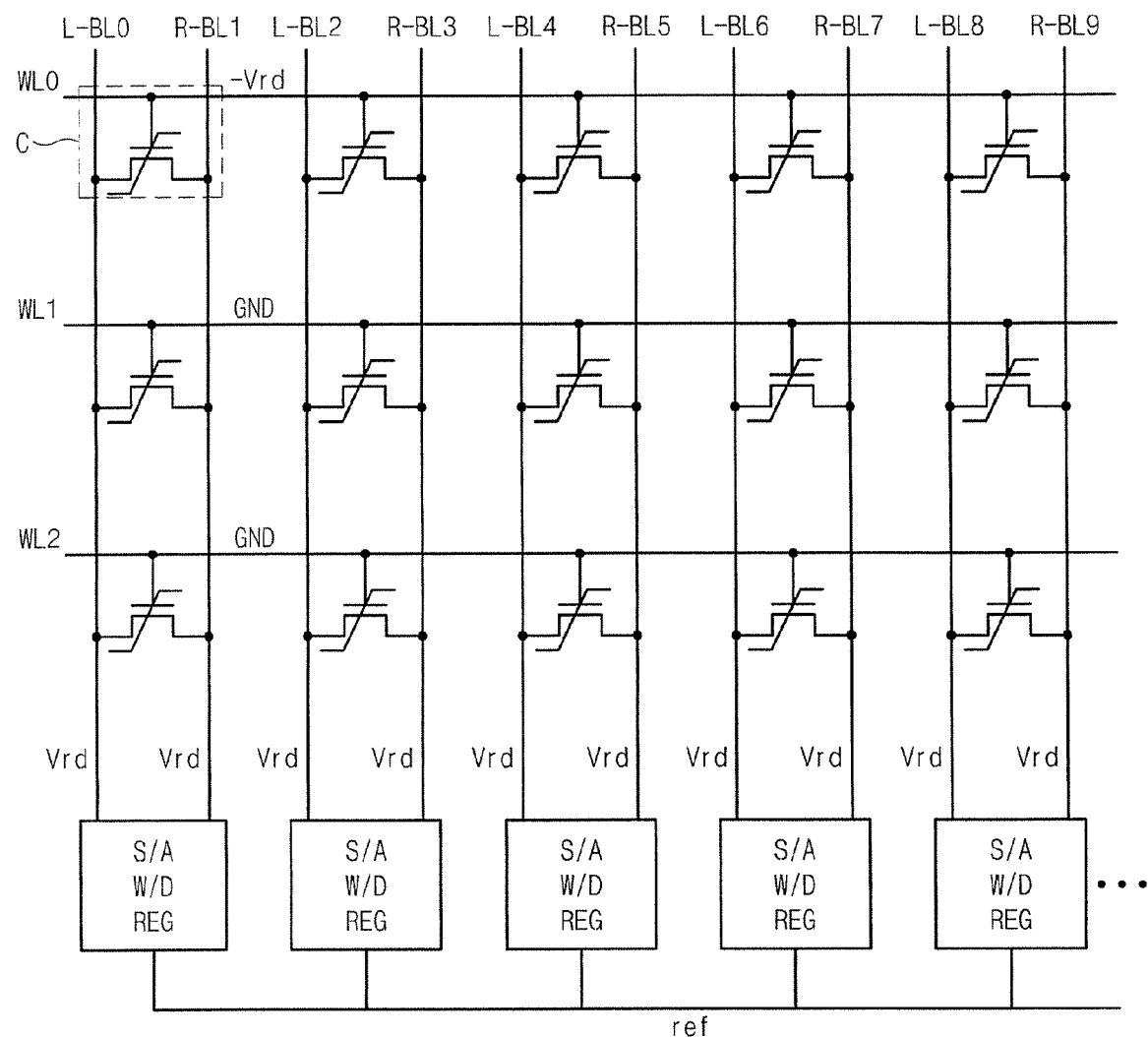
FIG. 34 is a diagram illustrating a data '1111 . . . ' write operation of a semiconductor memory device consistent with the present invention.

FIG. 34 is a diagram illustrating a data '1111 . . . ' write operation of a semiconductor memory device according to an embodiment consistent with the present invention.

When data '1111' is written, negative read voltage −Vrd is applied to selected word line WL<0>, and ground voltage GND is applied to unselected word lines WL<1>, WL<2>. Ground voltage is applied to all paired bit lines L-BL, R-BL connected to unit cell C.

As a result, ferroelectric material is polarized when channel region of memory cell is turned off. Negative read voltage −Vrd is applied to word line WL<0>, and positive read voltage Vrd are applied to paired L-BL, R-BL. Channel region is turned off depending on the polarization of ferroelectric layer 4 so that data '1111 . . . ' can be written in memory cell.

Figure 35:
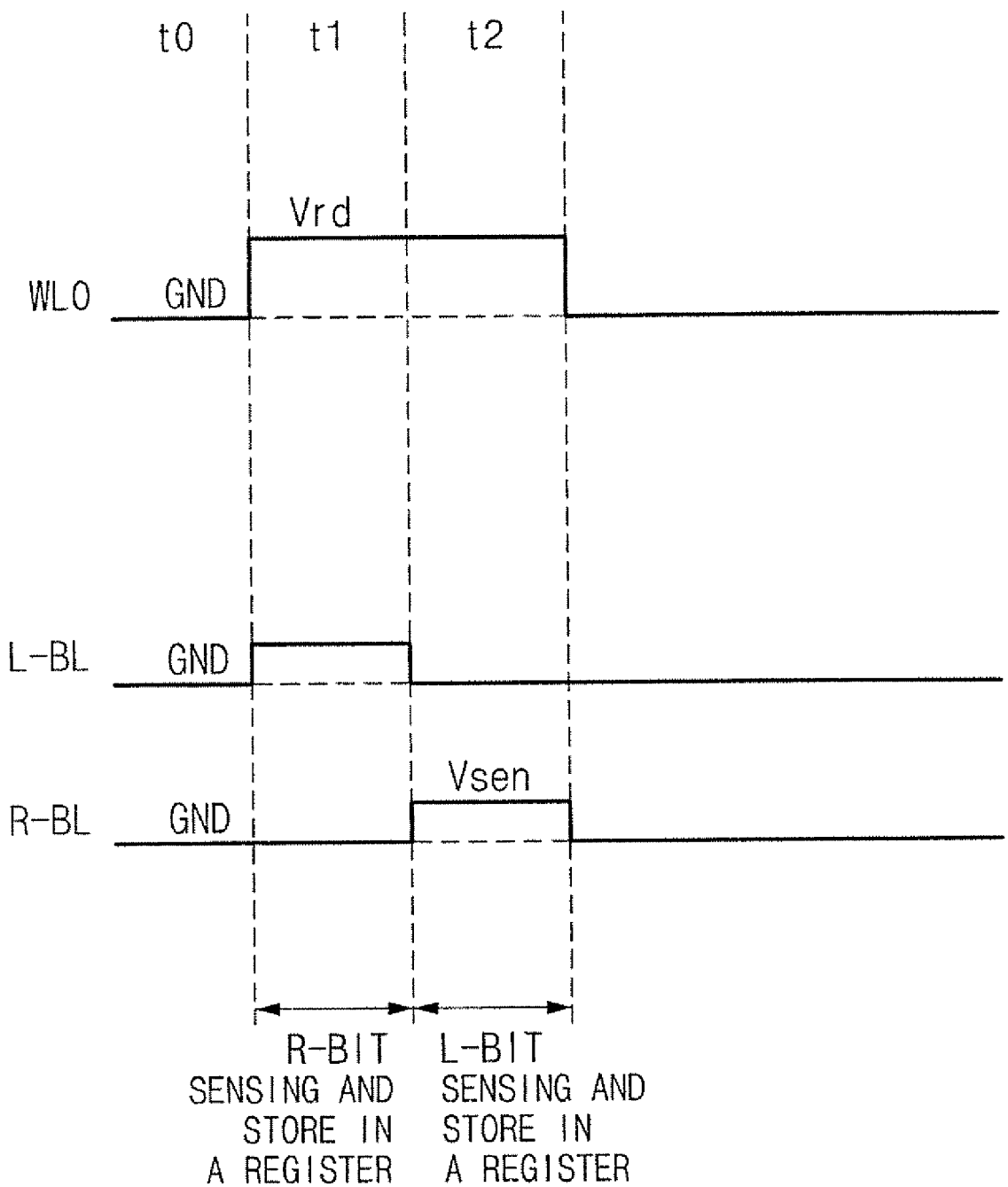
FIG. 35 is a timing diagram illustrating a read operation of a semiconductor memory device consistent with the present invention.

FIG. 35 is a timing diagram illustrating a read operation of a semiconductor memory device according to an embodiment consistent with the present invention.

In period t1, selected word line WL<0> transits from ground GND level into read voltage Vrd level, and bit line L-BL transits from ground GND level into sensing bias voltage Vsen level to sense R-bit data. Sense amplifier S/A senses and amplifies a value of cell sensing current Isen flowing through bit line L-BL, and reads and stores cell data of bit line R-BL in register REG.

In period t2, selected word line WL<0> transits from ground GND level into read voltage Vrd level, and bit line R-BL transits from ground GND level into sensing bias voltage Vsen level to sense L-bit data. Sense amplifier S/A senses and amplifies a value of cell sensing current Isen flowing through bit line R-BL, and reads and stores cell data of bit line L-BL in register REG.

Figure 36:
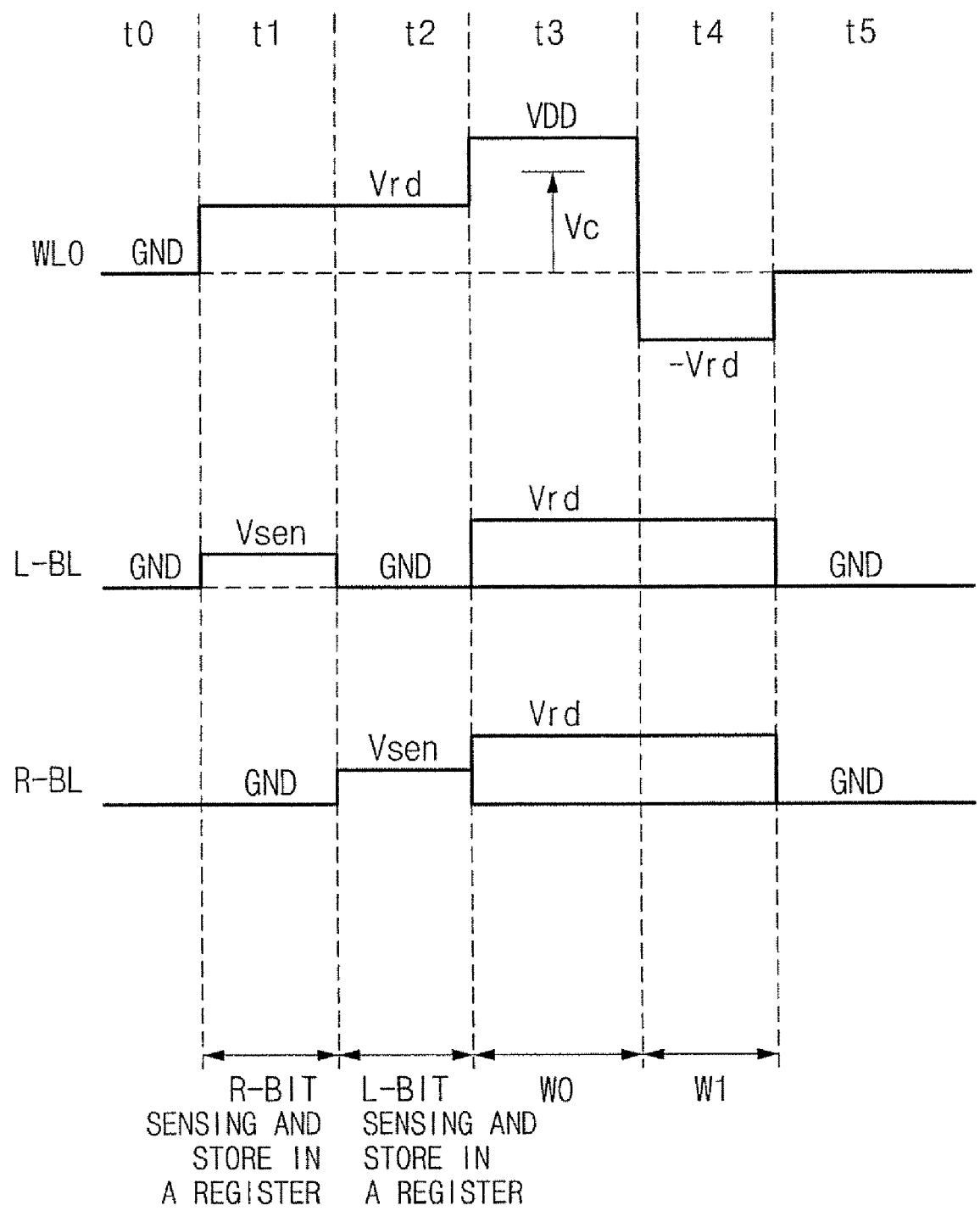
FIG. 36 is a timing diagram illustrating a write operation of a semiconductor memory device consistent with the present invention.

FIG. 36 is a timing diagram illustrating a write/refresh operation of a semiconductor memory device according to an embodiment consistent with the present invention.

In period t1, selected word line WL<0> transits from ground GND level into read voltage Vrd level, and bit line L-BL transits from ground GND level into sensing bias voltage Vsen level. Sense amplifier S/A senses and amplifies a value of cell sensing current Isen flowing through bit line L-BL, and reads and stores cell data of bit line R-BL in register REG.

In period t2, selected word line WL<0> transits from ground GND level into read voltage Vrd level, and bit line R-BL transits from ground GND level into sensing bias voltage Vsen level. Sense amplifier S/A senses and amplifies a value of cell sensing current Isen flowing through bit line R-BL in all cells of a selected row, and reads and stores cell data of bit line L-BL in register REG.

In period t3, selected word line WL<0> transits from read voltage Vrd level into power voltage VDD level, and paired bit lines L-BL, R-BL transit from sensing bias voltage Vsen level into read voltage Vrd or ground voltage GND level. As a result, data '0' can be written in all cells of the selected row.

In period t4, selected word line WL<0> transits from power voltage VDD level into negative read voltage −Vrd level, and paired bit lines L-BL, R-BL are maintained at read voltage Vrd or ground voltage GND level. Data stored in register REG is re-written and restored in memory cell or new externally applied data can be written.

Since data '0' is previously written in period to or t2, data '0' is maintained or the data '1' is written in period t3.

Figure 37:
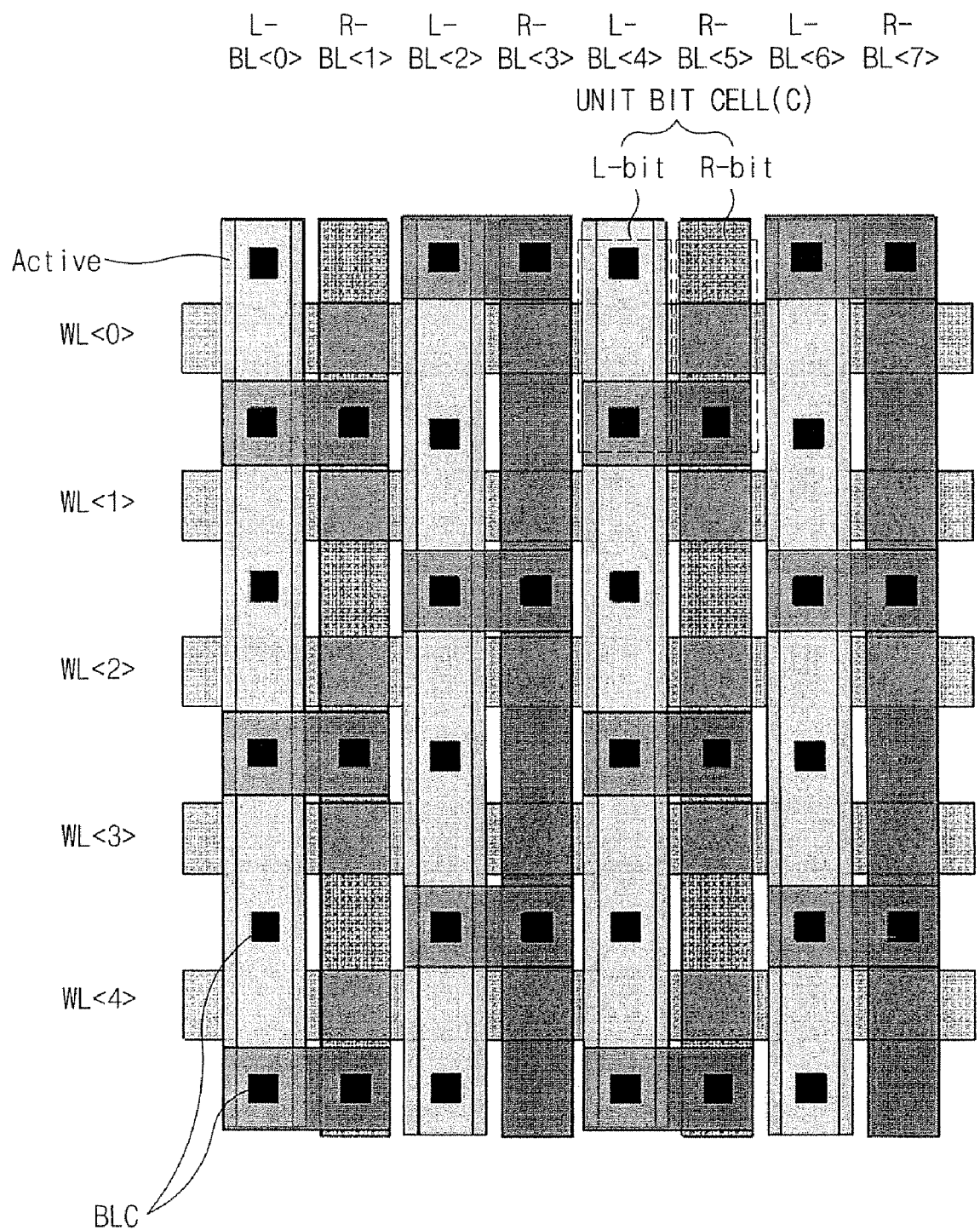
FIG. 37 is a diagram illustrating a cell array of a semiconductor memory device consistent with the present invention.

FIG. 37 is a diagram illustrating a cell array of a semiconductor memory device according to an embodiment consistent with the present invention.

Cell array comprises a plurality of word lines WL arranged in a row direction. A plurality of bit lines BL are arranged perpendicularly to plurality of word lines WL (in a column direction). A plurality of unit cells C are disposed each in a region where plurality of word lines WL are crossed with plurality of bit lines BL.

Odd bit lines BL<1>, BL<3>, BL<5>, BL<7>, BL<9> are configured to store R-bit. Even bit lines BL<0>, BL<2>, BL<4>, BL<6>, BL<8> are configured to store L-bit. Odd bit lines BL<1>, BL<3>, BL<5>, BL<7>, BL<9> are alternately arranged with even bit lines BL<0>, BL<2>, BL<4>, BL<6>, BL<8> each in a different layer. When one unit cell C is connected to two bit lines BL, the area of bit line BL is prevented from being increased.

That is, even bit lines BL<0>, BL<2>, BL<4>, BL<6>, BL<8> are formed in an upper or lower layer of odd bit lines BL<1>, BL<3>, BL<5>, BL<7>, BL<9>. Bit lines BL<1>, BL<3>, BL<5>, BL<7>, BL<9> are formed in an upper or lower layer of bit lines BL<0>, BL<2>, BL<4>, BL<6>, BL<8>.

Unit cell C comprises a word line WL and two bit lines BL arranged in a different layer. For example, unit cell C comprises a word line WL<0>, an even bit line L-BL<2> and an odd bit line R-BL<3> which are connected through a bit line contact BLC.

Figure 38:
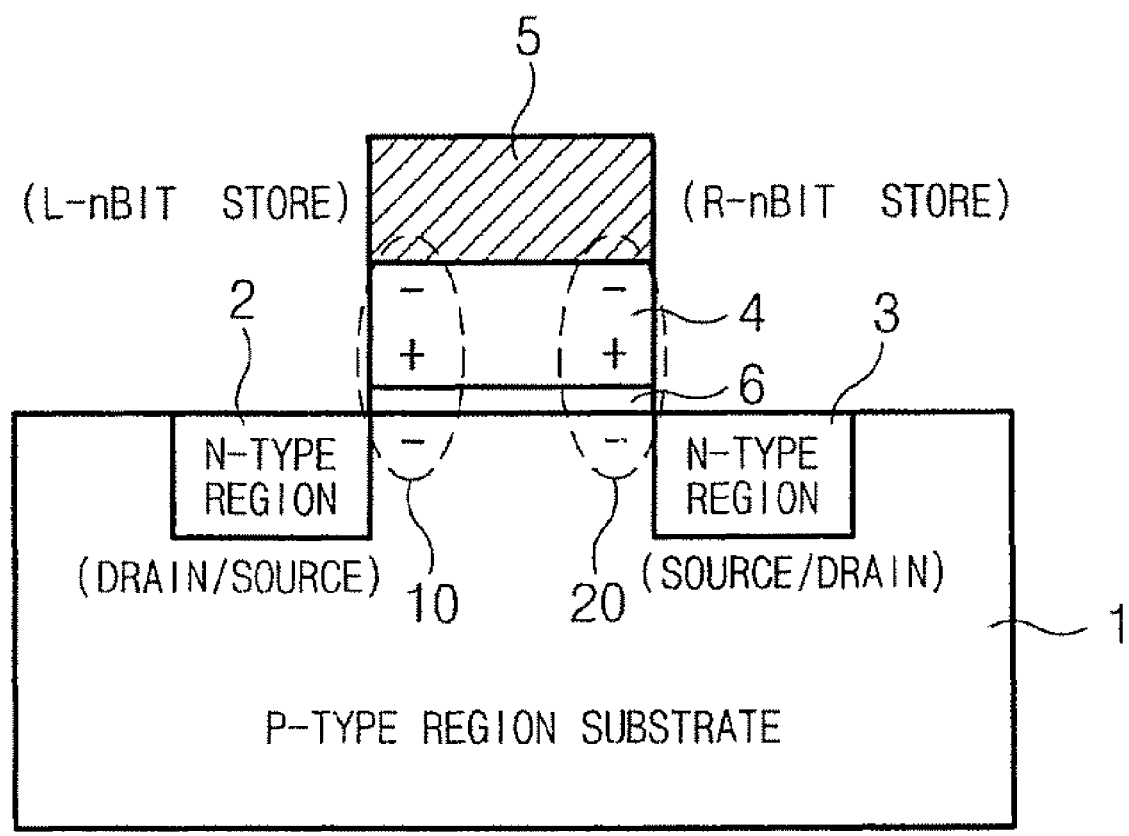
FIG. 38 is a diagram illustrating a semiconductor memory device consistent with the present invention.

FIG. 38 is a diagram illustrating a semiconductor memory device according to an embodiment consistent with the present invention.

A One-Transistor (1-T) Field Effect Transistor (FET) type ferroelectric memory cell comprises a left n bit storage unit 10 for storing n-bit and a right n bit storage unit 20 for storing n bit, so as to store 2n-bit in a unit cell (n is a natural number). Hereinafter, left n bit is referred to as 'L-n bit' and right n bit is referred to as 'R-n bit'.

L-n bit storage unit 10 includes channel region and ferroelectric layer 4 disposed in a left part based on channel region of unit cell, so as to store n-bit data. R-n bit storage unit 20 includes channel region and ferroelectric layer 4 disposed in a right part based on channel region of unit cell, so as to store n-bit data.

When data stored in L-n bit storage unit 10 is read, N-type region 2 serves as a source region, and N-type region 3 serves as a drain region. When the data stored in R-n bit storage unit 20 is read, N-type region 3 serves as a source region, and N-type region 2 serves a drain region. One of N-type regions 2, 3 may be a drain region or a source region. In the write mode of memory cell, data can be written simultaneously in L-n bit storage unit 10 and R-n bit storage unit 20. In the read mode, data stored in L-n bit storage unit 10 and R-n bit storage unit 20 cannot be read simultaneously.

L-n bit storage unit 10 sets a region where the polarity of ferroelectric layer 4 is changed to be an effective data storage region by a voltage applied between gate region (channel region) and N-type region 2 that serves as a source region. R-n bit storage unit 20 sets a region where the polarity of ferroelectric layer 4 is changed to be an effective data storage region by a voltage applied between gate region (channel region) and N-type region 3 that serves as a source region.

Intended data is not read or written but ineffective data that do not affect read/write operations of data is stored because a weak channel bias voltage is applied to a region between L-n bit storage unit 10 and R-n bit storage unit 20. Width of storage region corresponding to L-n bit storage unit 10 and R-n bit storage unit 20 can be changed depending on bias voltage applied to drain/source regions.

Figure 39:
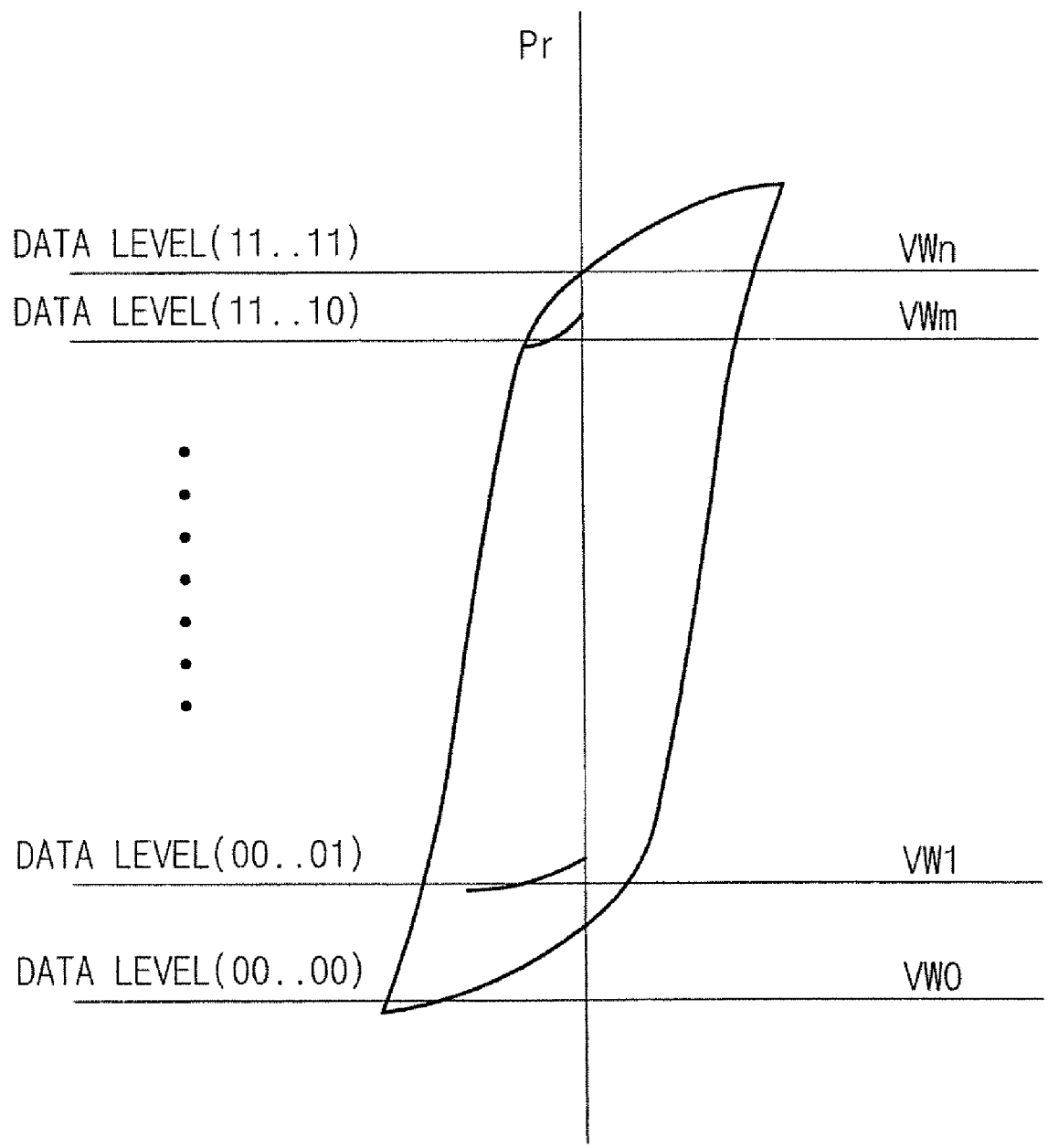
FIG. 39 is a diagram illustrating a write level of a n-bit storage cell of a semiconductor memory device consistent with the present invention.

FIG. 39 is a diagram illustrating a write level of a n-bit storage cell of a semiconductor memory device according to an embodiment consistent with the present invention.

2n write voltage levels are required to store n-bit data. That is, write voltages VW0, VW1, . . . , VWm, VWn are used to store data "00 . . . 00", "00 . . . 01", . . . , "11 . . . 00", "11 . . . 11".

Figure 40:
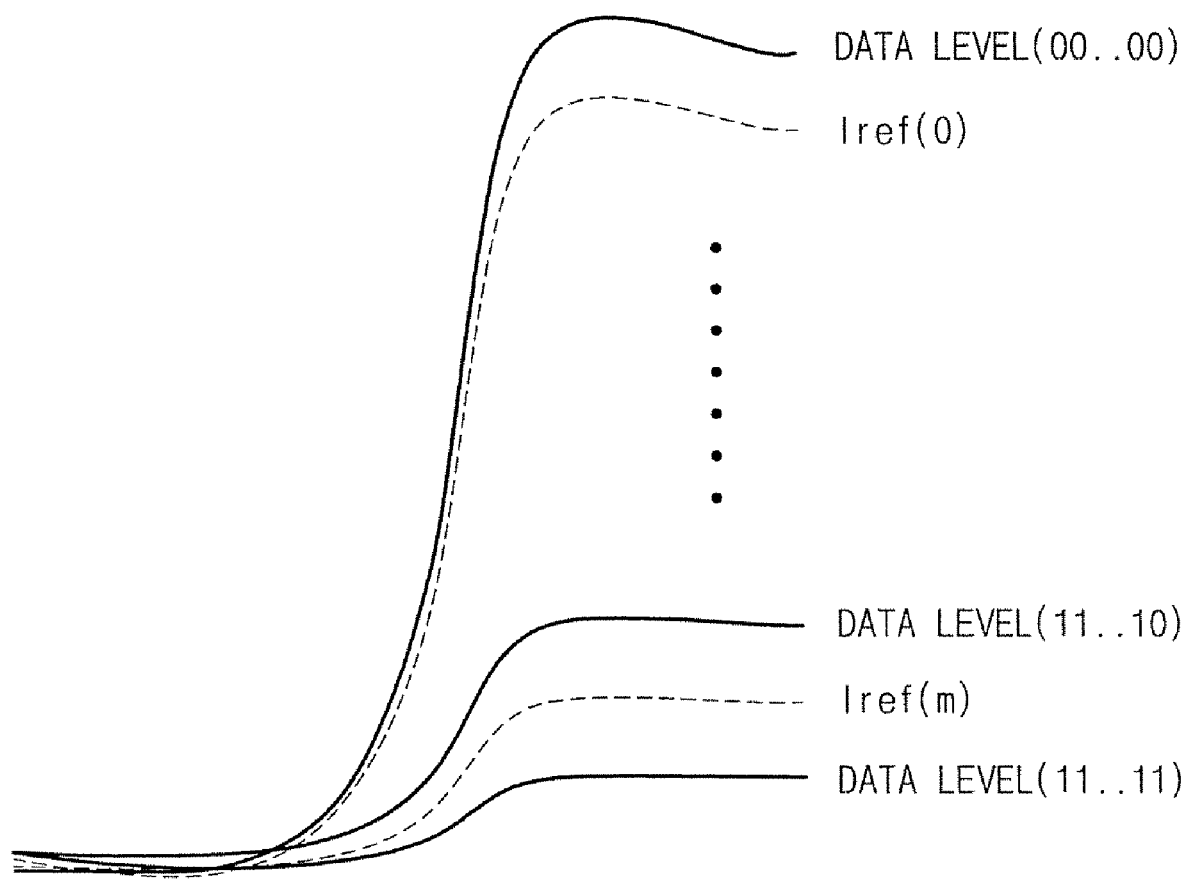
FIG. 40 is a diagram illustrating a sensing current level of a n-bit storage cell of a semiconductor memory device consistent with the present invention.

FIG. 40 is a diagram illustrating a sensing current level of a n-bit storage cell of a semiconductor memory device according to an embodiment consistent with the present invention.

A plurality of reference level currents Iref(0)~Iref(m) are required to sense n-bit data "00 . . . 00", "00 . . . 01", . . . , "11 . . . 00", "11 . . . 11". For example, when data '3' is stored in memory cell, 8 different sensing voltages are applied to bit lines (or sub bit lines) depending on levels of cell data stored in memory cell.

Voltages sensed through bit lines are divided into 2n data levels in a main bit line, such as "111", "110", . . . , "001", "000". 2n levels are compared and amplified with 2n−1 reference levels.

Figure 41:
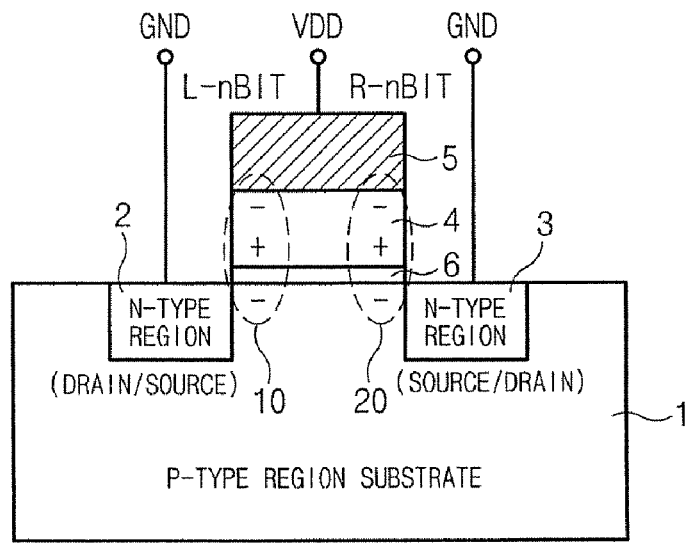
FIG. 41 is a diagram illustrating a low data write operation of a semiconductor memory device consistent with the present invention.

FIG. 41 is a diagram illustrating a low data write operation of a semiconductor memory device according to an embodiment consistent with the present invention.

Power voltage VDD is applied to word line 5 in order to store data '0' in L-n bit storage unit 10 and R-n bit storage unit 20. Ground voltage GND is applied to N-type drain/source regions 2, 3. A negative charge is induced to channel region depending on the polarity of ferroelectric layer 4, so as to write data '0'.

Figure 42:
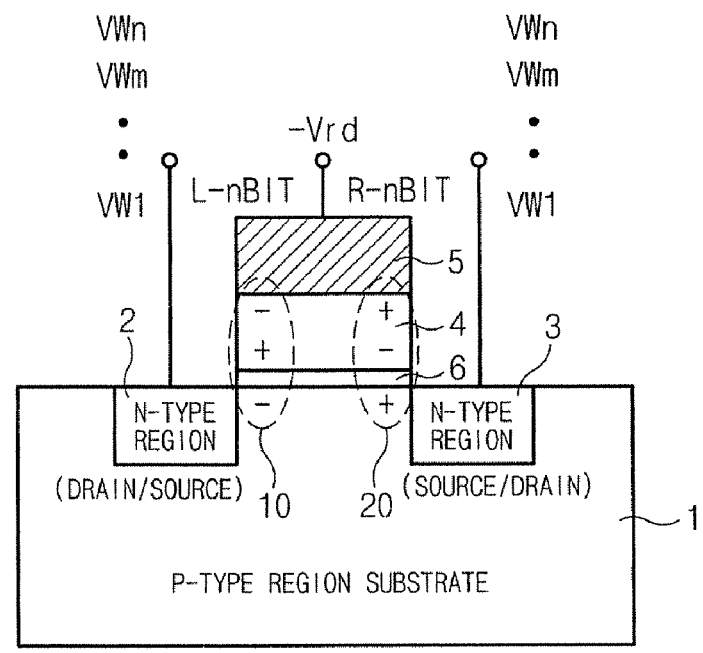
FIG. 42 is a diagram illustrating a 2n-bit write operation of a semiconductor memory device consistent with the present invention.

FIG. 42 is a diagram illustrating a 2n-bit write operation of a semiconductor memory device according to an embodiment consistent with the present invention.

Negative read voltage –Vrd is applied to word line 5 in order to store n-bit data in L-n bit storage unit 10 and R-n bit storage unit 20. One of n write voltages VW1, . . . , VWm, VWn is applied to N-type drain/source regions 2, 3.

Figure 43:
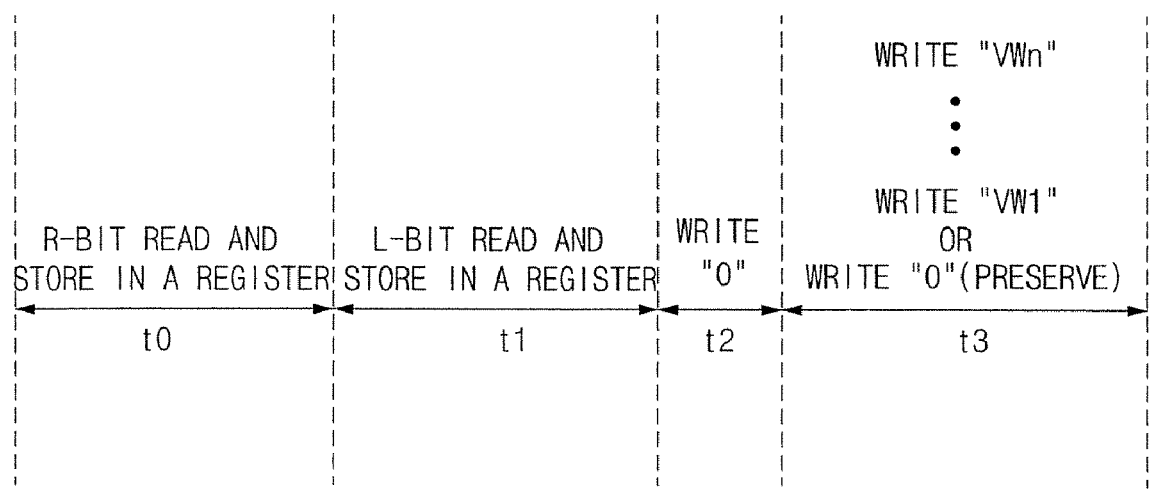
FIG. 43 is a timing diagram illustrating a write cycle operation of a semiconductor memory device consistent with the present invention.

FIG. 43 is a timing diagram illustrating a write cycle operation of a semiconductor memory device according to an embodiment consistent with the present invention.

In a period t0, the R-n bit data is read and amplified in all cells of selected row address, and stored in register. In a period t1, L-n bit data is read and amplified in all cells of selected row address, and stored in register.

In a period t2, since data "0" is written in all memories, it is not clear which data is stored in existing memory cell. As a result, in order to know which data is stored in existing memory cell, data "0" is stored in register before data "0" is written in memory cell.

In period t2, data "0" is written in all cells of selected row address. In a period t3, data stored in register in a refresh mode is re-written and restored in memory cell, and new external data are written in cells. In period t2, data "0" is preserved because data "0" is previously written in period t1, and new 2-n bit data is written.

Figure 44:
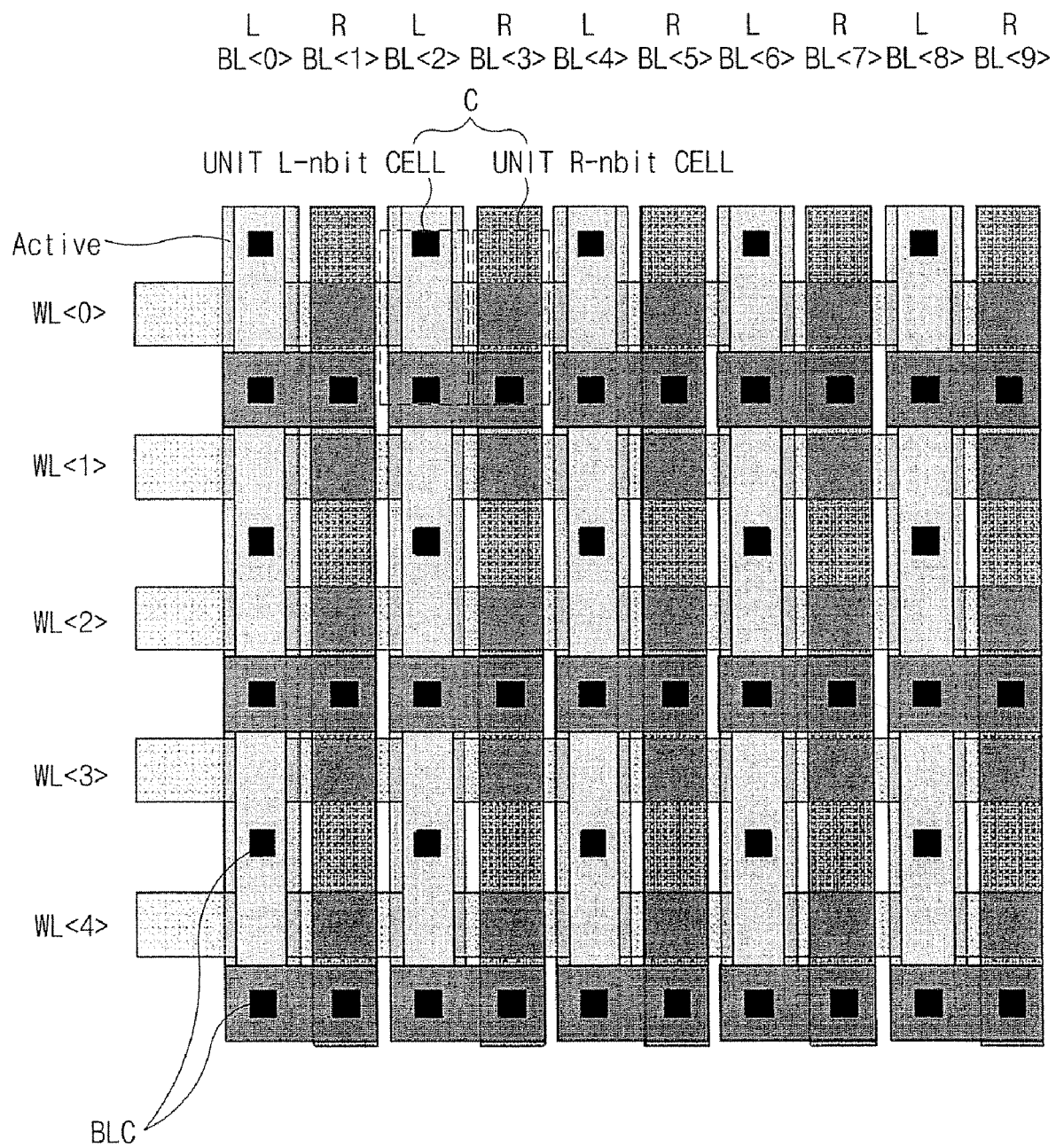
FIG. 44 is a plane diagram illustrating a cell array of a semiconductor memory device consistent with the present invention.

FIG. 44 is a plane diagram illustrating a cell array of a semiconductor memory device according to an embodiment consistent with the present invention.

Cell array comprises a plurality of word lines WL arranged in a row direction. A plurality of bit lines BL are arranged perpendicularly to plurality of word lines WL (in a column direction). A plurality of unit n-bit cells C are disposed each in a region where plurality of word lines WL are crossed with plurality of bit lines BL.

Odd bit lines BL<1>, BL<3>, BL<5>, BL<7>, BL<9> are configured to store R-n bit. Even bit lines BL<0>, BL<2>, BL<4>, BL<6>, BL<8> are configured to store L-n bit. Odd bit lines BL<1>, BL<3>, BL<5>, BL<7>, BL<9> are alternately arranged with even bit lines BL<0>, BL<2>, BL<4>, BL<6>, BL<8> each in a different layer. When one unit cell C is connected to two bit lines BL, the area of bit line BL is prevented from being increased.

That is, even bit lines BL<0>, BL<2>, BL<4>, BL<6>, BL<8> are formed in an upper or lower layer of odd bit lines BL<1>, BL<3>, BL<5>, BL<7>, BL<9>. Odd bit lines BL<1>, BL<3>, BL<5>, BL<7>, BL<9> are formed in an upper or lower layer of even bit lines BL<0>, BL<2>, BL<4>, BL<6>, BL<8>.

Unit n-bit cell C comprises a word line WL and two bit lines BL arranged in a different layer. For example, unit cell C comprises a word line WL<0>, an even bit line L-BL<2> and an odd bit line R-BL<3> which are connected through a bit line contact BLC.

Figure 45:
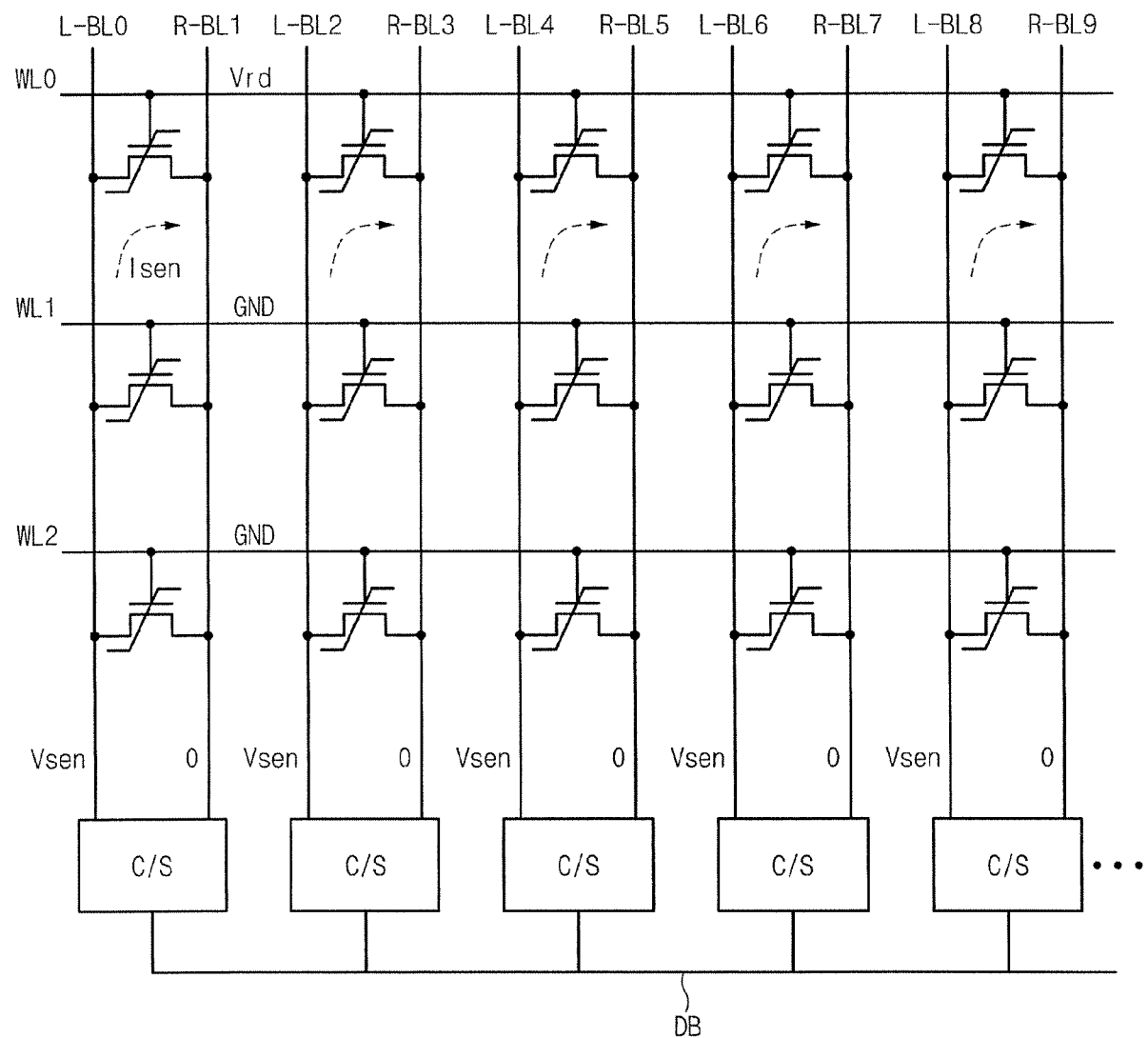
FIG. 45 is a diagram illustrating a cell array structure and a right n bit data read operation of a semiconductor memory device consistent with the present invention.

FIG. 45 is a diagram illustrating a cell array structure and a R-n bit data read operation of a semiconductor memory device according to an embodiment consistent with the present invention.

A plurality of word lines WL are arranged in a row direction with a given interval. A plurality of even/odd bit lines L-BL, R-BL are arranged perpendicularly to plurality of word lines WL, that is, in a column direction. A plurality of unit n-bit cells C are located each in a region where the plurality of word lines WL are crossed with the plurality of even/odd bit lines L-BL, R-BL.

Unit cell C having a 1-T FET structure is connected to word line WL<0> and even/odd bite lines L-BL<0>, R-BL<1> formed in a different layer. Although word line WL<0> and even/odd bite lines L-BL<0>, R-BL<1> are exemplified in the embodiment consistent with the present invention, present invention can be applied to rest word lines WL<1>, WL<2>, . . . and rest bit line pairs L-BL<2>, R-BL<3>, . . . .

Unit n-bit cell C has a drain and a source connected between paired bit lines L-BL<0>, R-BL<1>, and a gate connected to word line WL<0>. Each column selecting switch C/S is connected to paired bit lines L-BL<0>, R-BL<1> arranged in a different layer. That is, each bit line BL is connected one by one to column selecting switch C/S that is connected to a data bus DB. A signal is transmitted between bit line BL and data bus DB depending on activation of column selecting switch C/S.

Read voltage Vrd is applied to the selected word line WL<0> when R-n bit data is read, and ground voltage GND is applied to unselected word lines WL<1>, WL<2>. Sensing bias voltage Vsen for sensing a sensing current of unit n-bit cell C is applied to bit line L-BL<0> connected to unit n-bit cell C. Ground voltage GND is applied to bit line R-BL<1>.

Cell sensing current Isen flows depending on a storage state of cell data. As a result, currents flowing in paired bit lines L-BL<0>, R-BL<1> becomes different depending on the polarity of ferroelectric layer 4 so as to read cell data stored in unit cell C.

That is, sense amplifier S/A senses a value of cell sensing current Isen flowing in bit line R-BL<1> to read R-n bit data when read voltage Vrd is applied to word line WL<0>, sensing bias voltage Vsen is applied to bit line L-BL<0>, and ground voltage is applied to bit line R-BL<1>.

Figure 46:
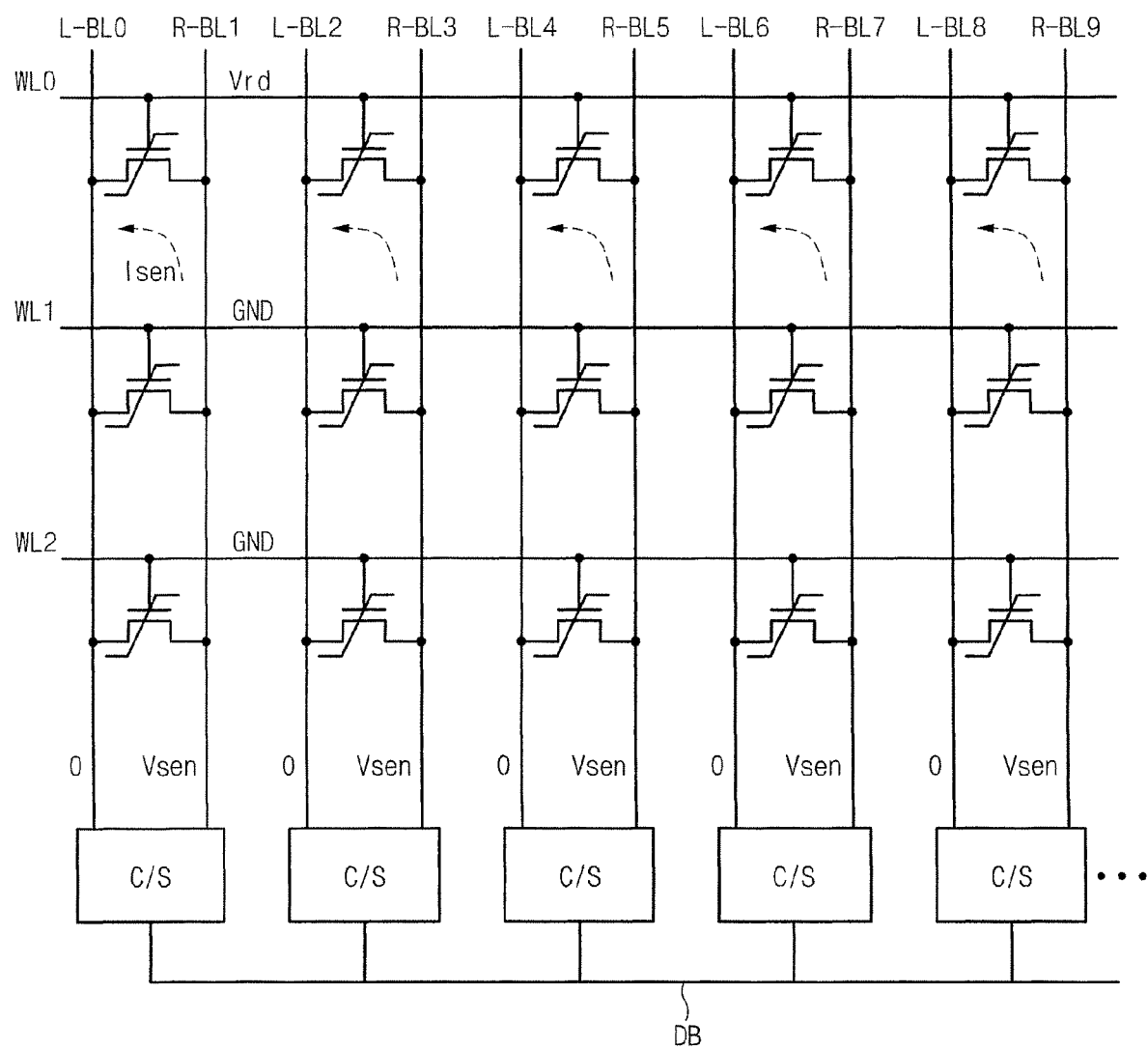
FIG. 46 is a diagram illustrating a cell array structure and a left n bit data read operation of a semiconductor memory device consistent with the present invention.

FIG. 46 is a diagram illustrating a cell array structure and a L-n bit data read operation of a semiconductor memory device according to an embodiment consistent with the present invention.

Read voltage Vrd is applied to selected word line WL<0> when L-n bit data is read, and ground voltage GND is applied to unselected word lines WL<1>, WL<2>. Ground voltage GND is applied to bit line L-BL<0> connected to unit n-bit cell C. Sensing bias voltage Vsen for sensing a sensing current of unit n-bit cell C is applied to bit line R-BL<1>.

Cell sensing current Isen flows depending on a storage state of cell data. As a result, current flowing in the paired bit lines L-BL<0>, R-BL<1> becomes different depending on the polarity of ferroelectric layer 4 so as to read cell data stored in unit n-bit cell C.

That is, sense amplifier S/A senses a value of cell sensing current Isen flowing in bit line L-BL<0> to read L-n bit data when read voltage Vrd is applied to word line WL<0>, ground voltage is applied to bit line L-BL<0>, and sensing bias voltage Vsen is applied to bit line R-BL<1>.

Figure 47:
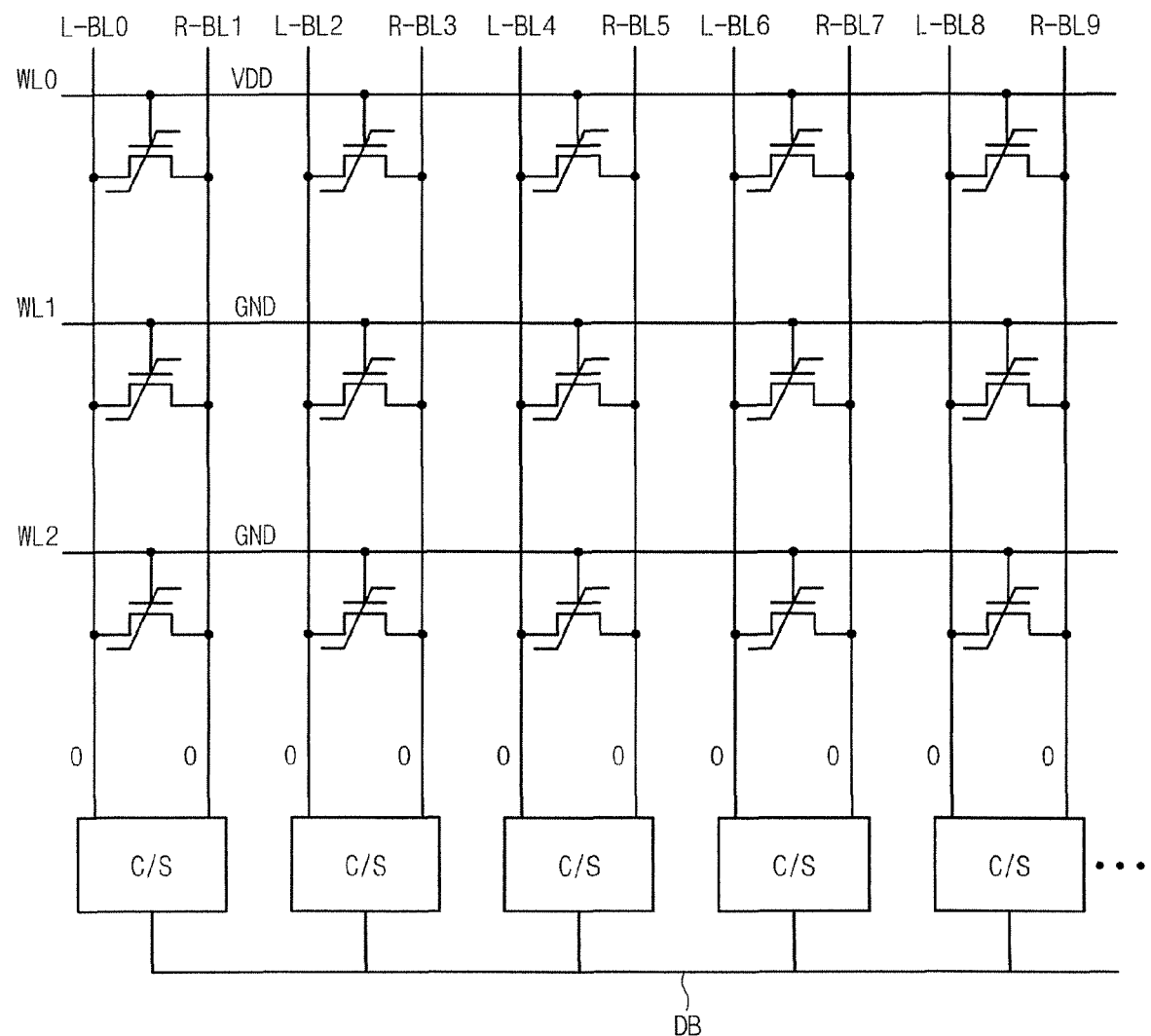
FIG. 47 is a diagram illustrating a low data write operation of a semiconductor memory device consistent with the present invention.

FIG. 47 is a diagram illustrating a low data write operation of a semiconductor memory device according to an embodiment consistent with the present invention.

When data '0' is written, power voltage VDD over a threshold voltage Vc where a ferroelectric polarity characteristic is changed is applied to selected word line WL<0>, and ground voltage GND is applied to unselected word lines WL<1>, WL<2>. Ground voltage is applied to all paired bit lines L-BL, R-BL connected to unit n-bit cell C.

Read voltage Vrd is smaller than threshold voltage Vc, and power voltage VDD is larger than threshold voltage Vc. Sensing bias voltage Vsen is smaller than read voltage Vrd.

A ferroelectric material is polarized while channel region of memory cell is turned on. As a result, data '0000 . . . ' is written in memory cell. That is, while power voltage VDD is applied to word line WL<0> and ground voltage is applied to paired bit lines L-BL, R-BL, channel region is turned on depending on polarization of ferroelectric layer 4 so that data '0000 . . . ' can be written in memory cell.

Figure 48:
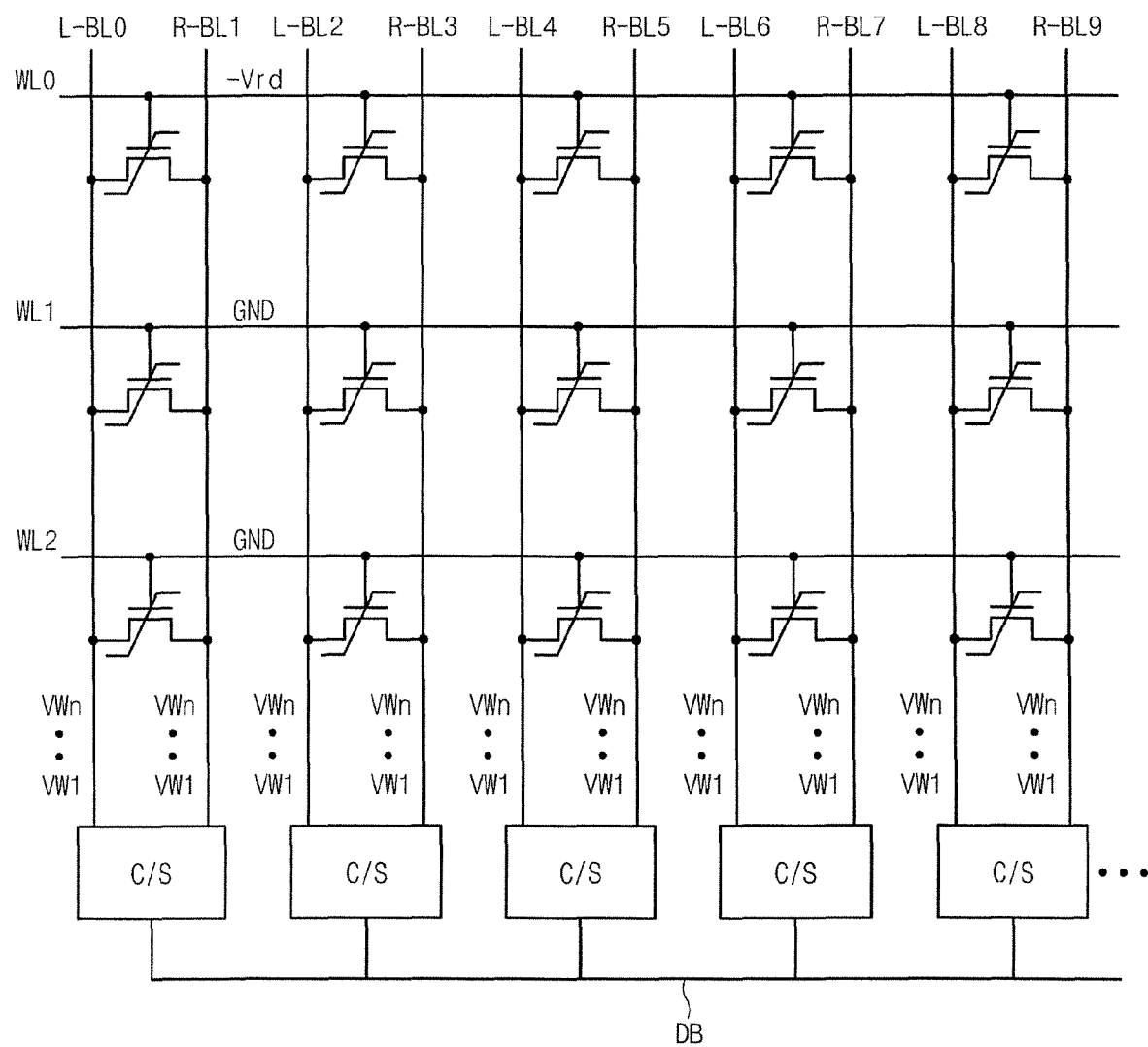
FIG. 48 is a diagram illustrating a 2n-bit data write operation of a semiconductor memory device consistent with the present invention.

FIG. 48 is a diagram illustrating a 2n-bit data write operation of a semiconductor memory device according to an embodiment consistent with the present invention.

In write mode of 2n-bit data, negative read voltage −Vrd is applied to selected word line WL<0>, and ground voltage GND is applied to unselected word lines WL<1>, WL<2>. Negative read voltage −Vrd has an absolute value having the same size as that of read voltage Vrd, and absolute value is a voltage value having an opposite phase. One of the write voltages VW1 VWn is applied to paired bit lines L-BL, R-BL connected to unit n-bit cell C.

One of write voltages VW1~VWn is applied to N-type drain/source regions 2, 3 of the paired bit lines L-BL, R-BL to store desired data. For example, a voltage below threshold voltage Vc is applied to the even bit line L-BL so that data '0' is preserved in L-n bit storage unit 10 of memory cell, and data '1' is written in R-n bit storage unit 20.

Figure 49:
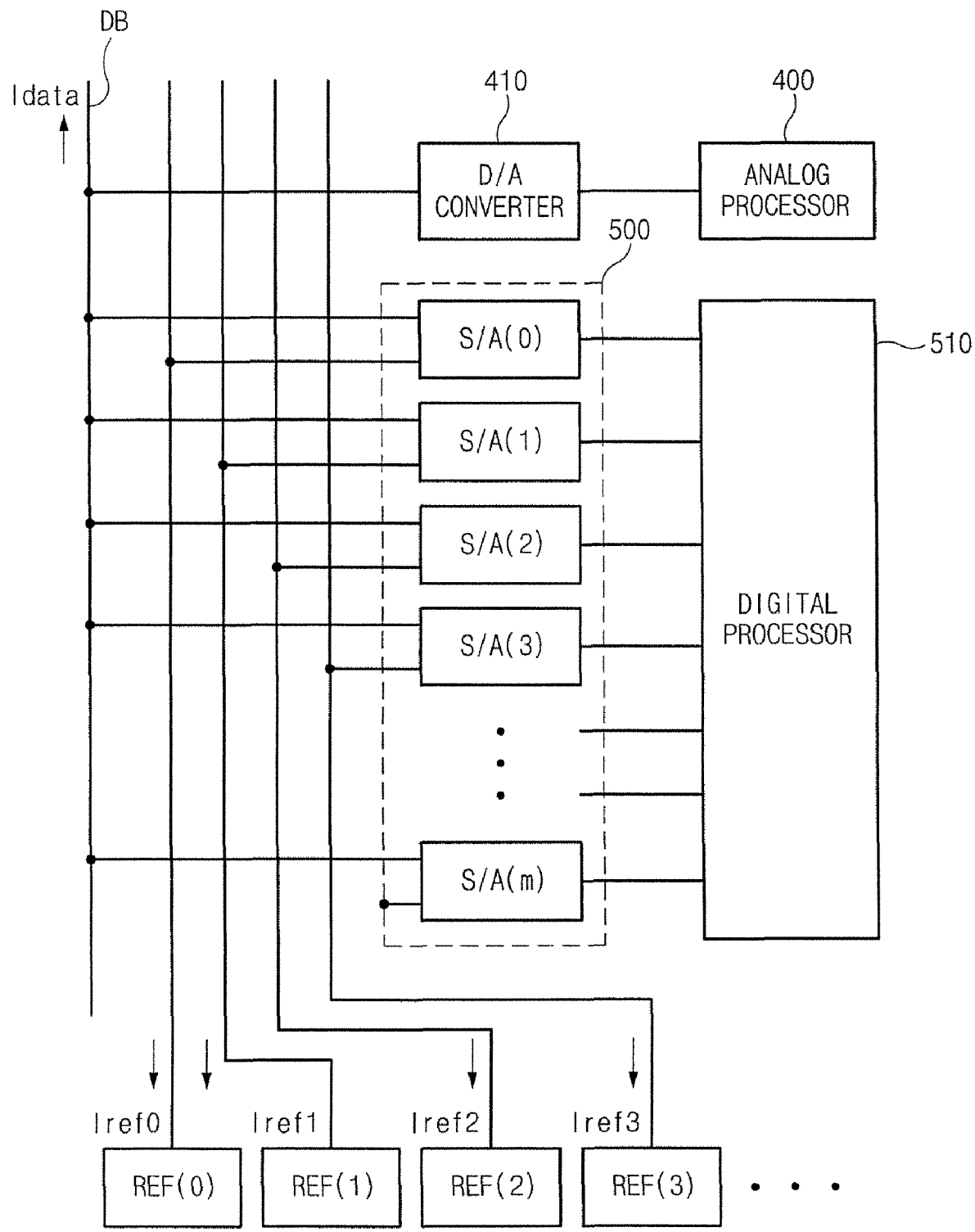
FIG. 49 is a diagram illustrating a current sense amplifier array and a reference unit of a semiconductor memory device consistent with the present invention.

FIG. 49 is a diagram illustrating a current sense amplifier array and a reference unit of a semiconductor memory device according to an embodiment consistent with the present invention.

Semiconductor memory device comprises an analog processor 400, a Digital/Analog (D/A) converter 410, a sense amplifier array 500, a digital processor 510 and referent units REF(0)~REF(n). A write voltage driving unit includes analog processor 400 and D/A converter 410. A data sensing unit includes sense amplifier array 500, digital processor 510 and referent units REF(0)~REF(n).

Analog processor 400 outputs an analog signal into D/A converter 410. D/A converter 410 converts analog signal received from analog processor 400 into a digital signal so as to generate 2n write (restoring) voltages VW0~VWn into data bus DB.

Sense amplifier array 500 includes 2n−1 sense amplifiers S/A. The plurality of sense amplifiers S/A compare and amplify a data current Idata value applied from data bus DB with reference level currents Iref(0)~Iref(m) applied from reference units REF(0)~REF(n).

Sense amplifier S/A requires the 2n−1 reference level currents Iref(0)~Iref(m) for sensing 2n data in read mode. As a result, sense amplifiers S/A are connected one by one to 2n−1 reference units REF(0)~REF(n). Digital processor 510 outputs digital signal received from sense amplifier array 500.

Figure 50:
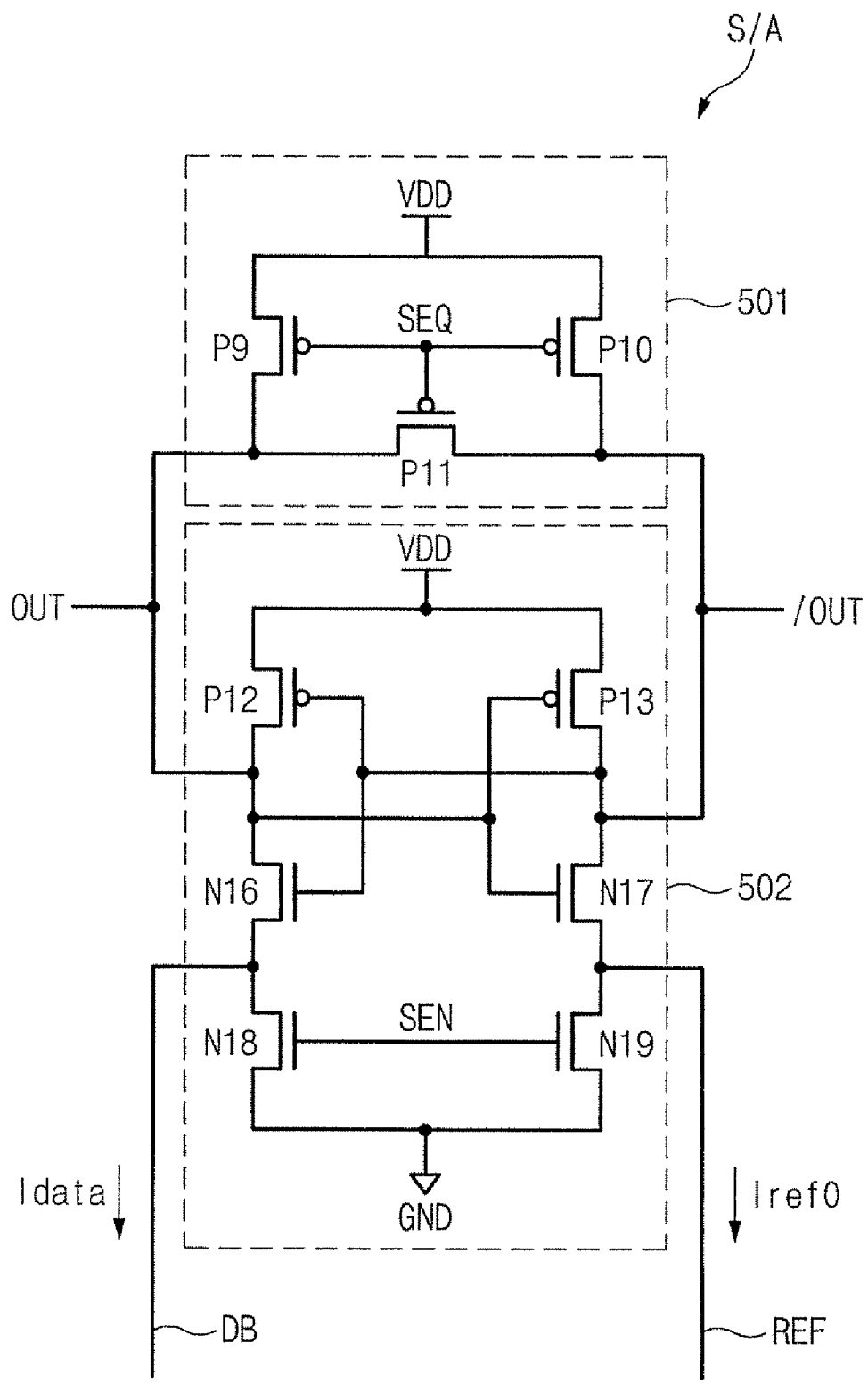
FIG. 50 is a circuit diagram illustrating a sense amplifier of FIG. 49 consistent with the present invention.

FIG. 50 is a circuit diagram illustrating sense amplifier S/A of FIG. 49.

Sense amplifier S/A includes a precharge unit 501 and an amplifying unit 502. Precharge unit 501 includes PMOS transistors P9~P11 that have a common gate to receive an equalizing signal SEQ. PMOS transistors P9, P10 are connected between power voltage VDD terminal and output terminals OUT, /OUT. PMOS transistor P11 is connected between output terminals OUT, /OUT. Precharge unit 501 equalizes output terminals OUT, /OUT when equalizing signal SEQ is activated.

Amplifying unit 502 includes PMOS transistors P12, P13 and NMOS transistors N16~N19 which form a cross-coupled latch amplifier. PMOS transistor P12 and NMOS transistors N16, N18 are connected serially between power voltage VDD terminal and ground voltage terminal GND. PMOS transistor P13 and NMOS transistors N17, N19 are connected serially between power voltage VDD terminal and ground voltage terminal GND.

A common gate of PMOS transistor 12 and NMOS transistor N16 is connected to output terminal /OUT. A common gate of PMOS transistor P13 and NMOS transistor N17 is connected to output terminal OUT.

NMOS transistors N18, N19 has a common gate to receive sense amplifier enable signal SEN. Data current Idata outputted from sense amplifier S/A is applied to data bus DB. Reference level current Iref outputted from sense amplifier S/A is applied to reference unit REF.

Figure 51:
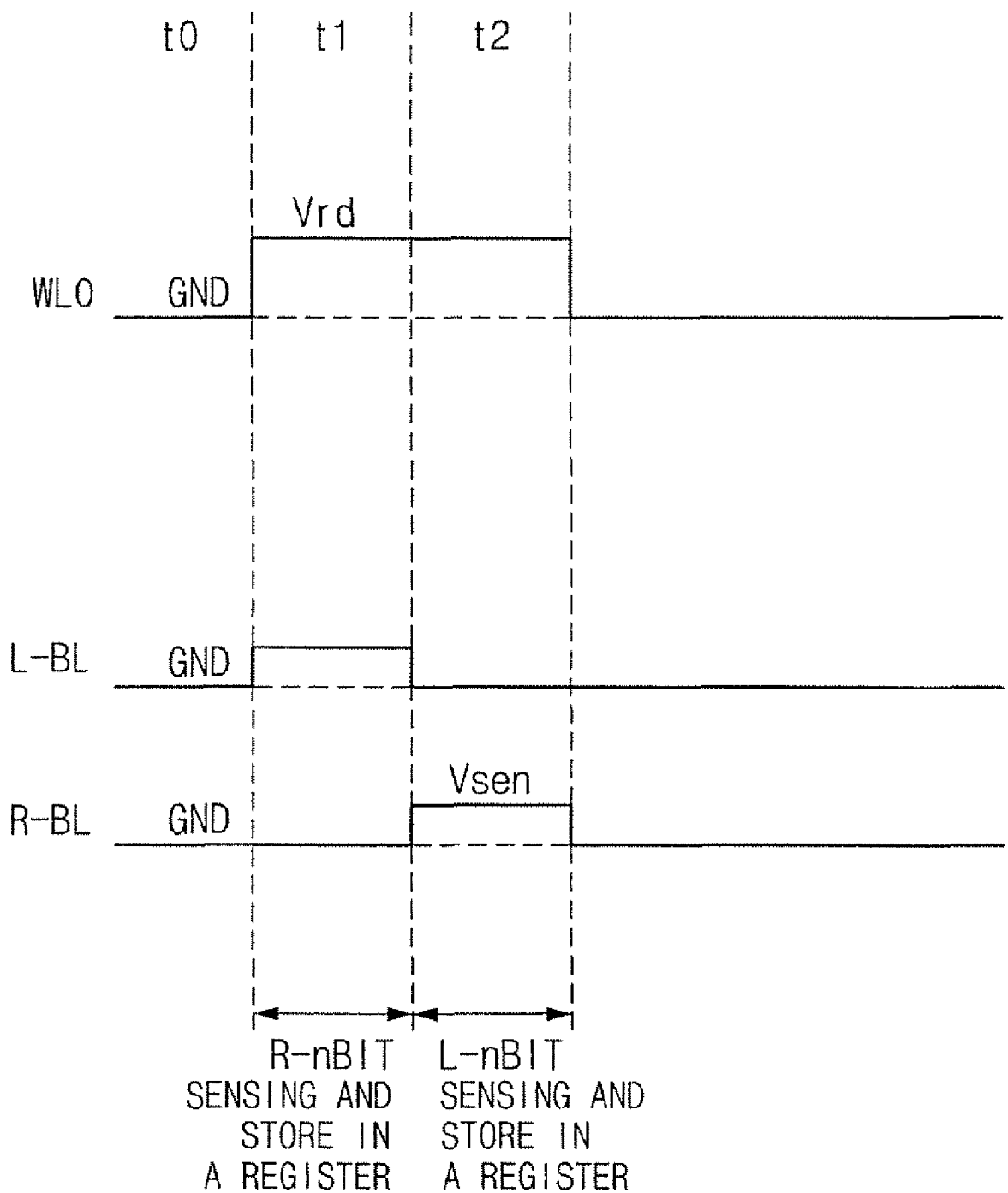
FIG. 51 is a timing diagram illustrating a read operation of a semiconductor memory device consistent with the present invention.

FIG. 51 is a timing diagram illustrating a read operation of a semiconductor memory device according to an embodiment consistent with the present invention.

In period t1, selected word line WL<0> transits from ground GND level into read voltage Vrd level, and bit line L-BL transits from ground GND level into sensing bias voltage Vsen level to sense R-nbit data. Sense amplifier S/A senses and amplifies a value of cell sensing voltage Isen flowing through bit line L-BL, and reads and stores cell data of bit line R-BL in register REG.

In period t2, selected word line WL<0> transits from ground GND level into read voltage Vrd level, and bit line R-BL transits from ground GND level into sensing bias voltage Vsen level to sense L-n bit data. Sense amplifier S/A senses and amplifies a value of cell sensing voltage Isen flowing through bit line R-BL, and reads and stores cell data of bit line L-BL in register REG.

Figure 52:
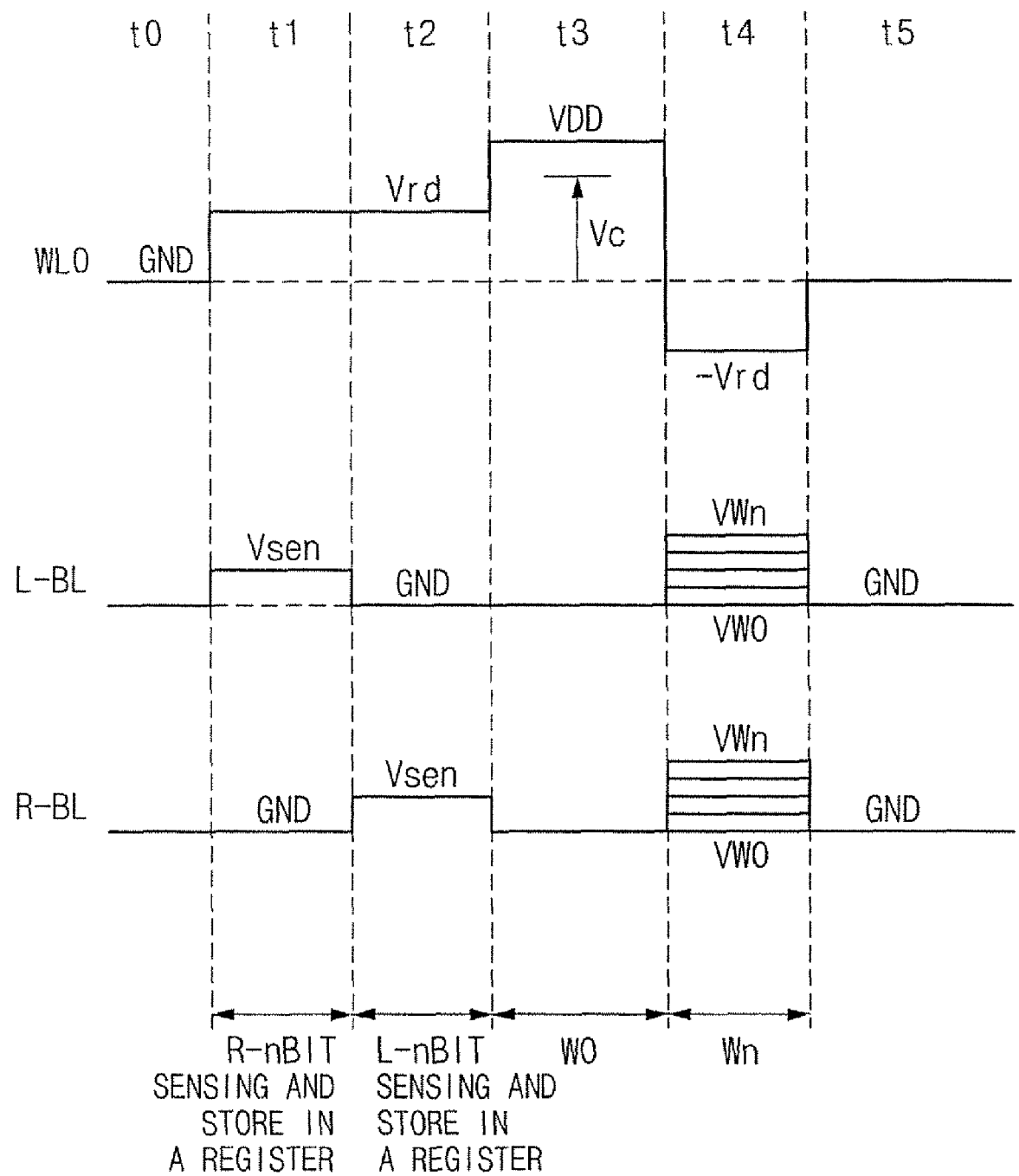
FIG. 52 is a timing diagram illustrating a write operation of a semiconductor memory device consistent with the present invention.

FIG. 52 is a timing diagram illustrating a write/refresh operation of a semiconductor memory device according to an embodiment consistent with the present invention.

In period t1, selected word line WL<0> transits from ground GND level into read voltage Vrd level, and bit line L-BL transits from ground GND level into sensing bias voltage Vsen level. Sense amplifier S/A senses and amplifies a value of cell sensing voltage Isen flowing through bit line L-BL, in all cells of selected row and reads and stores cell data of bit line R-BL in register REG.

In period t2, selected word line WL<0> transits from ground GND level into read voltage Vrd level, and bit line R-BL transits from ground GND level into sensing bias voltage Vsen level. Sense amplifier S/A senses and amplifies a value of cell sensing voltage Isen flowing through bit line R-BL in all cells of selected row and reads and stores cell data of bit line L-BL in register REG.

In period t3, word line WL<0> transits from read voltage Vrd level into power voltage VDD level, and bit line L-BL or bit line R-BL transit from sensing bias voltage Vsen level into read voltage Vrd or ground voltage GND level. As a result, data '0' can be written in all cells of selected row.

In period t4, selected word line WL<0> transits from power voltage VDD level into negative read voltage −Vrd level, and bit lines L-BL or bit line R-BL are maintained at ground voltage GND level. Data stored in register REG is re-written and restored in memory cell or new externally applied data can be written.

Since data '0' is previously written in period t3, data '0' is maintained in period t4, and 2n-bit data are written depending on write voltages VW1~VWn.

Figure 53:
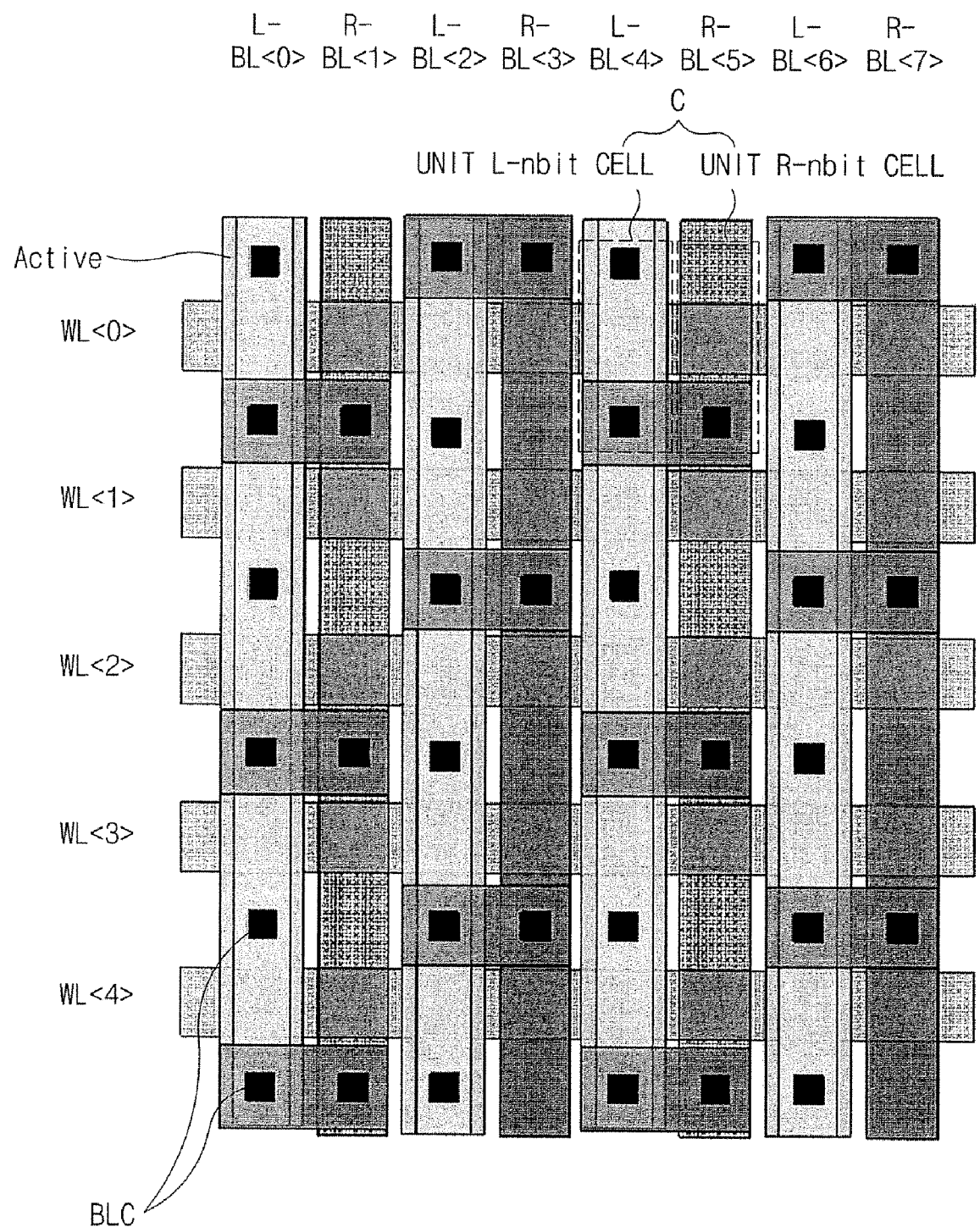
FIG. 53 is a diagram illustrating a cell array of a semiconductor memory device consistent with the present invention.

FIG. 53 is a diagram illustrating a cell array of a semiconductor memory device according to an embodiment consistent with the present invention.

Cell array comprises a plurality of word lines WL arranged in a row direction. A plurality of bit lines BL are arranged perpendicularly to plurality of word lines WL (in a column direction). A plurality of unit cells C are disposed each in a region where plurality of word lines WL are crossed with plurality of bit lines BL.

Odd bit lines BL<1>, BL<3>, BL<5>, BL<7>, BL<9> are configured to store R-bit. Even bit lines BL<0>, BL<2>, BL<4>, BL<6>, BL<8> are configured to store L-bit. The odd bit lines BL<1>, BL<3>, BL<5>, BL<7>, BL<9> are alternately arranged with even bit lines BL<0>, BL<2>, BL<4>, BL<6>, BL<8> each in a different layer. When one unit cell C is connected to two bit lines BL, the area of bit line BL is prevented from being increased. That is, even bit lines BL<0>, BL<2>, BL<4>, BL<6>, BL<8> are formed in an upper or lower layer of odd bit lines BL<1>, BL<3>, BL<5>, BL<7>, BL<9>. Odd bit lines BL<1>, BL<3>, BL<5>, BL<7>, BL<9> are formed in an upper or lower layer of even bit lines BL<0>, BL<2>, BL<4>, BL<6>, BL<8>.

Unit n-bit cell C comprises a word line WL and two bit lines BL arranged in a different layer. For example, unit cell C comprises a word line WL<0>, an even bit line L-BL<2> and an odd bit line R-BL<3> which are connected through a bit line contact BLC.

As described above, according to an embodiment consistent with the present invention, a 1T-FET type ferroelectric memory cell having a nonvolatile characteristic applied in a DRAM performs a refresh operation with a given cycle to restore degraded cell data and improves a data retention characteristic without destroying refresh information even when a power source is off.

1T-FET type ferroelectric memory cell having a nonvolatile characteristic applied in a DRAM stores a dual bit in a unit cell, thereby reducing a cell area.

1 T-FET type ferroelectric memory cell having a nonvolatile characteristic applied in a DRAM stores a 2n-bit in a unit cell, thereby reducing a cell area.

1T-FET type ferroelectric memory cell does not perform a refresh operation frequently with a data retention time including on/off times of power source, thereby reducing power consumption and improving performance.

1T-FET type ferroelectric memory cell performs a refresh operation depending on parameter information stored in a nonvolatile register so as to maintain refresh information even when a power source is off.

The embodiments above consistent with the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor memory device comprising:
a P-type channel region, a N-type drain region and an N-type source region formed in a substrate;
a ferroelectric layer formed over the P-type channel region; and
a word line formed over the ferroelectric layer,
wherein a data read operation is performed by a cell sensing current value differentiated depending on the polarity state of the ferroelectric layer while a different channel resistance is induced to the P-type channel region depending on a polarity state of the ferroelectric layer, a positive read voltage is applied to the word line and a sensing bias voltage is applied to one of the N-type drain region and the N-type source region,
wherein a data write operation is performed by applying voltages to the word line, the N-type drain region and the N-type source region to change a polarity of the ferroelectric layer, and
wherein a negative read voltage is applied to the word line and the positive read voltage is applied to the N-type drain region and the N-type source region when high data are written in the ferroelectric layer.

2. The semiconductor memory device according to claim 1, wherein a maximum or minimum value of voltage of the N-type drain region and the N-type source region is set to be a voltage value of the read voltage where the P-type channel region is turned on or off.

3. The semiconductor memory device according to claim 1, wherein a power voltage is applied to the word line and a ground voltage is applied to the N-type drain region and the N-type source region when low data are written in the ferroelectric layer.

4. A semiconductor memory device with a ferroelectric device, the semiconductor memory device comprising:
a 1-T FET type memory cell; and
a plurality of even bit lines and odd bit lines arranged perpendicularly to a plurality of word lines, the even and odd bit lines being alternately arranged
wherein the memory cell is connected between a pair of adjacent even/odd bit lines of the plurality of even bit lines and the plurality of odd bit lines, and configured to sense a data current of the memory cell by sensing a polarity of the ferroelectric layer which change depending on voltages of a corresponding word line and the paired even/odd bit lines, and store 2n-bit data (n is a natural number) by changing the polarity of the ferroelectric layer depending on a plurality of write voltages applied to the corresponding word line and the paired even/odd bit lines,
wherein the memory cell comprises;
a P-type channel region, an N-type drain region connected to one bit line of the pair of adjacent even/odd bit lines, and an N-type source region connected to the other bit line of the pair of adjacent even/odd bit lines formed in a substrate;
the ferroelectric layer formed over the P-type channel region; and
the corresponding word line formed over the ferroelectric layer,
wherein a data read operation is performed by sensing a cell sensing current value differentiated depending on the polarity state of the ferroelectric layer while a different channel resistance is induced to the P-type channel region depending on a polarity state of the ferroelectric layer, a positive read voltage is applied to the corresponding word line and a sensing bias voltage is applied to one of the N-type drain region and the N-type source region, and
wherein a negative read voltage is applied to the word line and the positive read voltage is applied to the N-type drain region and the N-type source region when high data are written in the ferroelectric layer.

5. The semiconductor memory device according to claim 4, further comprising:
a write voltage driving unit configured to supply the plurality of write voltages to the paired even/odd bit lines; and a data sensing unit configured to sense the data current depending on voltages applied to the word line and the paired even/odd bit lines.

6. The semiconductor memory device according to claim 5, wherein the write voltage driving unit comprises:
  an analog processor configured to output an analog signal; and
  a D/A converter configured to convert an output signal of the analog processor into a digital signal so as to output the plurality of write voltages.

7. The semiconductor memory device according to claim 5, wherein the data sensing unit comprises:
  a sense amplifier array configured to compare and simplify a plurality of reference level currents with the data current;
  a digital processor configured to output an output signal of the sense amplifier array; and
  a plurality of reference units each configured to generate the plurality of reference level currents.

8. The semiconductor memory device according to claim 4, wherein the memory cell further comprises:
  a left n-bit storage unit configured to store left n-bit data applied through the even bit lines; and
  a right n-bit storage unit configured to store right n-bit data applied through the odd bit lines.

* * * * *